US008591650B2

(12) United States Patent
Toriumi

(10) Patent No.: US 8,591,650 B2
(45) Date of Patent: Nov. 26, 2013

(54) METHOD FOR FORMING CRYSTALLINE SEMICONDUCTOR FILM, METHOD FOR MANUFACTURING THIN FILM TRANSISTOR, AND METHOD FOR MANUFACTURING DISPLAY DEVICE

(75) Inventor: Satoshi Toriumi, Ebina (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 958 days.

(21) Appl. No.: 12/277,384

(22) Filed: Nov. 25, 2008

(65) Prior Publication Data

US 2009/0139447 A1 Jun. 4, 2009

(30) Foreign Application Priority Data

Dec. 3, 2007 (JP) ................. 2007-312872

(51) Int. Cl.
C30B 23/00 (2006.01)
C30B 25/00 (2006.01)
H01L 21/00 (2006.01)

(52) U.S. Cl.
USPC ............................ 117/84; 117/108; 438/158

(58) Field of Classification Search
None
See application file for complete search history.

(56) References Cited

U.S. PATENT DOCUMENTS

| 2,968,866 | A | 1/1961 | Soper et al. |
|---|---|---|---|
| 4,251,287 | A | 2/1981 | Dalal |
| 4,345,248 | A * | 8/1982 | Togashi et al. ........... 345/90 |
| 4,409,134 | A | 10/1983 | Yamazaki |
| 4,727,044 | A | 2/1988 | Yamazaki |
| 4,859,553 | A | 8/1989 | Jansen et al. |
| RE34,658 | E | 7/1994 | Yamazaki et al. |
| 5,453,858 | A | 9/1995 | Yamazaki |
| 5,514,879 | A | 5/1996 | Yamazaki |
| 5,614,732 | A | 3/1997 | Yamazaki |
| 5,701,167 | A | 12/1997 | Yamazaki |

(Continued)

FOREIGN PATENT DOCUMENTS

| JP | 62-062073 | 12/1987 |
|---|---|---|
| JP | 02-053941 | 11/1990 |

(Continued)

OTHER PUBLICATIONS

Arai et al., "41.2: Micro Silicon Technology for Active Matrix OLED Display," SID Digest '07: SID International Symposium Digest of Technical Papers, 2007, vol. XXXVIII pp. 1370-1373.

(Continued)

*Primary Examiner* — Bijay Saha
(74) *Attorney, Agent, or Firm* — Eric J. Robinson; Robinson Intellectual Property Law Office, P.C.

(57) ABSTRACT

It is an object to provide a method for forming a crystalline semiconductor film in which a transition layer is not formed or which includes a thinner transition layer than that in a crystalline semiconductor film which is formed by conventional method, and a method for manufacturing a thin film transistor to which the above method is applied. A semiconductor film including hydrogen is formed over a substrate or over an insulating film formed over a substrate. The semiconductor film including hydrogen undergoes surface wave plasma treatment, which is performed in a gas including hydrogen and/or a rare gas, to generate a crystal nucleus in the semiconductor film including hydrogen. The crystal nucleus is grown to form a crystalline semiconductor film by employing a plasma CVD method.

18 Claims, 36 Drawing Sheets

(56) References Cited

U.S. PATENT DOCUMENTS

| | | |
|---|---|---|
| 5,766,989 A | 6/1998 | Maegawa et al. |
| 5,843,225 A | 12/1998 | Takayama et al. |
| 5,849,601 A | 12/1998 | Yamazaki |
| 5,859,445 A | 1/1999 | Yamazaki |
| 5,932,302 A | 8/1999 | Yamazaki et al. |
| 6,011,277 A | 1/2000 | Yamazaki |
| 6,023,075 A | 2/2000 | Yamazaki |
| 6,171,674 B1 | 1/2001 | Yamazaki et al. |
| 6,183,816 B1 | 2/2001 | Yamazaki et al. |
| 6,218,702 B1 | 4/2001 | Yamazaki et al. |
| 6,252,249 B1 | 6/2001 | Yamazaki |
| 6,281,520 B1 | 8/2001 | Yamazaki |
| 6,306,213 B1 | 10/2001 | Yamazaki |
| 6,410,372 B2 | 6/2002 | Flewitt |
| 6,468,617 B1 | 10/2002 | Yamazaki et al. |
| 6,483,124 B2 | 11/2002 | Flewitt |
| 6,589,822 B1 | 7/2003 | Yamazaki et al. |
| 6,610,142 B1 | 8/2003 | Takayama et al. |
| 6,737,676 B2 | 5/2004 | Yamazaki |
| 6,835,523 B1 | 12/2004 | Yamazaki et al. |
| 6,855,621 B2 | 2/2005 | Kondo et al. |
| 7,067,844 B2 | 6/2006 | Yamazaki |
| 7,098,479 B1 | 8/2006 | Yamazaki |
| 7,115,902 B1 | 10/2006 | Yamazaki |
| 2003/0162373 A1* | 8/2003 | Goto et al. .................. 438/485 |
| 2003/0234369 A1* | 12/2003 | Glukhoy .................. 250/423 R |
| 2005/0022864 A1 | 2/2005 | Fujioka et al. |
| 2005/0089648 A1 | 4/2005 | Yamazaki et al. |
| 2005/0090078 A1 | 4/2005 | Ishihara |
| 2005/0205880 A1 | 9/2005 | Anzai et al. |
| 2006/0119554 A1 | 6/2006 | Kawae |
| 2006/0238132 A1 | 10/2006 | Kitamura et al. |
| 2006/0240602 A1 | 10/2006 | Cabarrocas et al. |
| 2007/0004220 A1 | 1/2007 | Tran Quoc et al. |
| 2007/0013842 A1 | 1/2007 | Yang et al. |
| 2007/0018165 A1 | 1/2007 | Yamazaki |
| 2007/0138475 A1* | 6/2007 | Kitakado et al. ............... 257/66 |
| 2007/0221623 A1 | 9/2007 | Horiguchi et al. |
| 2008/0012076 A1* | 1/2008 | Yamazaki et al. ............ 257/347 |
| 2008/0308807 A1 | 12/2008 | Yamazaki et al. |
| 2009/0023236 A1 | 1/2009 | Miyairi et al. |
| 2009/0072237 A1 | 3/2009 | Yamazaki et al. |
| 2009/0142909 A1 | 6/2009 | Jinbo et al. |

FOREIGN PATENT DOCUMENTS

| | | |
|---|---|---|
| JP | 04-242724 | 8/1992 |
| JP | 07-162003 A | 6/1995 |
| JP | 09-092841 A | 4/1997 |
| JP | 10-120491 A | 5/1998 |
| JP | 11-121761 | 4/1999 |
| JP | 2000-277439 | 10/2000 |
| JP | 2002-206168 A | 7/2002 |
| JP | 2002-299235 | 10/2002 |
| JP | 2004-014958 | 1/2004 |
| JP | 1 505 174 | 2/2005 |
| JP | 2005-049832 | 2/2005 |
| JP | 2005-049832 A | 2/2005 |
| JP | 2005-050905 | 2/2005 |
| JP | 2005-123389 A | 5/2005 |
| JP | 2005-129666 A | 5/2005 |
| JP | 2005-167051 | 6/2005 |
| JP | 2005-167051 A | 6/2005 |
| JP | 2007-005705 | 1/2007 |
| JP | 2007-048982 | 2/2007 |
| JP | 2007-258595 A | 10/2007 |

OTHER PUBLICATIONS

Sazonov et al., "Low-Temperature Materials and Thin Film Transistors for Flexible Electronics," Proceedings of the IEEE, Aug. 2005, vol. 93, No. 8, pp. 1420-1428.

Lee, et al., "Top-Gate TFTs Using 13.56MHz PECVD Microcrystalline Silicon," IEEE Electron Device Letters, vol. 26, No. 9, Sep. 5, 2005, pp. 637-639.

Lee, et al., "Postdeposition Thermal Annealing and Material Stability of 75° C. Hydrogenated Nanocrystalline Silicon Plasma-Enhanced Chemical Vapor Deposition Films," Journal of Applied Physics, Aug. 4, 2005, vol. 98, pp. 034305-1-034305-7.

Esmaeili-Rad, et al., "Stability of Nanocrystalline Silicon Bottom-Gate Thin Film Transistors with Silicon Nitride Gate Dielectric," Journal of Applied Physics, Sep. 28, 2007, vol. 102, pp. 064512-1-064512-7.

Esmaeili-Rad, et al., "Absence of Defect State Creation in Nanocrystalline Silicon Thin Film Transistors Deduced from Constant Current Stress Measurements," Applied Physics Letters, Sep. 12, 2007, vol. 91, pp. 113511-1-113511-3.

Lee, et al., "Leakage Current Mechanisms in Top-Gate Nanocrystalline Silicon Thin Film Transistors," Applied Physics Letters, Feb. 28, 2008, vol. 92, pp. 083509-1-083509-3.

Lee, et al., "Stability of nc-Si:H TFTs with Silicon Nitride Gate Dielectric," IEEE Transactions on Electron Devices, Jan. 2007, vol. 54, No. 1, pp. 45-51.

Srinivasan.E et al., "Hydrogen Elimination and Phase Transitions in Pulsed-Gas Plasma Deposition of Amorphous and Microcrystalline Silicone,", J. Appl. Phys.(Journal of Applied Physics), Mar. 15, 1997, vol. 81, No. 6, pp. 2847-2855.

* cited by examiner (A-1)

(A-2)

(A-3)

(A-4)

(B-1)

(B-2)

(B-3)

(B-4)

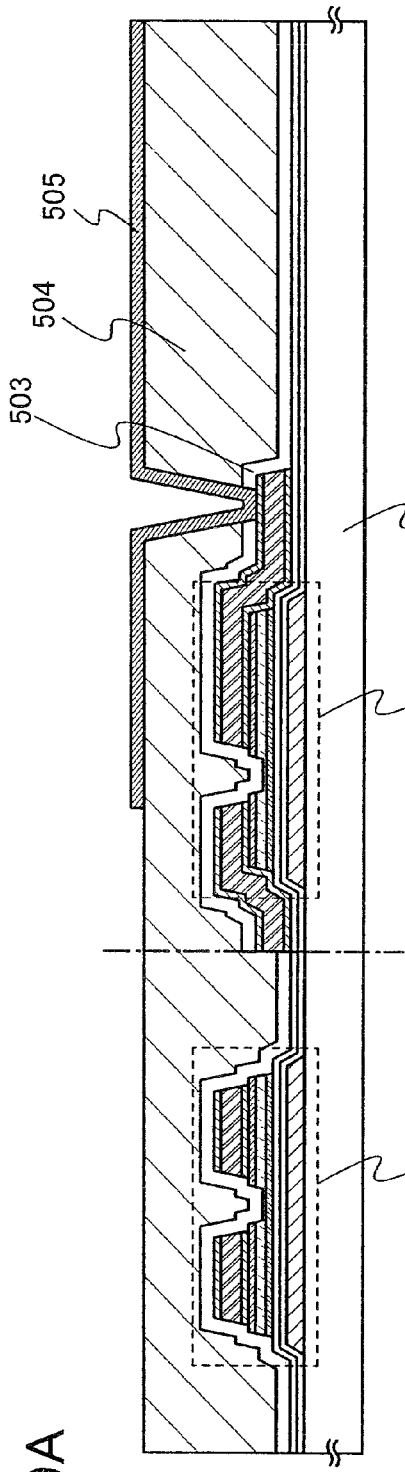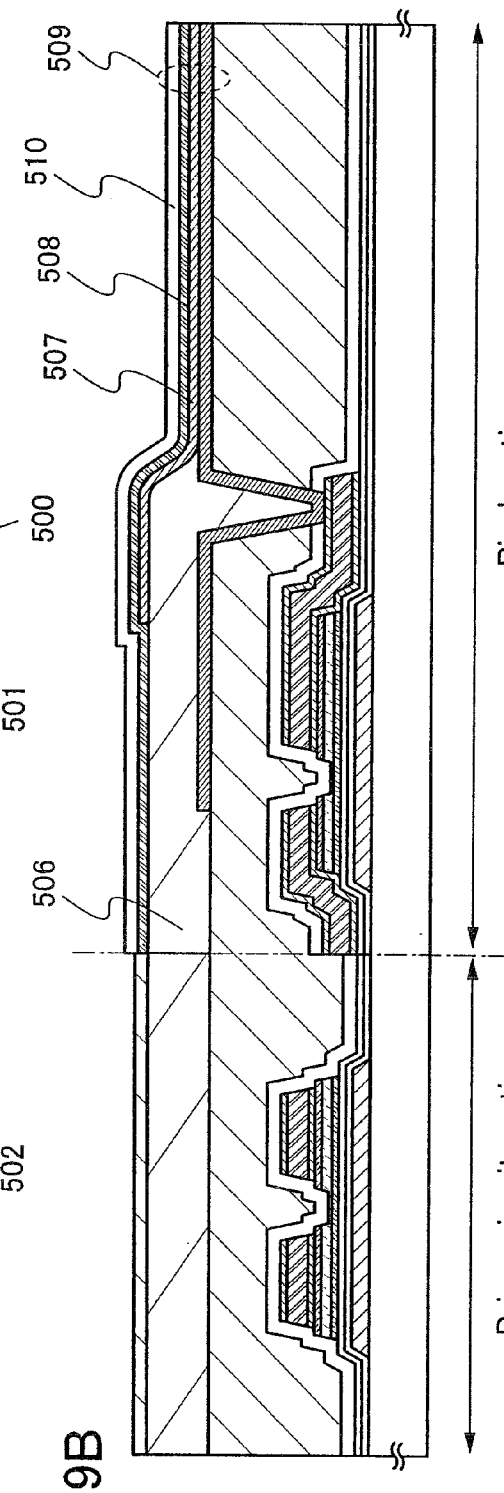
FIG. 29A
FIG. 29B

METHOD FOR FORMING CRYSTALLINE SEMICONDUCTOR FILM, METHOD FOR MANUFACTURING THIN FILM TRANSISTOR, AND METHOD FOR MANUFACTURING DISPLAY DEVICE

BACKGROUND OF THE INVENTION

1. Field of the Invention

The present invention relates to a method for manufacturing a thin film transistor, and further to a display device including the thin film transistor.

2. Description of the Related Art

In recent years, thin film transistors including a thin semiconductor film (with a thickness of several nanometers to several hundreds of nanometers, approximately) over a substrate having an insulating surface (e.g., a glass substrate) have been attracting attention. Thin film transistors are widely used for ICs (integrated circuits) and electronic devices such as electro-optic devices. In particular, development of thin film transistors that are to be used as switching elements in image display devices typified by liquid crystal display devices, EL display devices, and the like is being pushed. In a liquid crystal display device in which potential of pixel electrodes arranged in matrix is controlled with switching elements to form a display pattern in a screen (active matrix liquid crystal display device), specifically, a voltage is applied between a selected pixel electrode and a counter electrode which faces the selected pixel electrode, whereby an orientation of a liquid crystal layer disposed between the selected pixel electrode and the counter electrode is changed, and an optical modulation occurs, which is perceived by a viewer as a display pattern.

Variety of uses for such active matrix liquid crystal display devices has been increasing, and higher size of a screen, definition, and aperture ratio is being demanded. Further, higher reliability has also been required.

As a switching element in a display device, a thin film transistor in which an amorphous semiconductor film or a polycrystalline semiconductor film is used for a channel formation region is widely used; further, a thin film transistor in which a microcrystalline semiconductor film is used is also used. A microcrystalline semiconductor film has higher carrier mobility than an amorphous semiconductor film, and is excellent in electric characteristics. A microcrystalline semiconductor film can be formed by a simpler process than that by which a polycrystalline semiconductor film whose crystallization is carried out by a thermal crystallization method is formed, a laser crystallization method, or the like, and use of the microcrystalline semiconductor film has an advantage of flexibility of a manufacturing process.

It is known that when a microcrystalline semiconductor film is formed over a substrate or an insulating film by a plasma CVD method or the like, an IL (incubation layer; also referred to as a "transition layer") is formed in a region of the microcrystalline semiconductor film of several nm to 100 nm approximately from an interface with the substrate or the insulating film. Presence of the transition layer, which has low crystallinity, leads to a decrease in electric characteristics of the microcrystalline semiconductor film. In an inverted-staggered thin film transistor, in particular, current flows in or near the transition layer; therefore, a technique has been required which enables formation of a microcrystalline semiconductor film in which generation of the transition layer is suppressed.

As an example of such a technique as described above for forming a crystalline semiconductor film in which generation of the transition layer is suppressed a technique is disclosed in Reference 1 (Japanese Published Patent Application No. 2002-299235). Reference 1 discloses a method for forming a thin semiconductor film: a layer or a thin film including a semiconductor element as a main component is formed over or near a substrate surface; a crystal nucleus is generated while the layer or the thin film including the semiconductor element as the main component is etched; and the crystal nucleus grows to form a crystalline semiconductor film.

SUMMARY OF THE INVENTION

A conventional technique can suppress generation of a transition layer to some extent. However, in order to obtain a thin film transistor with excellent electric characteristics, it is necessary to make a transition layer as thin as possible or to form a thin semiconductor film that does not have a transition layer. Further, since it generally takes more time to form a crystalline semiconductor film than to form an amorphous semiconductor film, a high throughput is required; therefore, it is necessary to improve a deposition rate.

Further, it is not sufficient only to suppress generation of a transition layer in a crystalline semiconductor film. When there is a dangling bond in a crystalline semiconductor film, a defect level due to the dangling bond is formed and degrades the electric characteristics of the crystalline semiconductor film. Therefore, it is necessary to terminate dangling bonds in a crystalline semiconductor film.

In view of the above problems, an object of the present invention is to provide a method for forming a crystalline semiconductor film in which generation of a transition layer and dangling bonds can be suppressed and which can be produced in a high throughput.

Further, another object of the present invention is to provide a method for forming a crystalline semiconductor film free of plasma damage in forming the film, whereby electric charges are hardly accumulated in the crystalline semiconductor film.

Furthermore, another object of the present invention is to provide a method for forming a crystalline semiconductor film with high uniformity of electric characteristics which is suitable for being formed over a large-area substrate.

Still furthermore, another object of the present invention is to provide a method for forming a crystalline semiconductor film with low concentration of impurity elements and the like which degrade the electric characteristics of the crystalline semiconductor film.

In the present invention, a semiconductor film is formed over a surface of a substrate, an insulating film, or the like; the semiconductor film undergoes plasma treatment with surface wave plasma to generate a crystal nucleus; the crystal nucleus grows to form a semiconductor film. Here, the semiconductor film is formed over the surface of the substrate, the insulating film, or the like to include hydrogen, thereby terminating dangling bonds in a crystalline semiconductor film. In order that the semiconductor film may include hydrogen, it is preferable to add hydrogen to a gas for forming the semiconductor film in advance; further, it is preferable to add hydrogen to a gas which is used for the plasma treatment.

An aspect of the present invention is a method for forming a crystalline semiconductor film, which includes the steps of forming a semiconductor film including hydrogen; performing surface wave plasma treatment on the semiconductor film including hydrogen in a gas including hydrogen and a rare gas, thereby generating a crystal nucleus of a semiconductor; and growing the crystal nucleus.

In the present invention with the above structure, the plasma treatment can be performed using a hydrogen gas including silane or a rare gas including silane. When a hydrogen gas including silane is used for the plasma treatment, hydrogen is further included in the crystalline semiconductor film to be formed.

In the present invention with the above structure, it is preferable to perform the surface wave plasma treatment in an ultrahigh vacuum. Performing the surface wave plasma treatment in an ultrahigh vacuum can prevent an impurity element from entering the crystalline semiconductor film.

In the present invention with the above structure, it is preferable to employ a plasma CVD method to grow the crystal nucleus formed by the surface wave plasma treatment. By employing a plasma CVD method to grow the crystal nucleus, plasma infiltrates into the inside of the semiconductor film, whereby crystal growth can proceed in a thickness direction of the semiconductor film.

Another aspect of the present invention is a method for manufacturing a thin film transistor, which includes the steps of forming a gate electrode, forming an insulating film to cover the gate electrode, forming a semiconductor film including hydrogen over the insulating film, performing surface wave plasma treatment on the semiconductor film including hydrogen in a gas including hydrogen and a rare gas to generate a crystal nucleus of a semiconductor, growing the crystal nucleus to form a semiconductor film, and forming an impurity semiconductor film, a source electrode and a drain electrode over the semiconductor film.

A crystalline semiconductor layer in the thin film transistor of the present invention with the above structure does not have a transition layer, or if it includes a transition layer, the transition layer is highly thin; therefore, the crystalline semiconductor layer at or near the interface with a gate insulating layer has high crystallinity. Consequently, the thin film transistor formed by using the crystalline semiconductor layer has a high mobility; thus, a part of a driver circuit or the entire driver circuit can be formed over the same substrate as that of a pixel portion, so that a system-on-panel can be manufactured.

Examples of a display device include a light-emitting device and a liquid crystal display device. A light-emitting device is provided with a light-emitting element, and a liquid crystal display device is provided with a liquid crystal element. A light-emitting element includes an element whose luminance is controlled with current or voltage, specifically, an organic electroluminescence (EL) element, an inorganic EL element, or the like.

In addition, a display device includes a panel in which a display element is sealed, and a module in which an IC and the like including a controller are mounted on the panel. The present invention further relates to one mode of a substrate including a semiconductor element before the display element is completed in a manufacturing process of the display device, and the substrate including an semiconductor element has elements for supplying current to a pixel element in each of a plurality of pixels.

A display device includes an image display device, a light-emitting device, and a light source (including a lighting device) in its category. Further, the display device includes any of the following modules in its category: a module including a connector such as a flexible printed circuit (FPC), tape automated bonding (TAB) tape, or a tape carrier package (TCP); a module having TAB tape or a TCP which is provided with a printed wiring board at the end thereof; and a module including an integrated circuit (IC) which is directly mounted on a display element by a chip on glass (COG) method.

Here, a "film" means what is formed over an entire surface and is not patterned. A "layer" means what is patterned into a desired form with a resist mask or the like. However, with regard to each layer in stacked films, a film and a layer are not distinguished from each other in some cases.

According to the present invention, generation of a transition layer in a crystalline semiconductor film can be suppressed or a transition layer can be formed thinner than that formed by using a conventional method. Furthermore, a crystalline semiconductor film in which generation of dangling bonds is suppressed can be formed in a high throughput. Furthermore, electric characteristics of a crystalline semiconductor film to be formed can be improved.

Further, according to the present invention, a crystalline semiconductor film can be formed without being damaged by plasma. Furthermore, another thin film which has already been formed (e.g., a gate insulating layer) as well as the crystalline semiconductor film can be prevented from being damaged by plasma, and also a substrate can be prevented from being damaged by plasma. Still furthermore, accumulation of electric charges in forming the crystalline semiconductor film can be reduced. Thus, electrostatic breakdown of the gate insulating layer and generation of defects due to electrostatic breakdown of the gate insulating layer can be prevented. Consequently, the yield of thin film transistors can be improved and thin film transistors can be manufactured with high reliability.

Further, a crystalline semiconductor film with high uniformity of electric characteristics can be formed even over a large-area substrate.

Furthermore, entering of impurity elements and the like into a crystalline semiconductor film, which degrades the electric characteristic, can be suppressed.

BRIEF DESCRIPTION OF DRAWINGS

In the accompanying drawings:

FIGS. 1A-1 to 1B-4 show examples of a method for forming a crystalline semiconductor film of an embodiment mode of the present invention;

FIG. 2 shows an example of a structure of a high-density plasma treatment apparatus applicable to the present invention;

FIG. 3 shows an example of a structure of a plasma CVD apparatus applicable to the present invention;

FIG. 4 shows an example of a structure of a thin film transistor to which the present invention is applied;

FIGS. 14A-1 to 14B-2 show multi-tone photomasks that are used in the present invention;

FIGS. 29A and 29B show light-emitting devices to which the present invention can be applied;

DETAILED DESCRIPTION OF THE INVENTION

Figure 1A:
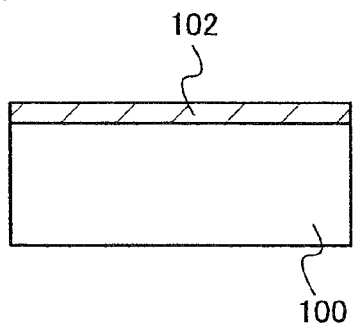
Figure 1A:
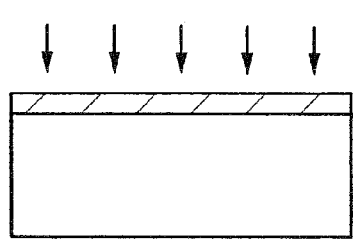
Figure 1A:
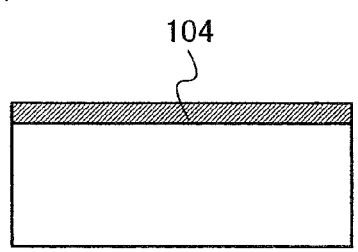
Figure 1A:
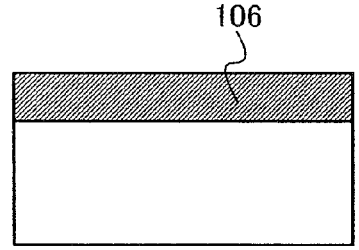
Figure 1B:
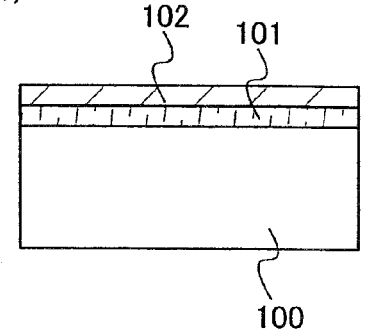
Figure 1B:
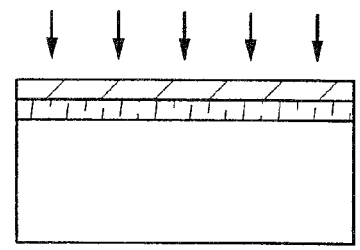
Figure 1B:
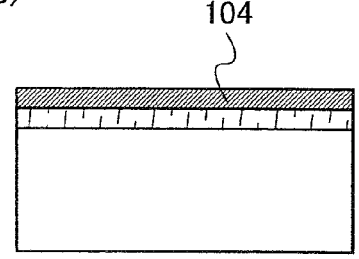
Figure 1B:
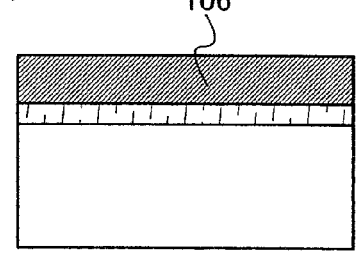

Hereinafter, embodiment modes of the present invention are described with reference to the drawings. Note that the present invention is not limited to the description to be given below because it is easily understood by those skilled in the art that the modes and details disclosed herein can be modified in various ways without departing from the spirit and scope of the present invention. Therefore, the present invention should not be interpreted as being limited to the description of the embodiment modes to be given below. In describing structures of the present invention with reference to the drawings, the same reference numerals are used in common for the same portions in different drawings. Further, in some cases, the same hatching patterns are applied to similar parts, and the similar parts are not especially designated by reference numerals.

(Embodiment Mode 1)

This embodiment mode describes a method for forming a crystalline semiconductor film of the present invention with reference to the drawings.

FIGS. 1A-1 to 1B-4 show methods for forming a crystalline semiconductor film of the present invention. First, a semiconductor film 102 including hydrogen is formed over a substrate 100 or over an insulating film 101 (see FIGS. 1A-1 and 1B-1).

The insulating film 101 can be formed using silicon oxide, silicon nitride, silicon oxynitride, or silicon nitride oxide. When the insulating film 101 serves as a gate insulating film of a thin film transistor, it is preferable to form the insulating film 101 with a thickness of from 10 nm to 110 nm inclusive, using a source gas for the above films, by a CVD method (including a plasma CVD method), a sputtering method, or the like.

Note that silicon oxynitride means a substance that includes more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, silicon nitride oxide means a substance that includes more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in silicon oxynitride or silicon nitride oxide is defined as 100 at. %.

The semiconductor film 102 including hydrogen can be formed using silicon hydride such as monosilane or disilane by a CVD method (including a plasma CVD method, a thermal CVD method, and the like). It is preferable to employ a CVD method because it is difficult to make the semiconductor film 102 include hydrogen by using a sputtering method. Preferably, a plasma CVD method is used. Using a plasma CVD method, a film can be formed at a low temperature. Thus, the semiconductor film 102 can include a large amount of hydrogen. An amorphous semiconductor film including hydrogen can be formed by adding hydrogen gas with a flow rate of 1 to 20 times, preferably 1 to 10 times, more preferably 1 to 5 times as high as that of silicon hydride gas. Further, it is preferable to dilute silicon hydride gas with one or plural kinds of rare gas elements selected from helium, argon, krypton, and neon, thereby making it possible to stabilize plasma generated in a plasma CVD method. In the case where a thermal CVD method is used, the semiconductor film 102 can include sufficient hydrogen. The semiconductor film 102 including hydrogen is formed with a thickness of from 1 nm to 20 nm inclusive, preferably from 1 nm to 15 nm inclusive, more preferably from 3 nm to 5 nm inclusive.

Next, the semiconductor film 102 including hydrogen undergoes plasma treatment (see FIGS. 1A-2 and 1B-2). The plasma treatment in the present invention is performed with surface wave plasma. The surface wave plasma can prevent the insulating film 101 and the semiconductor film 102 including hydrogen from being damaged. Further, for plasma to be generated, it is preferable to use high-density plasma which is obtained by microwave excitation because high-density plasma facilitates generation of a crystal nucleus.

Figure 2:
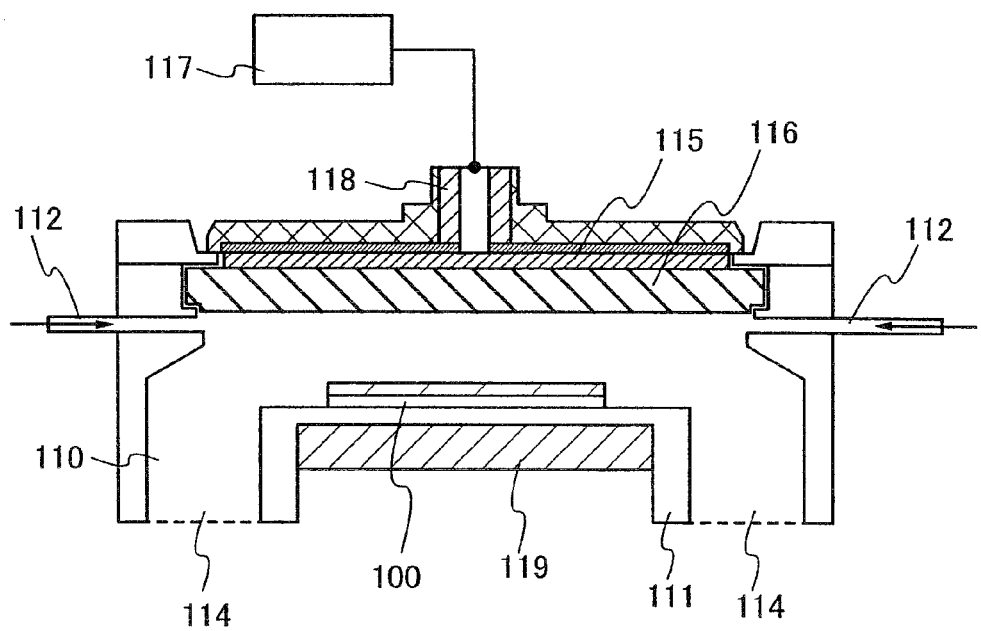

FIG. 2 shows an example of a structure of a high-density plasma treatment apparatus utilizing microwave excitation which is used in the plasma treatment in the present invention.

The high-density plasma treatment apparatus shown in FIG. 2 includes a process chamber 110 for generating plasma. The process chamber 110 includes a stage 111 for disposing an object (the substrate 100 provided with the semiconductor film 102 including hydrogen, in the present invention) and an exhaust port 114 connected to a vacuum pump for exhausting a gas from the process chamber 110. The upper portion of the process chamber 110 is provided with an antenna 115, a dielectric plate 116, and a coaxial waveguide 118 connected to a microwave generator 117. In addition, provision of a temperature controller 119 for the stage 111 makes it possible to control the temperature of the object. Further, a shower plate or a shower pipe may be provided between the dielectric plate 116 and the object.

In order to perform high-density plasma treatment, a given gas is supplied from a gas supply portion 112 to introduce the gas into the process chamber 110. The microwave generator 117 generates microwaves with a frequency of 2.45 GHz, and the generated microwaves are supplied to the coaxial waveguide 118. The microwaves are supplied from the coaxial waveguide 118 and the antenna 115 into the process chamber 110 through the dielectric plate 116. The microwaves excite the gas supplied to the process chamber 110 to generate high-density plasma. Further, the temperature controller 119 makes it possible to perform plasma treatment while the object is being heated.

The high-density plasma treatment apparatus shown in FIG. 2 enables a surface of an object to undergo oxidation treatment, for example. Here, with the use of the high-density plasma treatment apparatus shown in FIG. 2, the semiconductor film 102 including hydrogen undergoes plasma treatment to generate a crystal nucleus in a semiconductor film.

The plasma treatment in the present invention is performed in a mixed gas of hydrogen and a rare gas. It is preferable that the flow ratio of a rare gas to hydrogen that are introduced into the process chamber 110 be about 50:1 to 100:1; for example, the flow rate of argon is 500 sccm and that of hydrogen is 10 sccm. The plasma treatment to the semiconductor film 102 including hydrogen in the present invention is performed mainly with hydrogen radicals.

In the plasma treatment in the present invention, the flow ratio of a rare gas to hydrogen can be set as appropriate in the above range. When the flow ratio of hydrogen to silane is about 50:1, the deposition rate is high while the uniformity of plasma to be generated is low. When the flow ratio of hydrogen to silane is about 100:1, the uniformity of plasma to be generated is high while the deposition rate is low.

The electric power in generating microwaves is preferably set to be 3800 W, for example. Further, the pressure in the process chamber 110 in performing plasma treatment is preferably set to be 150 Pa, for example.

In "high-density plasma," plasma generated between the stage 111 and the dielectric plate 116 has a charge density of greater than or equal to $1\times10^{10}$ cm$^{-3}$, preferably from $1\times10^{10}$ cm$^{-3}$ to $1\times10^{15}$ cm$^{-3}$ inclusive, more preferably from $1\times10^{10}$ cm$^{-3}$ to $1\times10^{13}$ cm$^{-3}$ inclusive. The charge density can be measured with a Langmuir probe that is disposed at about 70 mm to 90 mm from a surface of the dielectric plate 116 which faces an object.

By performing high-density plasma treatment to the semiconductor film 102 including hydrogen with surface wave plasma as described above, a crystal nucleus in a semiconductor is generated to form a semiconductor film 104 including the crystal nucleus (see FIGS. 1A-3 and 1B-3).

The semiconductor film 104 including the crystal nucleus does not need to be an entire film; a part of the substrate 100 or a part of the insulating film 101 may be exposed in a region of the semiconductor film 104 including the crystal nucleus. Further, the semiconductor film 104 including the crystal nucleus by undergoing the plasma treatment may partly include an amorphous semiconductor, instead of crystallizing the semiconductor film entirely.

Next, the crystal nucleus included in the semiconductor film 104 is grown to form a semiconductor film 106 (see FIGS. 1A-4 and 1B-4). A plasma CVD method is preferably used to grow the crystal nucleus included in the semiconductor film 104 to form the semiconductor film 106 because the crystal nucleus can grow in a thickness direction of the semiconductor film by using a plasma CVD method.

Figure 3:
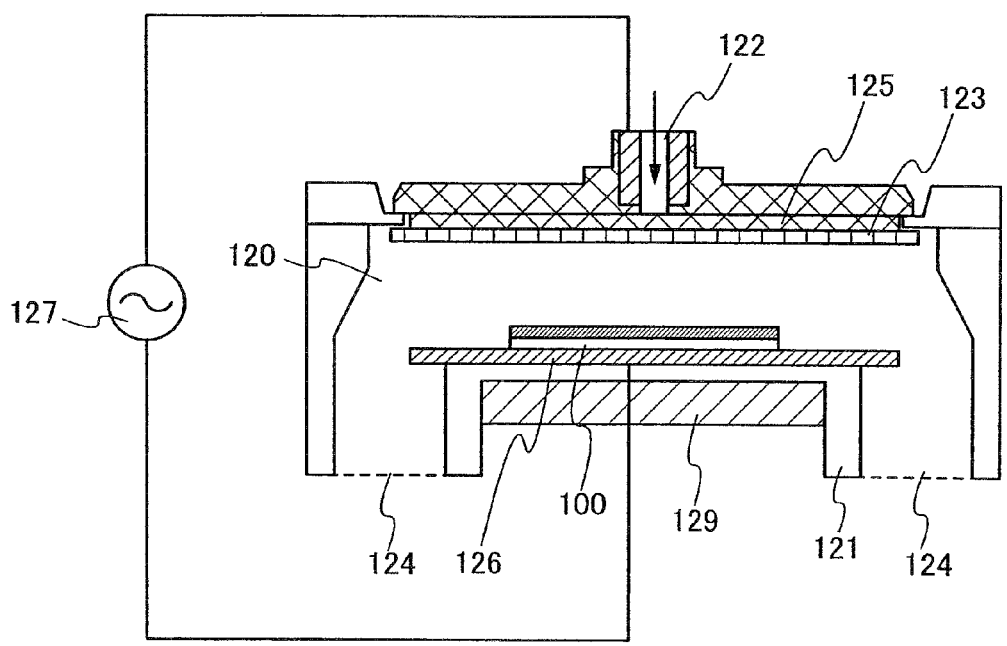

FIG. 3 shows an example of a structure of a parallel plate (capacitive coupling) plasma CVD apparatus as an example of a plasma CVD apparatus. The plasma CVD apparatus shown in FIG. 3 includes a process chamber 120, a stage 121, a gas supply portion 122, a shower plate 123, an exhaust port 124, an upper electrode 125, a lower electrode 126, an alternate-current power source 127, and a temperature controller 129. The distance between the upper electrode 125 and the lower electrode 126 is about 20 mm to 80 mm.

When treatment is performed with the plasma CVD apparatus shown in FIG. 3, a given gas is supplied from the gas supply portion 122. The gas is introduced into the process chamber 120 through the shower plate 123. High-frequency power is applied with the alternate-current power source 127 connected to the upper electrode 125 and the lower electrode 126 to excite the gas in the process chamber 120, thereby generating plasma. Further, the gas in the process chamber 120 is exhausted through the exhaust port 124 that is connected to a vacuum pump. Further, the temperature controller 129 makes it possible to perform plasma treatment while an object is being heated.

A crystalline semiconductor film is grown in a mixed gas of silane and hydrogen with the plasma CVD apparatus shown in FIG. 3. At this time, it is preferable that the flow ratio of hydrogen to silane that are introduced into the process chamber 120 be about 50:1; for example, the flow rate of hydrogen is 400 sccm and that of silane is 8 sccm. It is more preferable that the flow ratio of hydrogen to silane be about 100:1. By setting the flow ratio of hydrogen to silane about 100:1, a crystalline semiconductor film is formed with higher crystallinity than in a case of setting the flow ratio of hydrogen to silane about 50:1.

The condition of the plasma treatment is preferably set as follows, for example: the frequency and the power in generating high-frequency plasma are 60 MHz and 20 W, respectively; the pressure in the process chamber 120 in the plasma treatment is 100 Pa; and the temperature of the substrate 100 is 280° C.

It is preferable to set an oxygen concentration in the crystalline semiconductor film less than or equal to $1\times10^{20}$ cm$^{-3}$, more preferably less than or equal to $5\times10^{18}$ cm$^{-3}$, still more preferably less than or equal to $1\times10^{16}$ cm$^{-3}$; each of a nitrogen concentration and a carbon concentration in the crystalline semiconductor film less than or equal to $5\times10^{18}$ cm$^{-3}$, more preferably less than or equal to $1\times10^{18}$ cm$^{-3}$ because these impurity elements have an influence on electric characteristics of a semiconductor element. In the case where concentrations of these impurity elements vary among semiconductor elements, there arises variation in threshold voltage $V_{th}$ of a semiconductor element. Therefore, by reducing impurity concentrations as much as possible, variation in threshold voltage $V_{th}$ of a semiconductor element formed on a substrate can be reduced.

Note that it is preferable to perform the process from the step of forming the insulating film 101 to the step of growing the semiconductor film 106 successively in a vacuum apparatus.

In the above manner, the crystalline semiconductor film of the present invention can be formed. The crystalline semiconductor film formed by applying the present invention does not include a transition layer; or even if it includes a transition layer, the transition layer is thinner than that included in a crystalline semiconductor film formed by using a conventional method.

Further, the present invention can improve the throughput of forming a crystalline semiconductor film.

Furthermore, the present invention can terminate and reduce dangling bonds formed in the crystalline semiconductor film, thereby improving electric characteristics of a semiconductor element.

Still furthermore, since surface wave plasma is used in the present invention, the crystalline semiconductor film can be formed without being damaged. In addition, plasma damage to another thin film that has already been formed (e.g., the gate insulating layer in the thin film transistor) and to the substrate can also be prevented. Moreover, accumulation of electric charges in the crystalline semiconductor film can be reduced.

Further, the present invention makes it possible to form a crystalline semiconductor film with high uniformity of electric characteristic even over a large-area substrate.

Furthermore, the present invention can suppress entrance of impurity elements and the like that degrade electric characteristics of the crystalline semiconductor film.

(Embodiment Mode 2)

This embodiment mode describes a method for manufacturing a thin film transistor to which the method for forming a crystalline semiconductor film in Embodiment Mode 1 is applied, with reference to the drawings.

Figure 4:
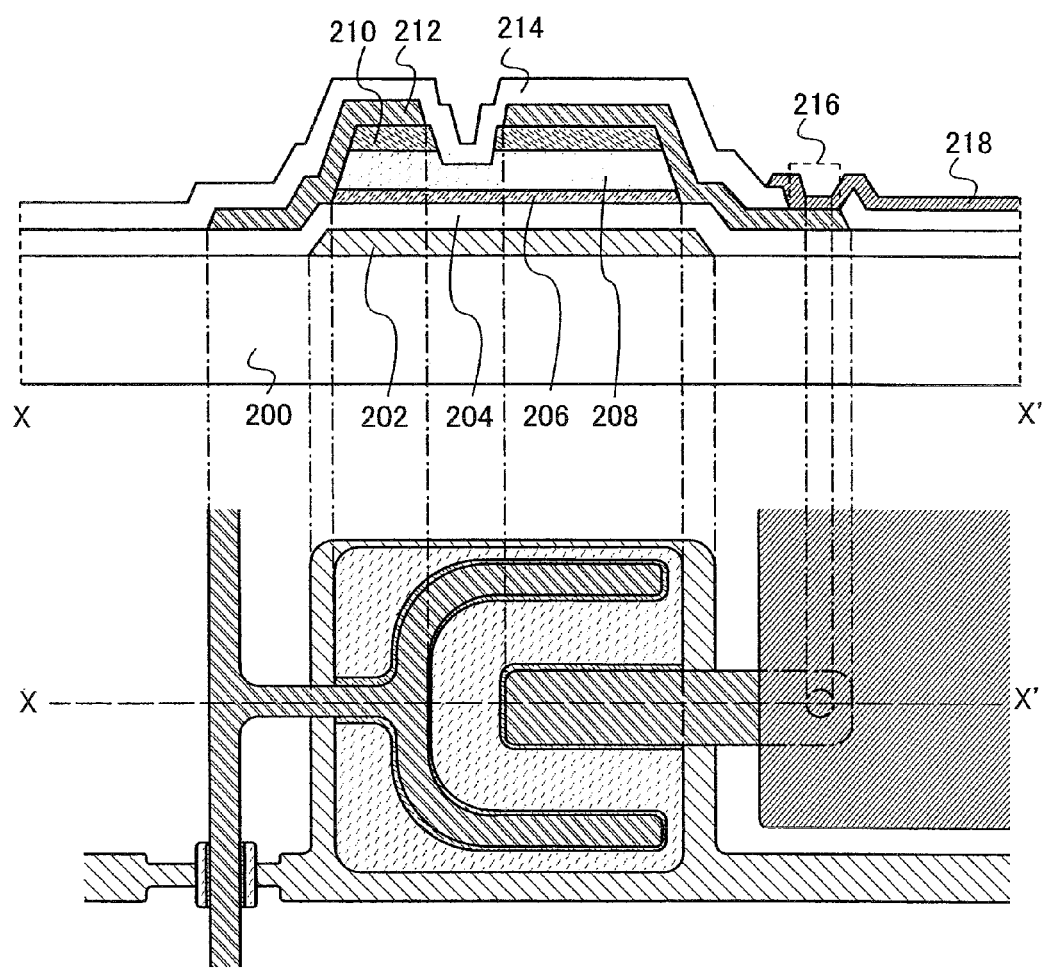

FIG. 4 shows an example of a top view and a cross-sectional view of a thin film transistor of the present invention. The thin film transistor shown in FIG. 4 includes a gate electrode layer 202 over a substrate 200, a gate insulating layer 204 over the gate electrode layer 202, a crystalline semiconductor layer 206 over the gate insulating layer 204, an amorphous semiconductor layer 208 over the crystalline semiconductor layer 206, source and drain regions 210 over parts of the amorphous semiconductor layer 208, source and drain electrode layers 212 over the source and drain regions 210, and an insulating layer 214 over the source and drain electrode layers 212. Each layer has been patterned into a desired shape. The amorphous semiconductor layer 208 serves as a buffer layer, which improves resistance to voltage and prevents an impurity element from diffusing into the crystalline semiconductor film. The insulating layer 214 serves as a protective layer.

In the cross-sectional view of the thin film transistor shown in FIG. 4, as is not shown in the cross-sectional view, the sides of the source and drain regions 210 which are in contact with the insulating layer 214 may have a step structure. That is, the whole side of the source and drain regions 210 does not need to be in the same plane as the sides of the amorphous semiconductor layer 208 which are in contact with the insulating layer 214.

The thin film transistor shown in FIG. 4 is a pixel transistor which is provided in matrix for a liquid crystal display device (a liquid crystal display panel). One of the source electrode and the drain electrode of the thin film transistor is connected to a source wiring, and the other of the source electrode and the drain electrode is connected to a pixel electrode 218 through an opening portion 216 formed in the insulating layer 214.

One of the source and drain electrodes formed with a U-shape (or horseshoe shape) surrounds the other of the source and drain electrodes. With such a structure, the channel width of the thin film transistor can be increased, whereby sufficient On-current can flow; further, variation in electric characteristics of the thin film transistor can be reduced; furthermore, reliability of the thin film transistor is improved. However, the present invention is not limited to the above, and the thin film transistor does not necessarily have a U-shape (or horseshoe shape).

Next, a method for manufacturing the thin film transistor shown in FIG. 4 is described with reference to the drawings. An n-channel thin film transistor including a crystalline semiconductor has higher carrier mobility than a p-channel thin film transistor including a crystalline semiconductor. It is preferable that all the thin film transistors formed over the same substrate have the same conductivity type to reduce the number of manufacturing steps. Therefore, a method for manufacturing an n-channel thin film transistor is described here.

First, the gate electrode layer 202 is formed over the substrate 200. As the substrate 200, any of the following substrates can be used: an alkali-free glass substrate formed using barium borosilicate glass, aluminoborosilicate glass, aluminosilicate glass, or the like by a fusion method or a float method; a ceramic substrate; a plastic substrate having heat resistance enough to withstand a process temperature of this manufacturing process; and the like. Alternatively, a metal substrate of a stainless alloy or the like having a surface provided with an insulating layer may be used. That is, a substrate having an insulating surface is used as the substrate 200. When the substrate 200 is mother glass, the substrate may have any size of the first generation (e.g., 320 mm×400 mm) to the tenth generation (e.g., 2950 mm×3400 mm), and the like.

The use of surface wave plasma for forming the crystalline semiconductor film makes it possible to perform uniform plasma treatment even if a large-area substrate of the eighth or more generation, for example, is used.

The gate electrode layer 202 can be formed using a metal material such as molybdenum, titanium, chromium, tantalum, tungsten, aluminum, copper, neodymium, or scandium, or an alloy material which includes any of these materials as a main component. In a case of using aluminum, an Al—Ta alloy, in which aluminum is alloyed with tantalum, is preferably used, which suppresses hillocks. Further, an Al—Nd alloy, in which aluminum is alloyed with neodymium, can not only suppress hillocks but also form a wiring with low resistivity. Furthermore, a semiconductor layer typified by polycrystalline silicon doped with an impurity element such as phosphorus, or a Ag—Pd—Cu alloy film may be used. The gate electrode layer 202 may be formed with a single layer or stacked layers. For example, a two-layer structure in which a molybdenum layer is stacked over an aluminum layer, a two-layer structure in which a molybdenum layer is stacked over a copper layer, or a two-layer structure in which a titanium nitride layer or a tantalum nitride layer is stacked over a copper layer is preferable. By stacking a metal layer serving as a barrier layer over a layer with low electric resistance, electric resistance can be reduced and diffusion of a metal element from the metal layer into the semiconductor layer can be prevented. Further, a two-layer structure including a titanium nitride layer and a molybdenum layer, or a three-layer structure including a tungsten layer (with a thickness of about 50 nm), an aluminum-silicon alloy layer (with a thickness of about 500 nm), and a titanium nitride layer (with a thickness of about 30 nm) may be employed. In the case where a three-layer structure is employed, a tungsten nitride layer may be used instead of tungsten of a first conductive layer; an aluminum-titanium alloy layer may be used instead of the aluminum-silicon alloy layer of a second conductive layer; or a titanium layer may be used instead of the titanium nitride layer of a third conductive layer. For example, in the case where a molybdenum layer is stacked over an Al—Nd alloy layer, a conductive layer with excellent heat resistance and low electric resistance can be formed.

The gate electrode layer 202 can be formed in the follow manner: a conductive layer is formed over the substrate 200 by a sputtering method or a vacuum evaporation method; a mask is formed over the conductive layer by a photolithography method or an inkjet method; and the conductive layer is etched using the mask. Further, the gate electrode layer 202 can also be formed by discharging a conductive nanopaste of silver, gold, copper, or the like over the substrate by an inkjet method, and baking the conductive nanopaste. As a barrier metal for increasing adhesion of the gate electrode layer 202 to the substrate 200 and preventing an impurity element included in the substrate 200 from diffusing into an insulating layer and a semiconductor layer, a nitride layer of any of the above metal materials may be provided between the substrate 200 and the gate electrode layer 202. In this example, the gate electrode layer 202 is formed by forming a conductive layer over the substrate 200 and etching the conductive layer with a resist mask formed using a photomask.

Since the semiconductor layer and the source wiring (a signal line) are formed over the gate electrode layer 202 in later steps, the gate electrode layer 202 is preferably formed to have a tapered side so that the semiconductor layer and the source wiring thereover are not disconnected at a step portion of the side of the gate electrode layer 202. In addition, in this step, a gate wiring (a scanning line) can be formed at the same time. Further, a capacitor line included in a pixel portion can also be formed. Here, the scanning line refers to a wiring to which a signal potential to select a pixel is applied.

Next, an insulating layer is formed to cover the gate electrode layer 202, and a crystalline semiconductor film, an amorphous semiconductor film, and an impurity semiconductor film are formed in this order over the insulating layer. This insulating layer serves as a gate insulating film and corresponds to the gate insulating layer 204 shown in the drawing. It is preferable to successively form at least the gate insulating film, the crystalline semiconductor film, and the amorphous semiconductor film. It is more preferable to successively form the impurity semiconductor film following the above films. At least the gate insulating film, the crystalline semiconductor film, and the amorphous semiconductor film are formed successively without being exposed to the atmosphere, whereby the films can be formed without any contamination at the interfaces thereof with an atmospheric component or an impurity element in the atmosphere. Thus, variations in electric characteristics of thin film transistors can be reduced, and thin film transistors with high reliability can be manufactured in a high yield.

The gate insulating layer 204 can be formed using silicon oxide, silicon nitride, silicon oxynitride, or silicon nitride oxide by a CVD method, a sputtering method, or the like. The gate insulating layer 204 may be formed with a single layer or stacked layers of the above materials. As the gate insulating layer 204, a silicon nitride layer or a silicon nitride oxide layer, and a silicon oxide layer or a silicon oxynitride layer are preferably stacked in this order over the substrate because the silicon nitride layer and the silicon nitride oxide layer have a high effect of preventing an impurity element in the substrate 200 from diffusing into the crystalline semiconductor layer 206 when the impurity element is included in the substrate 200, and thus, the silicon oxide layer and the silicon oxynitride layer have excellent interface properties with the crystalline semiconductor layer 206. Further, as the gate insulating layer 204, a silicon oxide layer or a silicon oxynitride layer, a silicon nitride layer or a silicon nitride oxide layer, and a silicon oxide layer or a silicon oxynitride layer may be formed in this order over the substrate. Furthermore, the gate insulating layer 204 may be formed with a single layer of a silicon oxide layer, a silicon nitride layer, a silicon oxynitride layer, or a silicon nitride oxide layer. The gate insulating layer 204 is preferably formed using a microwave plasma CVD apparatus with a frequency of greater than or equal to 1 GHz. A silicon oxynitride layer or a silicon nitride oxide layer formed using a microwave plasma CVD apparatus has high dielectric strength because of its dense film quality, and thus, reliability of a thin film transistor can be improved.

It is preferable that the gate insulating layer 204 have a two-layer structure in which a silicon oxynitride layer is stacked over a silicon nitride oxide layer. The gate insulating layer 204 is formed with a thickness of greater than or equal to 50 nm, preferably from 50 nm to 400 nm inclusive, more preferably from 150 nm to 300 nm inclusive. A silicon nitride oxide layer can prevent alkali metal or the like in the substrate 200 from diffusing into the crystalline semiconductor layer 206. Further, a silicon oxynitride layer can prevent hillocks which can be caused in a case of using aluminum for the gate electrode layer 202, and also prevent the gate electrode layer 202 from being oxidized.

After forming the gate insulating layer 204 and before forming the crystalline semiconductor film which corresponds to the crystalline semiconductor layer 206, a layer for increasing adhesion of the crystalline semiconductor film and preventing the crystalline semiconductor film from being oxidized may be formed over the gate insulating layer 204. As such a layer for preventing oxidation, stacked layers in which an oxynitride layer is sandwiched by silicon nitride layers can be used, for example.

The crystalline semiconductor layer 206 serves as a channel formation region of the thin film transistor. A crystalline semiconductor layer is formed in the above manner described in Embodiment Mode 1.

The field effect mobility of a thin film transistor formed with the crystalline semiconductor layer is about 1 $cm^2/V \cdot sec$ to 20 $cm^2/V \cdot sec$ inclusive, which is about two to twenty times higher than that of a thin film transistor formed with an amorphous semiconductor layer. Therefore, compared to the thin film transistor formed with the amorphous semiconductor layer, the slope at the rising point of Vg-Id curve, which represents the dependence of drain current (Id) on gate voltage (Vg), of the thin film transistor formed with the crystalline semiconductor layer is steeper. Here, "gate voltage" means a potential difference between a potential of a source electrode and a potential of a drain electrode, and "drain current" means current flowing between the source electrode and the drain electrode. Therefore, a thin film transistor in which a crystalline semiconductor layer is used for a channel formation region has high response characteristics as a switching element and can operate at high speed. Thus, with the use of a thin film transistor in which a crystalline semiconductor layer is used for a channel formation region as a switching element of a display device, the area of the channel formation region, i.e., the area of the thin film transistor can be reduced. Further, a part of a driver circuit or the entire driver circuit can be formed over the same substrate as that of a pixel portion, whereby a system-on-panel can be obtained.

Further, the crystalline semiconductor layer of the present invention often exhibits n-type conductivity with low carrier concentration even when an impurity element for controlling conductivity is not added to the crystalline semiconductor layer. Thus, the threshold voltage $V_{th}$ of the thin film transistor may be controlled by adding an impurity element imparting p-type conductivity (e.g., boron) to the crystalline semiconductor layer that serves as the channel formation region at the same time as or after forming the crystalline semiconductor layer. A typical example of an impurity element imparting p-type conductivity is boron; an impurity gas such as $B_2H_6$ or $BF_3$ is preferably mixed into silicon hydride gas at a proportion of from 1 ppm to 1000 ppm, preferably form 1 ppm to 100 ppm. The concentration of boron in the crystalline semiconductor layer is preferably set to be from $1\times10^{14}$ atoms/cm$^3$ to $6\times10^{16}$ atoms/cm$^3$, for example.

The crystalline semiconductor layer 206 is formed with a thickness of from 2 nm to 60 nm inclusive, preferably from 10 nm to 30 nm inclusive. By forming the crystalline semiconductor layer 206 with a thickness of from 2 nm to 60 nm inclusive, the thin film transistor can operate under full depletion mode. The thickness of the crystalline semiconductor layer 206 can be controlled, for example, with the flow rate of silane and the deposition time in a process of forming the grown semiconductor film 106, which is described in Embodiment Mode 1.

The amorphous semiconductor layer 208 can be formed in a similar manner to the semiconductor film 102 including hydrogen in Embodiment Mode 1. The thickness of the amorphous semiconductor layer 208 is from 80 nm to 500 nm inclusive, preferably from 150 nm to 400 nm inclusive, more preferably from 200 nm to 300 nm inclusive.

Further, in a different manner to the semiconductor film 102 including hydrogen, the amorphous semiconductor layer 208 may be formed by sputtering an amorphous semiconductor in a hydrogen gas or in a rare gas.

Furthermore, the amorphous semiconductor layer 208 may be formed in the following manner: after an amorphous semiconductor film is formed over a surface of the crystalline semiconductor layer 206 by a plasma CVD method or a sputtering method, a surface of the amorphous semiconductor film undergoes plasma treatment in a gas including hydrogen, thereby hydrogenating the surface of the amorphous semiconductor film.

Note that the amorphous semiconductor layer 208 needs to be formed so that an impurity element imparting one conductivity type, such as phosphorus or boron, is not added thereto. In particular, it is preferable that boron added to the crystalline semiconductor layer 206 for controlling the threshold voltage or phosphorus included in the source and drain regions 210 do not diffuse to the amorphous semiconductor layer 208. In the case where the amorphous semiconductor layer 208 includes phosphorus, boron, or the like, it is necessary to adjust the concentration of phosphorus, boron, or the like so that it may be equal to or under the detection limit of secondary ion mass spectrometry. For example, when the crystalline semiconductor layer 206 includes boron and the amorphous semiconductor layer 208 includes phosphorus, a PN junction can be formed between the crystalline semiconductor layer 206 and the amorphous semiconductor layer 208.

Further, when the amorphous semiconductor layer 208 includes boron and the source and drain regions 210 includes phosphorus, a PN junction can be formed between the amorphous semiconductor layer 208 and the source and drain regions 210. Furthermore, when the amorphous semiconductor layer 208 includes both boron and phosphorus, a recombination center is generated, which causes leakage current. When the amorphous semiconductor layer 208 does not include these impurity elements, leakage current can be reduced. When the amorphous semiconductor layer 208 that does not include an impurity element such as phosphorus or boron is provided between the source and drain regions 210, and the crystalline semiconductor layer 206, diffusion of the impurity element to the crystalline semiconductor layer 206, which serves as a channel formation region, and to the source and drain regions 210 can be prevented.

The amorphous semiconductor layer 208 is preferably formed using an amorphous semiconductor including hydrogen. An amorphous semiconductor has a larger energy band gap, higher electric resistance, and lower mobility than a crystalline semiconductor Therefore, in a thin film transistor to be formed, the amorphous semiconductor layer 208 formed between the source and drain regions 210, and the crystalline semiconductor layer 206 preferably serves as a high-resistant region, and furthermore, the crystalline semiconductor layer 206 preferably serves as a channel formation region. Thus, Off-current of the thin film transistor can be reduced. When such a thin film transistor is used as a switching element of a liquid crystal display device, the contrast of the liquid crystal display device can be improved.

In the case where the crystalline semiconductor layer 206 is oxidized, the mobility of the thin film transistor decreases and the subthreshold swing thereof increases; thus, electric characteristics of the thin film transistor degrade (specifically, switching characteristics degrade). However, by forming the amorphous semiconductor layer 208 to cover the surface of the crystalline semiconductor layer 206, oxidation of crystal grains (especially, the surface thereof) in the crystalline semiconductor layer can be prevented, which can prevent degradation of electric characteristics of the thin film transistor. By forming the amorphous semiconductor layer 208 to include hydrogen (preferably, fluorine also) in a similar manner to the semiconductor film 102 including hydrogen, penetration of oxygen through the amorphous semiconductor layer 208 can be effectively prevented, thereby enhancing the effect of preventing oxidation of the crystalline semiconductor layer 206.

The source and drain regions 210 can be formed by forming and etching a semiconductor layer including an impurity element. In order to form an n-channel thin film transistor, typically, phosphorus may be used as the impurity element; for example, a gas including an impurity element imparting n-type conductivity, such as $PH_3$, may be added to silicon hydride gas to form the source and drain regions 210. In order to form a p-channel thin film transistor, typically, boron may be used as an impurity element; for example, a gas including an impurity element imparting p-type conductivity, such as $B_2H_6$, may be added to silicon hydride gas. The source and drain regions 210 can be formed using a crystalline semiconductor or an amorphous semiconductor. The source and drain regions 210 are formed with a thickness of from 2 nm to 60 nm inclusive. In other words, the source and drain regions 210 preferably have the same or almost the same thickness as the crystalline semiconductor layer 206. When the source and drain regions 210 are formed with a small thickness, throughput can be improved.

In the present invention, it is preferable to successively form all the layers from the gate insulating layer to the semiconductor layer including the impurity element, as described above. With a multi-chamber CVD apparatus, a process chamber can be provided for each kind of deposition film, and a plurality of different films can be formed successively without being exposed to the atmosphere. An example of a structure of a multi-chamber CVD apparatus applicable to the present invention is described below.

Figure 8:
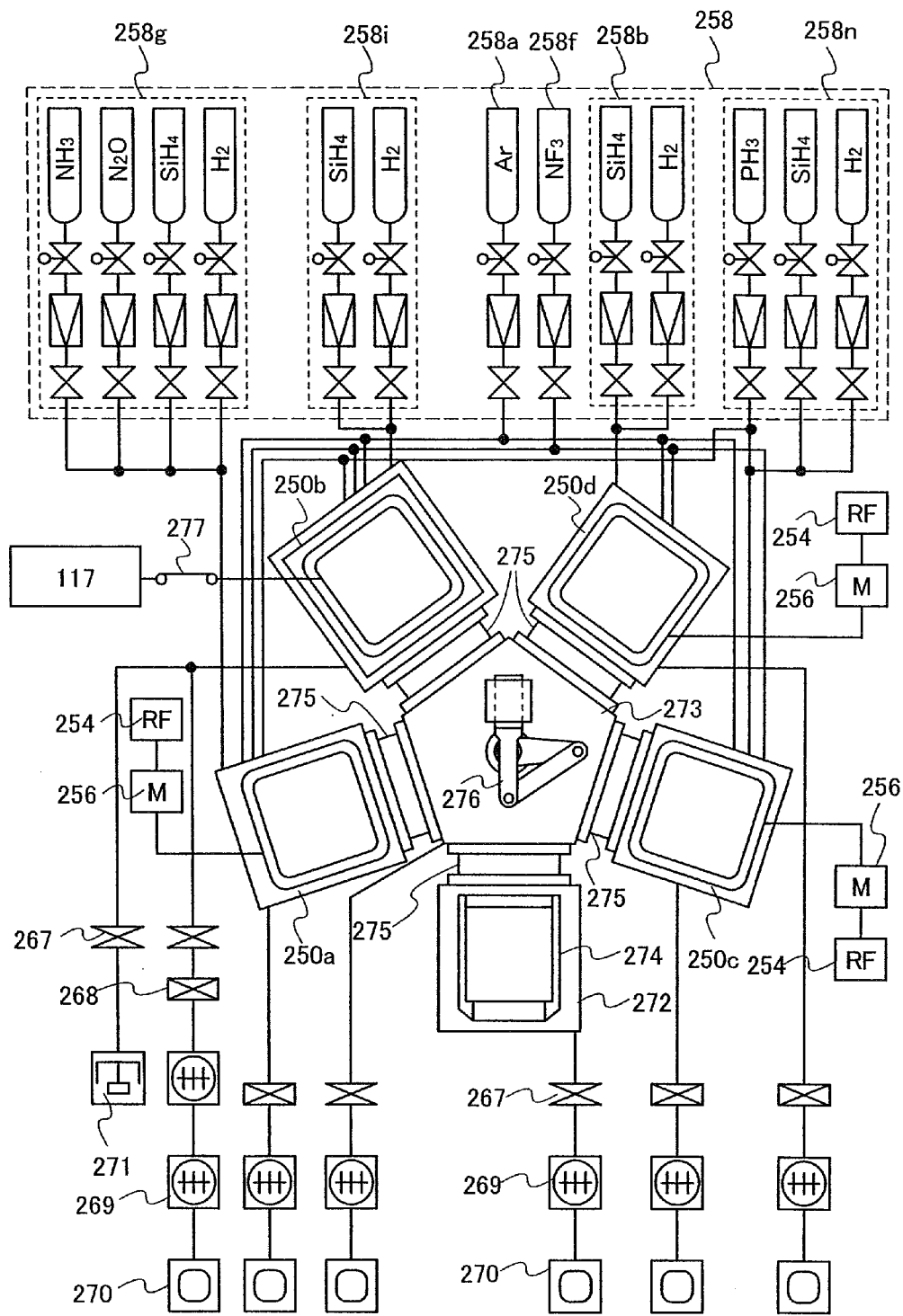
FIG. 8 shows a structure of a plasma CVD apparatus applicable to the present invention.

FIG. 8 is a schematic cross-sectional view of an example of a multi-chamber plasma CVD apparatus provided with a plurality of process chambers. The apparatus is provided with a common chamber 273, a load/unload chamber 272, a first process chamber 250a, a second process chamber 250b, a third process chamber 250c, and a fourth process chamber 250d. After a substrate is set in a cassette of the load/unload chamber 272, the substrate is transferred to and from each process chamber with a transfer unit 276 of the common chamber 273. A gate valve 275 is provided between the common chamber 273 and each process chamber, and between the common chamber 273 and the load/unload chamber, so that treatment performed in each process chamber does not interfere with each other. Each process chamber can be used for a different purpose, depending on the kind of a thin film to be formed. For example, an insulating film such as the gate insulating film is formed with the first process chamber 250a; the semiconductor film including hydrogen is formed and the crystal nucleus in the crystalline semiconductor film for the channel formation region is generated with the second process chamber 250b; the crystal nucleus in the crystalline semiconductor film is grown and the amorphous semiconductor film for protecting the crystalline semiconductor film for the channel formation region is formed with the fourth process chamber 250d; and the semiconductor film to which the impurity element imparting one conductivity type is added, which forms the source and drain regions, is formed with the third process chamber 250c. Since an optimum deposition temperature varies depending on a film to be formed, the process chambers are preferably separated to facilitate the control of deposition temperatures. Further, since the same kind of films can be formed repeatedly, an influence of residual impurities due to a film which has been formed can be eliminated.

One film may be formed with one process chamber, or a plurality of films (e.g., the crystalline semiconductor film and the amorphous semiconductor film) may be formed with one process chamber.

A turbo-molecular pump 269 and a dry pump 270 are connected to each process chamber as an exhaust unit. The exhaust unit is not limited to a combination of these vacuum pumps and may employ other vacuum pumps as long as they can evacuate a process chamber to a degree of vacuum of about $10^{-5}$ to $10^{-1}$ Pa. However, a cryopump 271 is connected to the second process chamber 250b so that the pressure in the process chamber can be reduced to about $10^{-5}$ Pa or less. A butterfly valve 267 and/or a conductance valve 268 are/is provided between these exhaust units and each process chamber. The butterfly valve 267 can block a path between the exhaust units and the reaction chambers. Further, the conductance valve 268 can control the pumping speed and adjust the pressure in each process chamber.

The cryopump 271 connected to the second process chamber 250b can reduce the pressure in the process chamber to less than $10^{-5}$ Pa (preferably, an ultrahigh vacuum). In this embodiment mode, the process chamber is evacuated to a pressure of less than $10^{-5}$ Pa, thereby effectively preventing an atmospheric component such as oxygen from entering the crystalline semiconductor film. Consequently, the oxygen concentration in the crystalline semiconductor film can be set to be less than or equal to $1 \times 10^{16}$ cm$^{-3}$. With the reduced oxygen concentration in the crystalline semiconductor film, crystallinity can be improved, thereby increasing carrier mobility in the film.

A gas supply unit 258 includes a cylinder filled with a gas used for a film formation process, a stop valve, a mass flow controller, and the like. A gas supply unit 258g is connected to the first process chamber 250a and supplies gases for forming the gate insulating film. A gas supply unit 258i is connected to the second process chamber 250b and supplies gases for forming the crystalline semiconductor film and the amorphous semiconductor film. A gas supply unit 258n is connected to the third process chamber 250c and supplies gases for forming the n-type semiconductor film, for example. A gas supply unit 258b is connected to the fourth process chamber 250d and supplies gases for forming the crystalline semiconductor film and the amorphous semiconductor film. A gas supply unit 258a supplies argon. A gas supply unit 258f supplies an etching gas (a NF$_3$ gas in this example) used for cleaning the inside of the process chambers. The gas supply units 258a and 258f are connected to all the process chambers.

A high-frequency power supply unit for generating plasma is connected to each process chamber. The high-frequency power supply unit includes a high-frequency power source 254 and a matching box 256. Further, a microwave generator 117 is connected to the second process chamber 250b so that the plasma treatment can be performed to the semiconductor film including hydrogen as described in Embodiment Mode 1.

A crystalline semiconductor film, an amorphous semiconductor film, and a semiconductor film to which an impurity element imparting one conductivity type is added may be formed successively in one process chamber. Specifically, a substrate provided with a gate insulating film is placed in a process chamber, and a crystalline semiconductor film, an amorphous semiconductor film, and a semiconductor film to which an impurity element imparting one conductivity type is added (an impurity semiconductor film) are formed therein successively. By forming the crystalline semiconductor film and the amorphous semiconductor film successively in one process chamber, an interface with little crystal distortion can be formed. Thus, formation of a defect level at the interface can be prevented. Further, an atmospheric component (e.g., nitrogen or oxygen) that can diffuse into the interface can be reduced.

In addition, a spare chamber may be connected to the apparatus. When a substrate to be provided with a film is preheated in the spare chamber, heating time that is required before deposition to form a film in each process chamber can be shortened, whereby throughput can be improved.

By successive deposition as described above, each film can be formed without any contamination of the interfaces thereof with a contaminant impurity element. Thus, variation in electric characteristics of thin film transistors can be reduced.

When a microwave plasma CVD apparatus described above is used, a film of one kind or plural kinds of films of similar compositions can be formed successively without being exposed to the atmosphere in each process chamber. Thus, films can be stacked without any contamination of each interface thereof with a residue of a film which has already been formed or an impurity element in the atmosphere.

The inside of the process chamber of the microwave plasma CVD apparatus is cleaned with fluorine radicals. The fluorine radicals are introduced in the following manner: carbon fluoride, nitrogen fluoride, or fluorine is introduced into a plasma generator that is provided outside the process chamber, and is dissociated therein to generate fluorine radicals; the fluorine radicals are introduced into the process chamber. The fluorine radicals can remove elements adhering to the inner wall of the process chamber or the like.

After cleaning with the fluorine radicals, a large amount of hydrogen is introduced into the process chamber, whereby the hydrogen and a fluorine residue in the process chamber react with each other to reduce the concentration of the fluorine residue. Thus, the amount of fluorine which enters a protective film that is formed later on the inner wall of the process chamber can be reduced, and the thickness of the protective film can be reduced.

Next, on the inner wall of the first process chamber 250a or the like, a silicon oxynitride film is deposited as the protective film. Here, the pressure in the first process chamber 250a is set to be from 1 Pa to 200 Pa inclusive, preferably from 1 Pa to 100 Pa inclusive, and one or more kinds of rare gases such as helium, argon, xenon, and krypton is/are introduced as a plasma ignition gas. Further, hydrogen is introduced in addition to the above rare gas. In particular, a helium gas is preferable as a plasma ignition gas; a mixed gas of helium and hydrogen is more preferable as a plasma ignition gas.

Although helium has as high ionization energy as 24.5 eV, helium has ionization energy of about 20 eV as a metastable state; thus, helium can be ionized by receiving energy about 4 eV during discharge. Therefore, helium starts to discharge at a low voltage, and discharge can be kept with ease. Accordingly, generated plasma can be kept uniformly and power consumption can be reduced.

As the plasma ignition gas, an oxygen gas may further be introduced. By introducing an oxygen gas together with a rare gas into the process chamber, plasma can be generated easily.

Next, the high-frequency power source 254 connected to the first process chamber 250a is turned on, and the output of the power source is set to be from 500 W to 6000 W inclusive, preferably from 4000 W to 6000 W inclusive to generate plasma. Then, source gases are introduced into the process chamber through a gas pipe. Specifically, by introducing silane, dinitrogen monoxide, and ammonia as source gases, a silicon nitride oxide film is formed as the protective film on the inner wall of the process chamber and on the surfaces of the gas pipe, a dielectric plate, and a support base. Nitrogen may be introduced as a source gas instead of ammonia. The protective film is formed with a thickness of from 500 nm to 2000 nm inclusive.

Subsequently, supply of the source gases is halted, and the pressure in the process chamber is reduced. After that, the high-frequency power source 254 is turned off. Then, a substrate is placed on the support base in the process chamber.

Next, a silicon nitride oxide layer is deposited as the gate insulating layer 204 over the substrate by a similar process to that of the protective film.

After the silicon nitride oxide layer is deposited to a desired thickness, supply of the source gases is halted, and the pressure in the process chamber is reduced, and the high-frequency power source 254 is turned off.

Next, the pressure in the process chamber is set to be from 1 Pa to 200 Pa inclusive, preferably from 1 Pa to 100 Pa inclusive, and one or more kinds of rare gases such as helium, argon, xenon, and krypton, which are plasma ignition gases, and dinitrogen monoxide, a rare gas, and silane, which are source gases, are introduced. Then, the high-frequency power source 254 is turned on, and the output of the power source is set to be from 500 W to 6000 W inclusive, preferably from 4000 W to 6000 W inclusive to generate plasma. Subsequently, the source gases are introduced into the process chamber through the gas pipe, and a silicon oxynitride film is formed over the silicon nitride oxide film over the substrate.

After that, supply of the source gases is halted, and the pressure in the process chamber is reduced. Then, the high-frequency power source 254 is turned off, so that the film formation process is finished.

Through the above process, the silicon nitride oxide film can be formed as the protective film on the inner wall of the process chamber, and the silicon nitride oxide film and the silicon oxynitride film can be successively formed over the substrate, whereby entrance of an impurity element into the silicon oxynitride film of the upper layer can be suppressed. By forming these films by a microwave plasma CVD method using a power source apparatus capable of generating microwaves, a plasma density can be increased and dense films can be formed; thus, films with high dielectric strength can be formed. When these films are used as gate insulating layers of thin film transistors, variations in the threshold voltage of the thin film transistors can be reduced. In addition, the number of defective thin film transistors, which is measured by BT (bias temperature) test, can be reduced and a yield can be improved. Further, resistance to static electricity is increased, and a thin film transistor which is hardly damaged even when excessively high voltage is applied thereto can be manufactured. In the present invention, note that surface wave plasma is used for generating a crystal nucleus in a semiconductor film, whereby accumulation of electric charges in the crystalline semiconductor film can be reduced. Therefore, by forming the gate insulating layer by a plasma CVD method and using surface wave plasma CVD method for forming the semiconductor crystal nucleus, a thin film transistor with high reliability can be obtained; further, a transistor which is hardly damaged over time can be manufactured. Furthermore, a transistor which is hardly damaged by hot carriers can be manufactured.

If the gate insulating layer 204 is formed with a single layer of the silicon oxynitride layer formed using a microwave plasma CVD apparatus, the above formation method of the protective film and the formation method of the silicon oxynitride film are used. In particular, when the flow ratio of dinitrogen monoxide to silane is 100:1 to 300:1, preferably 150:1 to 250:1, a silicon oxynitride layer with high dielectric strength can be formed.

Next, a method for forming a crystalline semiconductor film by a microwave plasma CVD method is described. First, in a similar manner to the formation method of the insulating layer, the inside of the second process chamber 250b is cleaned. Then, a silicon film is deposited as a protective film in the second process chamber 250b. As the silicon film, it is preferable to form an amorphous semiconductor film with a thickness of from 0.2 μm to 0.4 μm inclusive. Here, the pressure in the process chamber is set to be from 1 Pa to 200 Pa inclusive, preferably from 1 Pa to 100 Pa inclusive, and one or more kinds of rare gases such as helium, argon, xenon, and krypton is/are introduced as a plasma ignition gas. Further, hydrogen may be introduced in addition to the rare gas.

Next, the microwave generator is turned on, and the output of the microwave generator is set to be from 500 W to 6000 W inclusive, preferably from 4000 W to 6000 W inclusive to generate plasma. Then, source gases are introduced into the process chamber through a gas pipe. Specifically, by introducing a mixed gas of a silicon hydride gas and a hydrogen gas as the source gases, the silicon film is formed as the protective film on the inner wall of the process chamber and on the surfaces of the gas pipe, a dielectric plate, and a support base. Further, a silicon hydride gas and a hydrogen gas may be diluted with one or more kinds of rare gases selected from helium, argon, krypton, and neon. Here, the flow ratio of hydrogen to silicon hydride is 1:1 to 200:1, preferably 1:1 to 100:1, more preferably 1:1 to 50:1. The thickness of the protective film at this time is from 500 nm to 2000 nm inclusive. Before the microwave generator is turned on, a silicon hydride gas and a hydrogen gas may be introduced into the second process chamber 250b in addition to the above rare gas.

Subsequently, supply of the source gases is halted, and the pressure in the process chamber is reduced. After that, the microwave generator is turned off. Then, the substrate is placed on the support base in the second process chamber 250b.

Next, a semiconductor film including hydrogen is formed over the substrate (strictly, over the insulating film formed over the substrate). As the semiconductor film including hydrogen, an amorphous semiconductor film is used. It is preferable that the flow ratio of a hydrogen gas to silicon hydride be 1:1 to 20:1, more preferably 1:1 to 10:1, still more preferably 1:1 to 5:1. In this way, the semiconductor film including hydrogen can be formed. Further, a silicon hydride gas may be diluted with one or more kinds of rare gas elements selected from helium, argon, krypton, and neon. By diluting a silicon hydride gas with a rare gas, plasma generation can be stabilized.

After the crystalline semiconductor film including hydrogen is deposited to a desired thickness, supply of the source gases is halted, and the pressure in the second process chamber 250b is reduced. Then, the microwave generator is turned off, so that the film formation process is finished.

Next, in order to generate a crystal nucleus in the semiconductor film, surface wave plasma treatment is performed. The surface wave plasma treatment is performed in a mixed gas of silane and hydrogen, or a mixed gas of silane and a rare gas. For example, the flow ratio of hydrogen or a rare gas to silane that are introduced into the second reaction chamber 250b is about 50:1 to 100:1; for example, the flow rate of argon is set to be 500 sccm and that of silane is set to be 10 sccm. Thus, the plasma treatment to the semiconductor film including hydrogen in the present invention is performed mainly with hydrogen radicals or rare gas radicals. The semiconductor film including hydrogen is formed with a thickness of from 5 nm to 100 nm inclusive, preferably from 5 nm to 20 nm inclusive.

In the plasma treatment, the flow ratio of hydrogen or a rare gas to silane can be set as appropriate in the above range. When the flow ratio of hydrogen or a rare gas to silane is about 50:1, the deposition rate is high while the uniformity of plasma to be generated is low. When the flow ratio of hydrogen or a rare gas to silane gas is about 100:1, the uniformity of plasma to be generated is high while the deposition rate is low.

In the above manner, the crystal nucleus can be generated in the semiconductor film including hydrogen.

Next, a crystal is grown using the crystal nucleus generated above.

First, in a similar manner to the second process chamber 250b, the inside of the fourth process chamber 250d is cleaned. Subsequently, a silicon film is deposited as a protective film in the fourth process chamber 250d. As the silicon film, it is preferable to form an amorphous semiconductor film with a thickness of from 0.2 µm to 0.4 µm inclusive. Here, the pressure in the process chamber is set to be from 1 Pa to 200 Pa inclusive, preferably from 1 Pa to 100 Pa inclusive, and one or more kinds of rare gases such as helium, argon, xenon, and krypton is/are introduced as a plasma ignition gas. Further, hydrogen may be introduced in addition to the rare gas.

Next, the high-frequency power source 254 is turned on, and the output of the power source is set to be from 500 W to 6000 W inclusive, preferably from 4000 W to 6000 W inclusive to generate plasma. Then, source gases are introduced into the process chamber through a gas pipe. Specifically, by introducing a silicon hydride gas and a hydrogen gas as the source gases, the silicon film is formed as the protective film on the inner wall of the process chamber and on the surfaces of the gas pipe, a dielectric plate, and a support base. Further, a silicon hydride gas and a hydrogen gas can be diluted with one or more kinds of rare gases selected from helium, argon, krypton, and neon to form the silicon layer. Here, the flow ratio of hydrogen to silicon hydride is 5:1 to 200:1, preferably 50:1 to 150:1, more preferably 100:1. The thickness of the protective film at this time is from 500 nm to 2000 nm inclusive. Before the high-frequency power source 254 is turned on, a silicon hydride gas and a hydrogen gas may be introduced into the process chamber in addition to the above rare gas.

After the film formation, supply of the source gases is halted, and the pressure in the process chamber is reduced. Then, the high-frequency power source 254 is turned off, and the substrate is placed on the support base in the reaction chamber.

A crystalline semiconductor layer is grown in a mixed gas of silane and hydrogen. For example, the flow ratio of hydrogen gas to silane gas that are introduced to the process chamber is about 50:1; for example, the flow rate of hydrogen gas is 400 sccm and that of silane gas is 8 sccm. It is preferable that the flow ratio of hydrogen gas to silane gas be about 100:1. By setting the flow ratio of hydrogen gas to silane gas about 100:1, the crystalline semiconductor film is formed with higher crystallinity than in a case of setting the flow ratio of hydrogen gas to silane gas about 50:1.

The crystalline semiconductor layer is grown to a thickness of from 2 nm to 50 nm inclusive, preferably from 10 nm to 30 nm inclusive.

After the crystalline semiconductor layer is deposited to a desired thickness, supply of the source gases is halted, and the pressure in the process chamber is reduced. Then, the high-frequency power source 254 is turned off, so that the film formation process of the crystalline semiconductor layer is finished.

After forming the crystalline semiconductor layer, an amorphous layer is formed by a plasma CVD method at from 280° C. to 400° C. inclusive. Through this film formation, hydrogen is further supplied to the crystalline semiconductor layer. That is, by forming the amorphous semiconductor layer over the crystalline semiconductor layer, hydrogen is diffused into the crystalline semiconductor layer, so that dangling bonds in the crystalline semiconductor layer can be terminated.

First, the pressure in the process chamber is reduced, and the flow rates of source gases are adjusted. Specifically, the flow rate of a hydrogen gas is lower than that for forming the crystalline semiconductor layer. Typically, a hydrogen gas at a flow rate which is 1 to 200 times, preferably 1 to 100 times, more preferably 1 to 50 times as high as that of silicon hydride is introduced. A silicon hydride gas may be introduced into the process chamber instead of introducing a hydrogen gas. By reducing the flow ratio of hydrogen gas to silicon hydride gas as described above, the deposition rate of the amorphous semiconductor layer can be increased. Further, a silicon hydride gas may be diluted with one or more kinds of rare gas elements selected from helium, argon, krypton, and neon. Next, the microwave generator is turned on, and the output of the microwave generator is set to be from 500 W to 6000 W inclusive, preferably from 4000 W to 6000 W inclusive to generate plasma, so that the amorphous semiconductor layer can be formed. The pressure in the process chamber can be set to be low because the deposition rate of an amorphous semiconductor layer is higher than that of a crystalline semiconductor layer. The thickness of the amorphous semiconductor layer at this time is from 100 nm to 400 nm inclusive.

After the amorphous semiconductor layer is formed to a desired thickness, supply of the source gases is halted, and the pressure in the process chamber is reduced. Then, the microwave generator is turned off, so that the film formation process of the amorphous semiconductor layer is finished.

In the above manner, the gate insulating layer, the crystalline semiconductor layer, and the amorphous semiconductor layer can be formed successively.

After that, a semiconductor layer including an impurity element is formed similarly over the amorphous semiconductor layer.

Figure 5A:
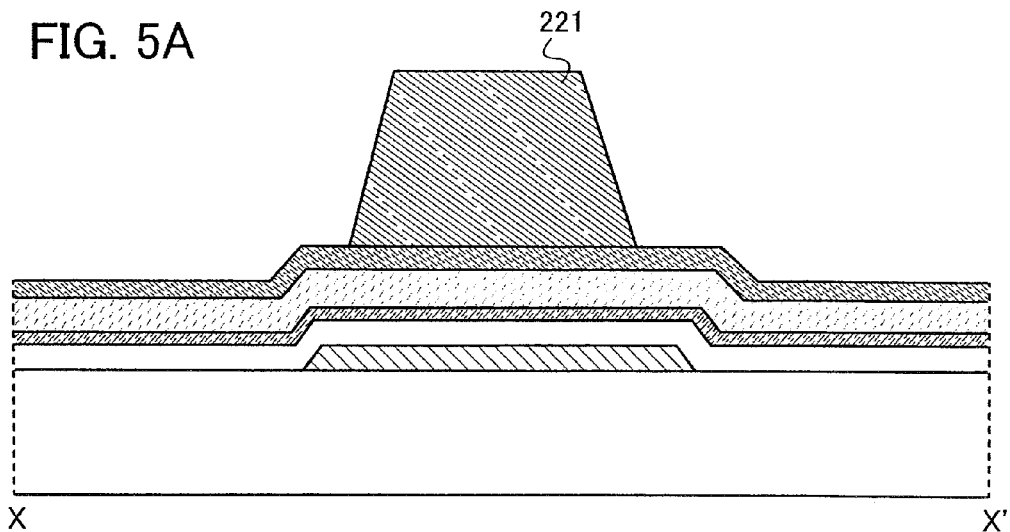
FIGS. 5A to 5C show an example of a method for manufacturing a thin film transistor of an embodiment mode of the present invention.

Next, a resist mask 221 is formed over the semiconductor layer including the impurity element (see FIG. 5A). The resist mask 221 can be formed by a photolithography method. Further, the resist mask 221 may be formed by an inkjet method.

Figure 5B:
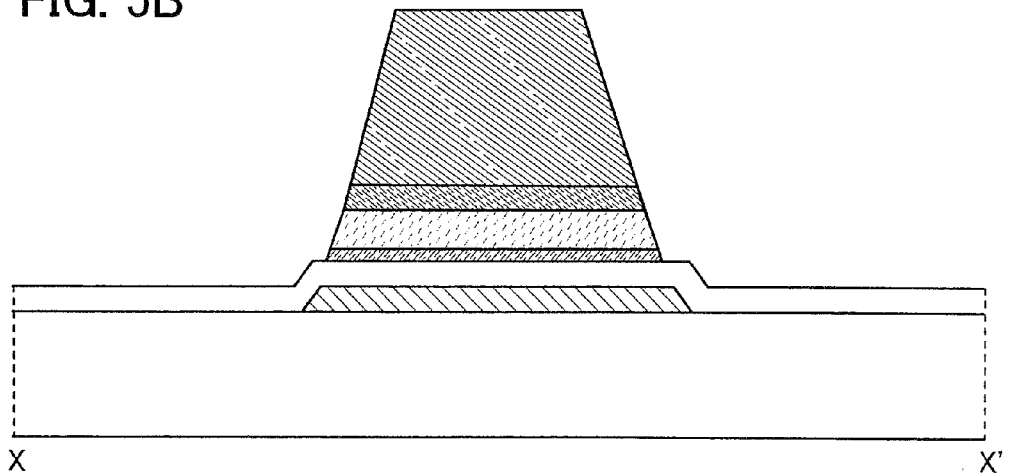

Subsequently, the crystalline semiconductor layer, the amorphous semiconductor layer, and the impurity semiconductor layer are etched using the resist mask 221. By this etching, a lamination layer of the crystalline semiconductor layer, the amorphous semiconductor layer, and the semiconductor layer including the impurity element is separated into elements (see FIG. 5B). After that, the resist mask 221 is removed.

The etching is preferably performed so that the crystalline semiconductor layer, the amorphous semiconductor layer, and the semiconductor layer including the impurity element can have tapered shape at the sides of the above layers. The taper angle is from 30° to 90° inclusive, preferably from 40° to 80° inclusive. With the tapered shape, coverage with a layer which is formed thereover (e.g., a wiring layer) in a later step can be improved. Thus, disconnection or the like at a step portion of a layer can be prevented.

Figure 5C:
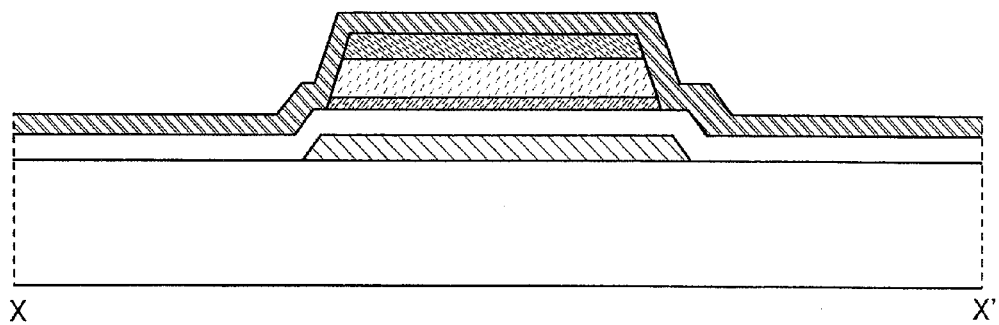

Next, a conductive layer is formed over the semiconductor layer including the impurity element and the gate insulating layer 204 (see FIG. 5C).

The conductive layer can be formed with a single layer or stacked layers of aluminum, copper, titanium, neodymium, scandium, molybdenum, chromium, tantalum, tungsten, and the like. Further, the conductive layer may be formed using an aluminum alloy to which an element for preventing hillocks is added (e.g., an Al—Nd alloy, which can be used for the gate electrode layer 202). Furthermore, the conductive layer may be formed using crystalline silicon to which an impurity element imparting one conductivity type is added. The conductive layer may have a stacked-layer structure in which titanium, tantalum, molybdenum, tungsten, or nitride of any of these elements is formed over the semiconductor layer including the impurity element and aluminum or an aluminum alloy is formed thereover. Further, the conductive layer may have a stacked-layer structure in which an aluminum or an aluminum alloy is sandwiched with titanium, tantalum, molybdenum, tungsten, or nitride of any of these elements. For example, the conductive layer preferably has a three-layer structure in which an aluminum layer is sandwiched with molybdenum layers.

The conductive layer is formed by a sputtering method, a vacuum evaporation method, or the like. Further, the conductive layer may be formed by discharging a conductive nanopaste of silver, gold, copper, or the like by a screen printing method, an inkjet method, or the like and baking the conductive nanopaste.

Figure 6A:
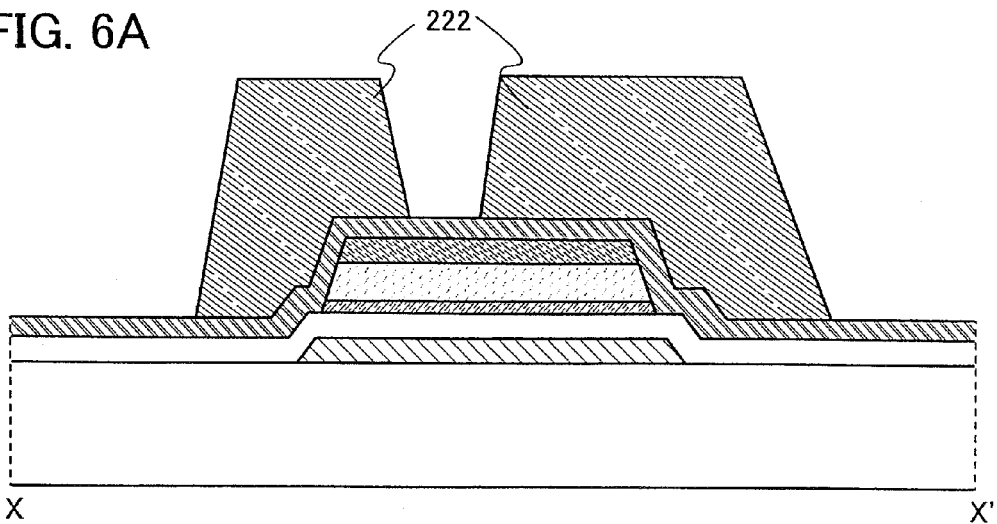
FIGS. 6A to 6C show an example of a method for manufacturing a thin film transistor of an embodiment mode of the present invention.

Next, a resist mask 222 is formed over the conductive layer (see FIG. 6A). In the similar manner to the resist mask 221, the resist mask 222 is formed by a photolithography method or an inkjet method. Here, oxygen plasma ashing may be performed to control the size of the resist mask.

Figure 6B:
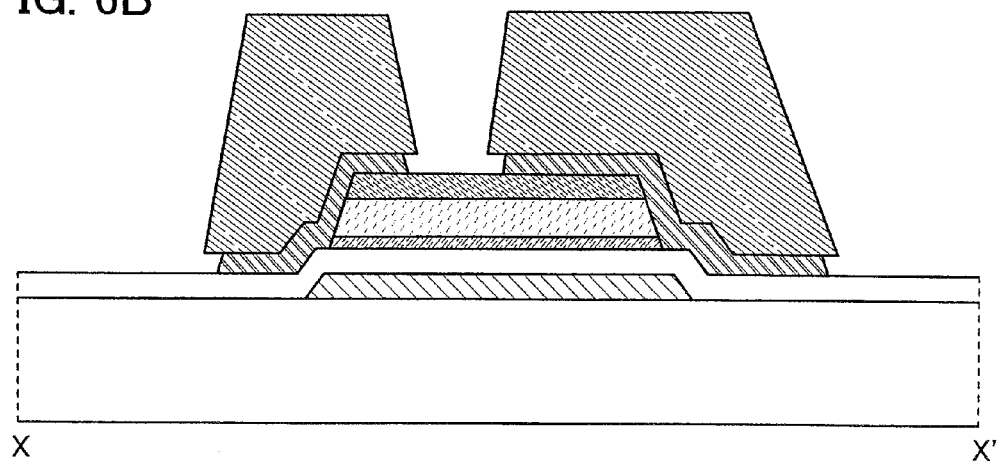

Subsequently, the conductive layer is etched to be patterned using the resist mask 222 (see FIG. 6B). The patterned conductive layer serves as the source and drain electrodes. It is preferable that this etching be conducted by wet etching. By using wet etching, portions of the conductive layer which are not covered with the resist mask 222 are etched isotropically. As a result, the sides of the conductive layers are etched inward, so that the source and drain electrode layers 212 are formed. At this step, the sides of the source and drain electrode layers 212 are not aligned with those of the semiconductor layers including the impurity element, and the sides of the semiconductor layers including the impurity element are located outside those of the source and drain electrode layers 212. In this etching process, as well as the source and drain electrode layers 212, signal lines are formed.

Figure 6C:
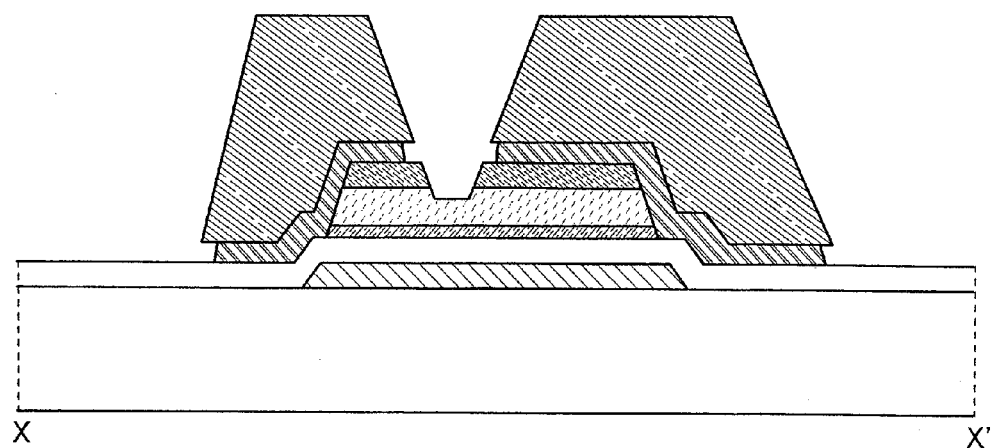

Next, the semiconductor layer including the impurity element and the amorphous semiconductor layer are etched using the resist mask 222 formed thereover, so that a "back channel" portion is formed (FIG. 6C). The amorphous semiconductor layer is etched to leave a part thereof, and the surface of the crystalline semiconductor layer 206 is covered with the amorphous semiconductor layer. In such a manner, the amorphous semiconductor layer 208 is formed.

Here, the semiconductor layer including the impurity element and the amorphous semiconductor layer are preferably etched by dry etching with a gas including oxygen. With the use of the gas including oxygen, the semiconductor layer including the impurity element and the amorphous semiconductor layer can be etched while the resist is receding inward, so that the sides of the semiconductor layer including the impurity element and the amorphous semiconductor layer can be formed to have a tapered shape. As an etching gas, for example, a gas in which oxygen is mixed in $CF_4$ or a gas in which oxygen is mixed in chlorine is used. The tapered shape of the side of the semiconductor layer including the impurity element and the amorphous semiconductor layer can prevent concentration of an electric field and reduce Off-current. For example, this etching can be performed as follows: the flow ratio of a $CF_4$ gas to an oxygen gas is 45:55 (sccm); the pressure in the chamber is 2.5 Pa; the temperature of a side wall of the chamber is 70° C.; RF (13.56 MHz) power of 500 W is applied to a coiled electrode to generate plasma; RF (13.56 MHz) power of 200 W is applied to the substrate side to substantially apply negative bias power thereto, so that a self-bias voltage is generated.

A concave portion (the back channel portion) in the amorphous semiconductor layer 208 is formed by etching a part of the amorphous semiconductor layer when a source region and a drain region are formed. The concave portion is preferably formed so that the part of the amorphous semiconductor layer under the concave portion remains. A region of the amorphous semiconductor layer 208 which overlap with the source and drain regions 210 are not etched in forming the source and drain regions, and have a thickness of about 80 nm to 500 nm inclusive, preferably from 150 nm to 400 nm inclusive, more preferably from 200 nm to 300 nm inclusive. By forming the amorphous semiconductor layer 208 with a sufficient thickness as described above, diffusion of an impurity or the like into the crystalline semiconductor layer 206 can be prevented. In such a manner, the amorphous semiconductor layer 208 also serves as a protective layer for the crystalline semiconductor layer 206.

Figure 7A:
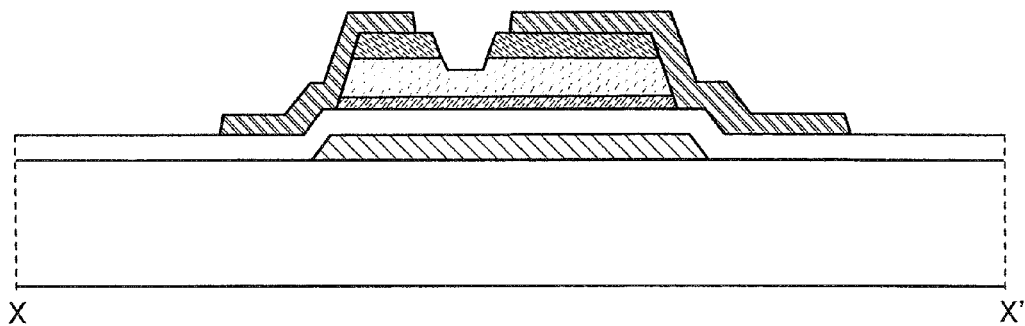
FIGS. 7A and 7B show an example of a method for manufacturing a thin film transistor of an embodiment mode of the present invention.

After that, the resist mask 222 is removed (FIG. 7A).

As described above, the amorphous semiconductor layer 208 is provided in the thin film transistor formed using the crystalline semiconductor layer, thereby preventing an etching residue from entering the crystalline semiconductor layer 206. However, a residual by-product caused in the etching process, a residue of the resist mask, substances which have been used for removal of the resist mask and may be contamination sources in an apparatus, and a component of a resist-remover are attached or deposited on the amorphous semiconductor layer 208 between the source region and the drain region; thus, by electric conduction through these, Off-current increases in many semiconductor elements, which often leads to variation in electric characteristics between the semiconductor elements over the same substrate.

In order to solve the above problem, therefore, dry etching is performed. Dry etching can reliably insulate the source region and the drain region from each other. The etching condition is set so that the exposed region of the amorphous semiconductor layer is not damaged and the etching rate with respect to the amorphous semiconductor layer can be low. In other words, a condition which gives almost no damage to the surface of the exposed region of the amorphous semiconductor layer and does not reduce the thickness of the amorphous semiconductor layer may be applied. At this time, a gas used for forming the back channel portion (e.g., a chlorine gas) can be used as the etching gas. For example, the etching may be performed for thirty seconds under the following condition: the gas flow rate is 30 sccm; the pressure in the chamber is 0.67 Pa; the temperature of the lower electrode is −10° C.; the temperature of the side wall of the chamber is about 80° C.; and RF power (13.56 MHz) of 2000 W is applied to the coiled electrode to generate plasma while no power is applied to the substrate side (i.e., 0 W ). There is no particular limitation on an etching method; a capacitively coupled plasma (CCP) method, an electron cyclotron resonance (ECR) method, a reactive ion etching (RIE) method, or the like can be used as well as an inductively coupled plasma (ICP) method. The temperature here means the temperature of the lower electrode.

The above etching can remove a residue and the like on the amorphous semiconductor layer 208 between the source region and the drain region. It is probable that alkylbenzene sulfonate in the resist-remover especially increases the leakage current. Therefore, an etching gas which can remove the alkylbenzene sulfonate is preferably used; for example, a nitrogen gas or a $CF_4$ gas can be used. This etching process may be performed if needed.

Further, as described above, since the side of the source and drain electrode layers 212 are not aligned with those of the source and drain regions 210, the distance between the source electrode and the drain electrode is sufficiently long. Thus, leakage current can be reduced and short circuit can be prevented. Furthermore, since the side of the source and drain electrode layers 212 are not aligned with those of the source and drain regions 210, an electric field hardly concentrates on the side of the source and drain electrode layers 212 and of the source and drain regions 210. Still furthermore, the amorphous semiconductor layer 208, which is a high-resistant region, provides a sufficient distance between the gate electrode layer 202 and the source and drain electrode layers 212. Thus, generation of parasitic capacitance can be suppressed and leakage current can be reduced. Consequently, a thin film transistor with high reliability, small Off-current, and high dielectric strength can be manufactured.

Through the above process, a channel-etched thin film transistor of the present invention can be formed.

Figure 7B:
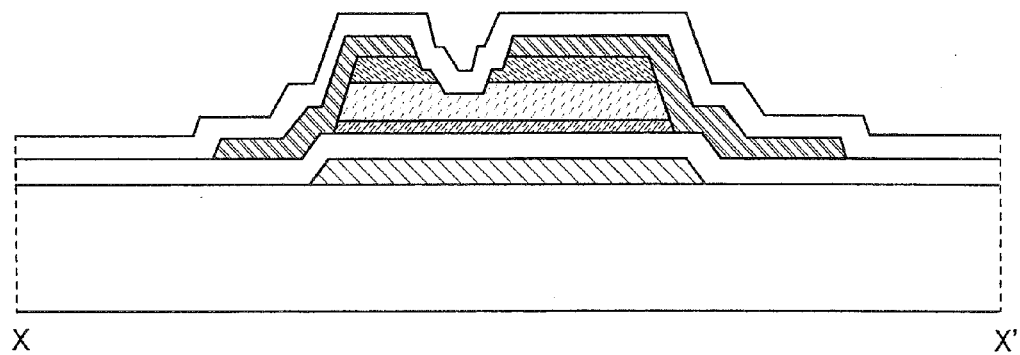

Next, the insulating layer 214 is formed to cover the source and drain electrode layers 212, the source and drain regions 210, the crystalline semiconductor layer 206, and the gate insulating layer 204 (see FIG. 7B). The insulating layer 214 can be formed in a similar manner to the gate insulating layer 204. As the insulating layer 214, it is preferable to use a dense silicon nitride layer that can prevent a contaminant impurity such as an organic substance, a metal substance, or moisture in the atmosphere from diffusing into the channel-etched thin film transistor. Further, it is preferable that the carbon, nitrogen, and oxygen concentrations in the amorphous semiconductor layer 208 be less than or equal to $1\times10^{19}$ atoms/cm$^3$, more preferably less than or equal to $5\times10^{18}$ atoms/cm$^3$.

Since the thin film transistor shown in FIG. 4 serves as a pixel transistor, either the source electrode or the drain electrode is connected to a pixel electrode. In the thin film transistor shown in FIG. 4, either the source electrode or the drain electrode is connected to the pixel electrode 218 though the opening portion 216 provided in the insulating layer 214.

The pixel electrode 218 can be formed using a conductive composition including a light-transmitting conductive high-molecular compound (also referred to as a conductive polymer). It is preferable that the pixel electrode 218 formed using a conductive composition have a sheet resistance of less than or equal to 10000 Ω/cm$^2$, and a light transmittance of greater than or equal to 70% at a wavelength of 550 nm. In addition, it is preferable that the resistivity of the conductive high-molecular compound which is included in the conductive composition be less than or equal to 0.1 Ω·cm.

As the conductive high-molecular compound, a "π electron conjugated conductive high-molecular compound" can be used. Examples thereof include polyaniline and derivatives thereof, polypyrrole and derivatives thereof, polythiophene and derivatives thereof, and copolymers of two or more kinds of them.

The pixel electrode 218 can be formed using indium oxide including tungsten oxide, indium zinc oxide including tungsten oxide, indium oxide including titanium oxide, indium tin oxide including titanium oxide, indium tin oxide (hereinafter also referred to as ITO), indium zinc oxide, indium tin oxide to which silicon oxide is added, or the like.

In a similar manner to the source and drain electrode 212 and the like, the pixel electrode 218 may be patterned by being formed over an entire surface and being etched using a resist mask or the like.

Although not shown in the drawings, an insulating layer which is formed using an organic resin by a spin coating method or the like may be provided between the insulating layer 214 and the pixel electrode layer 218.

In the above description, the gate electrode and the scanning line are formed in the same step, and the source and drain electrodes and the signal line are formed in the same step. However, the present invention is not limited to this description. The electrode and the wiring connected to the electrode may be formed in different steps.

As described in this embodiment mode, the present invention makes it possible to manufacture a thin film transistor having a crystalline semiconductor layer in which dangling bonds are terminated and the impurity concentration is low, and which is not damaged by plasma treatment and has excellent electric characteristics. Further, the present invention can improve the throughput of forming the crystalline semiconductor layer, which leads to improvement in the throughput of forming the thin film transistor. Furthermore, the present invention can reduce accumulation of electric charges in the crystalline semiconductor layer and prevent breakdown of a gate insulating layer. Still furthermore, the crystalline semiconductor layer with high uniformity of electric characteristics can be formed even over a large-area substrate, and thus variations of electric characteristics of thin film transistors over a substrate can be reduced.

(Embodiment Mode 3)

This embodiment mode describes a method for manufacturing a thin film transistor to which the method for forming a crystalline semiconductor layer which is described in Embodiment Mode 1 is applied, and which is different from that described in Embodiment Mode 2. Specifically, a method for manufacturing a thin film transistor using a multi-tone photomask is described.

Here, a multi-tone photomask is a photomask which can form an exposed region, a half-exposed region, and an unexposed region as three exposure levels. With the use of a multi-tone photomask, one-time exposure and development process allows a resist mask with plural thicknesses (typically, two kinds of thicknesses) to be formed. Thus, the use of a multi-tone photomask can reduce the number of photomasks.

Figure 14A:
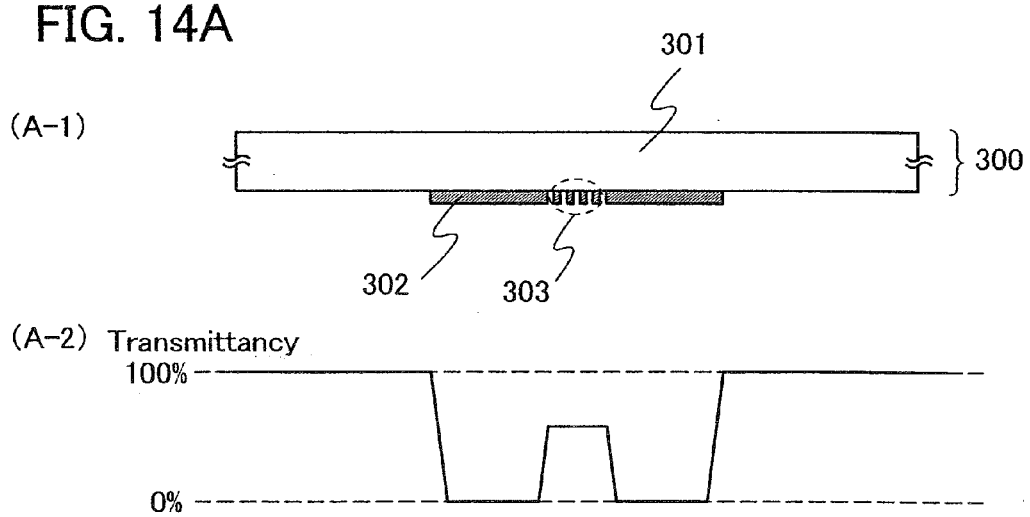
Figure 14B:
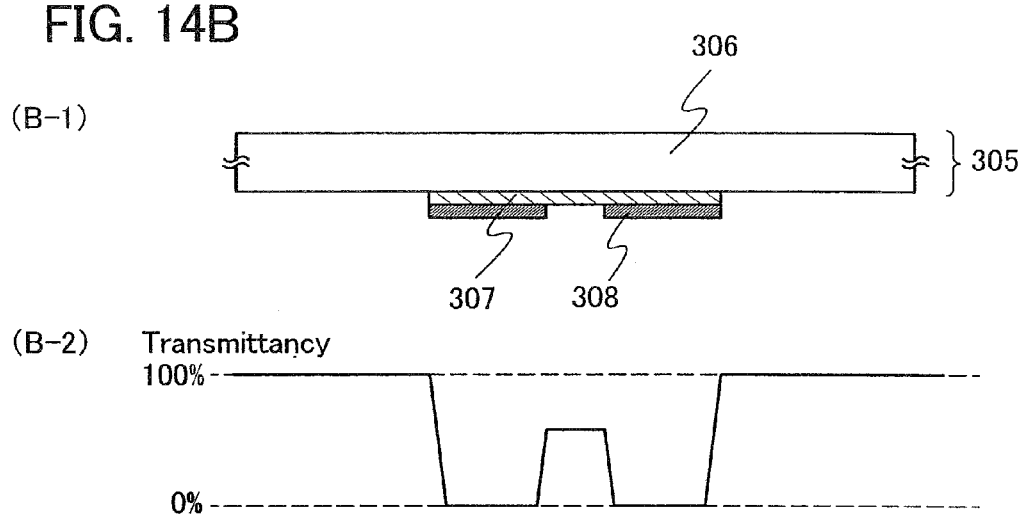

FIGS. 14A-1 and 14B-1 are cross-sectional views of typical multi-tone photomasks. The former shows a gray-tone mask 300 and the latter shows a half-tone mask 305.

The gray tone mask 300 shown in FIG. 14A-1 includes a light-blocking portion 302 formed of a light-blocking film and a diffraction grating portion 303 formed by a pattern of the light-blocking film that are formed on a substrate 301 having a light-transmitting property.

The diffraction grating portion 303 has slits, dots, meshes, or the like that are provided at intervals which are less than or equal to the resolution limit of light used for the exposure, whereby the light transmittance can be controlled. The diffraction grating portion 303 can have slits, dots, or meshes with regular or irregular intervals.

The substrate 301 having a light-transmitting property can be formed using quartz or the like. The light-blocking film constituting the light-blocking portion 302 and the diffraction grating portion 303 may be formed using a metal film; preferably, chromium, chromium oxide, or the like is used.

When the gray-tone mask 300 is irradiated with light for exposure, a light transmittance of a region overlapping with the light-blocking portion 302 is 0% and that of a region where neither the light-blocking portion 302 nor the diffraction grating portion 303 is provided is 100%, as shown in FIG. 14A-2. The light transmittance of the diffraction grating portion 303 can be controlled in a range of from 10% to 70% with intervals of slits, dots, or meshes of the diffraction grating.

The half-tone mask 305 shown in FIG. 14B-1 includes a semi-light-transmitting portion 307 that is formed of a semi-light-transmitting film and is formed on a substrate 306 having a light-transmitting property, and a light-blocking portion 308 formed of a light-blocking film.

The semi-light-transmitting portion 307 can be formed using MoSiN, MoSi, MoSiO, MoSiON, CrSi, or the like. The light-blocking portion 308 may be formed using a similar metal film to the light-blocking film of the gray-tone mask; preferably, chromium, chromium oxide, or the like is used.

When the half-tone mask 305 is irradiated with light for exposure, a light transmittance of a region overlapping with the light-blocking portion 308 is 0% and that of a region where neither the light-blocking portion 308 nor the semi-light-transmitting portion 307 is provided is 100%, as shown in FIG. 14B-2. The light transmittance of the semi-light-transmitting portion 307 can be controlled in a range of from 10% to 70% with the material of the semi-light-transmitting portion 307 or the like.

By light exposure using the multi-tone photomask and development, a first resist mask 310 having different thicknesses can be formed.

First, in a similar manner to Embodiment Mode 2, without performing etching after forming the semiconductor layer including the impurity element, a stacked layer is prepared in which the conductive layer is formed over the semiconductor layer including the impurity element, the amorphous semiconductor layer, the crystalline semiconductor layer, the gate insulating layer, and the gate electrode layer. Then, the resist mask 310 having a concave portion at a desired position is formed over the stacked layer (see FIG. 9A). Such a resist mask is formed using a multi-tone photomask.

Next, the crystalline semiconductor layer, the amorphous semiconductor layer, and the semiconductor layer including the impurity element are etched using the resist mask 310. Through this treatment, a stacked layer of the crystalline semiconductor layer, the amorphous semiconductor layer, and the semiconductor layer including the impurity element are separated into elements, and the concave portion of the resist mask reaches the conductive layer just under the resist mask. The etching may be performed by dry etching or wet etching (see FIG. 9B). Through this treatment, a resist mask 311 is formed.

Subsequently, the conductive layer is etched using the resist mask 311 to be patterned (see FIG. 9C). The patterned conductive layer serves as the source and drain electrodes. Here, wet etching is used for the etching.

Figure 10A:
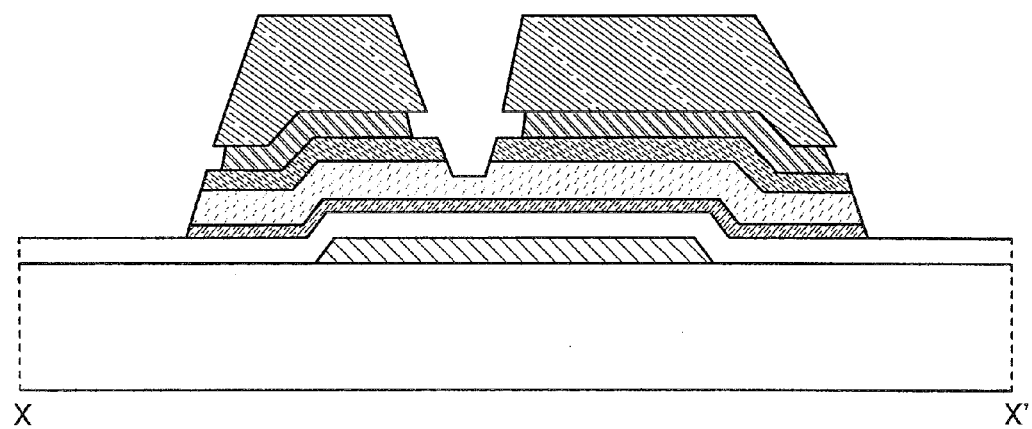
FIGS. 10A and 10B show an example of a method for manufacturing a thin film transistor of an embodiment mode of the present invention.

Then, the semiconductor layer including the impurity element and the amorphous semiconductor layer are partly etched to separate the source region and the drain region. By this step, the source region and the drain region are formed (see FIG. 10A).

Here, the semiconductor layer including the impurity element and the amorphous semiconductor layer are etched by dry etching with a gas including oxygen. With the use of the gas including oxygen, the semiconductor layer including the impurity element and the amorphous semiconductor layer can be etched while the resist is receding inward, so that the side of the semiconductor layer including the impurity element and the amorphous semiconductor layer can be processed to have a tapered shape. As an etching gas, for example, a gas in which oxygen is mixed in $CF_4$ gas or a gas in which oxygen is mixed in chlorine gas is used. The tapered shape of the side of the semiconductor layer including the impurity element and the amorphous semiconductor layer can prevent concentration of an electric field and reduce Off-current.

Figure 10B:
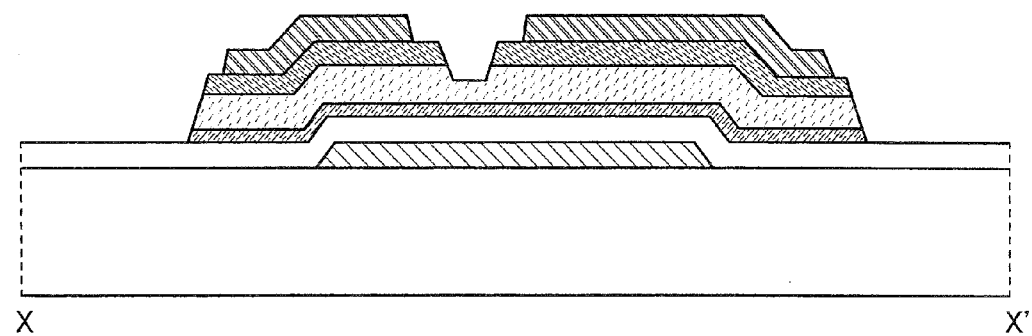

Next, the resist mask 311 is removed (see FIG. 10B).

Also in the manufacturing method of this embodiment mode, in a similar manner to that of Embodiment Mode 2, it is preferable to perform dry etching in order to reduce leakage current after removing the resist mask 311.

Although not shown in the drawings, after the above step, an insulating layer may be formed to cover the source and drain electrode layers, the source and drain regions, the amorphous semiconductor layer, the crystalline semiconductor layer, and the gate insulating layer in a similar manner to other manufacturing methods. Further, an opening portion may be formed in the insulating layer, and either the source electrode or the drain electrode may be connected to a pixel electrode through the opening portion.

Figure 11:
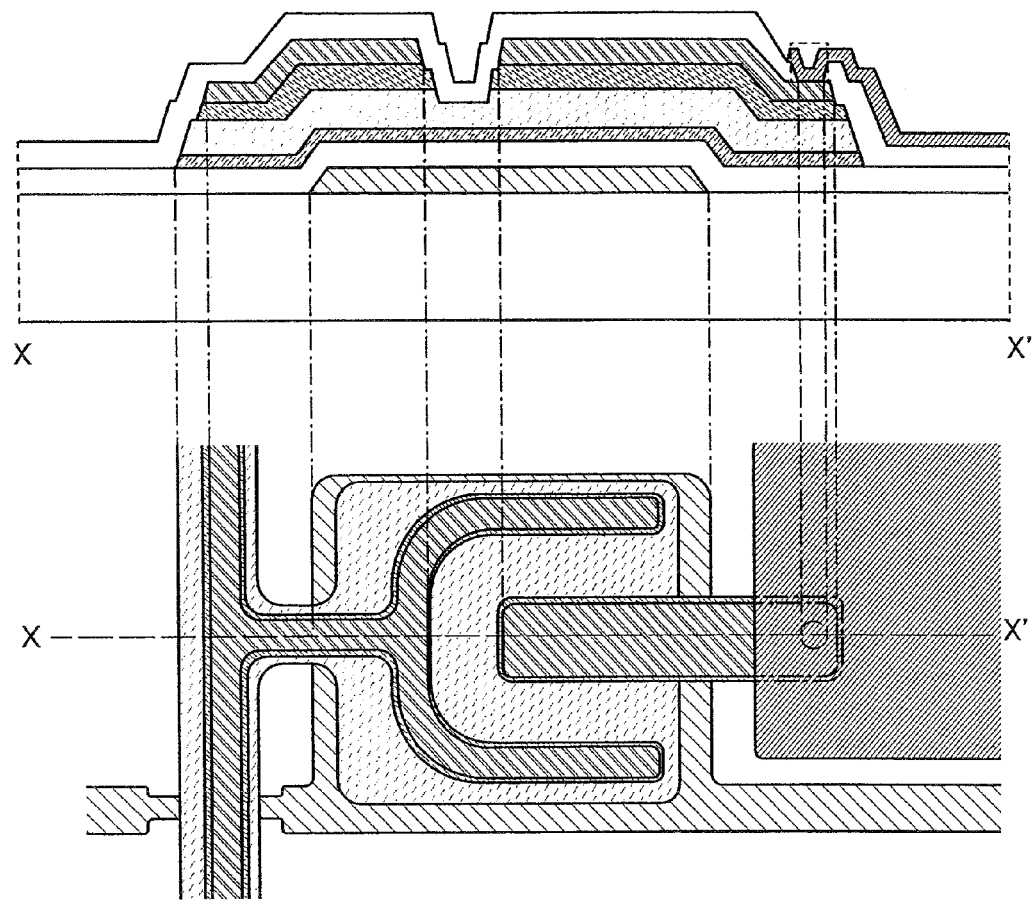
FIG. 11 shows an example of a method for manufacturing a thin film transistor of an embodiment mode of the present invention.

As is similar to FIG. 4, FIG. 11 shows a pixel transistor formed in the above manner. The pixel transistor shown in FIG. 11 includes the crystalline semiconductor layer, the amorphous semiconductor layer, and the semiconductor layer including the impurity element under the source and drain electrode layers, which is different from the pixel transistor shown in FIG. 4.

As described in this embodiment mode, in the manufacturing method in which a multi-tone photomask is used, the crystalline semiconductor layer, the amorphous semiconductor layer, and the impurity semiconductor layer are present under the source and drain electrode layers, as shown in FIG. 11.

As described above, the present invention can also be applied to a case where a multi-tone photomask is used. With the use of the multi-tone photomask, the number of manufacturing steps can be reduced, and according to the present invention, a thin film transistor with excellent electric characteristics and high reliability can be manufactured in a high yield. Further, thin film transistors manufactured have little variation in electric characteristics. Accordingly, it is highly effective to apply the present invention to a method for manufacturing a thin film transistor using a multi-tone photomask.

In addition, another method for manufacturing a thin film transistor using a multi-tone photomask is described below.

Figure 9A:
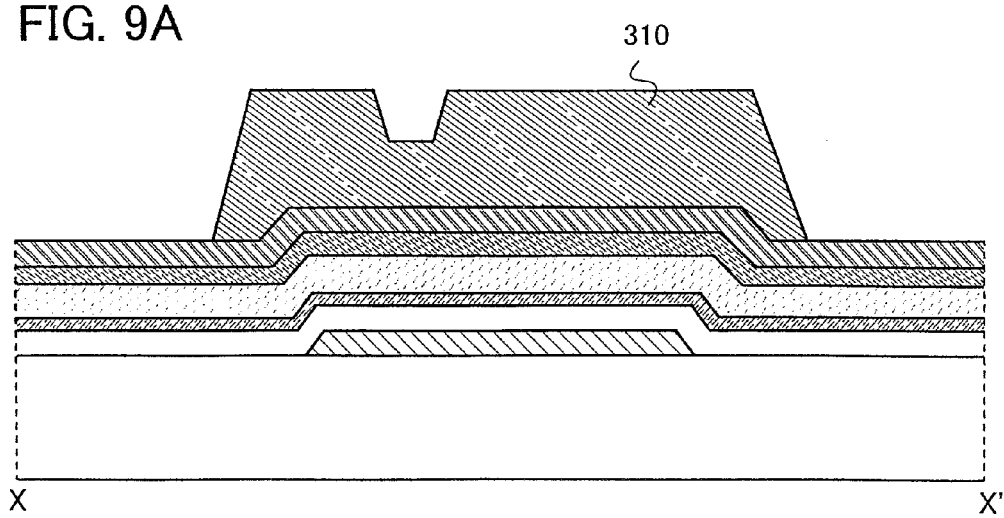
FIGS. 9A to 9C show an example of a method for manufacturing a thin film transistor of an embodiment mode of the present invention.
Figure 9B:
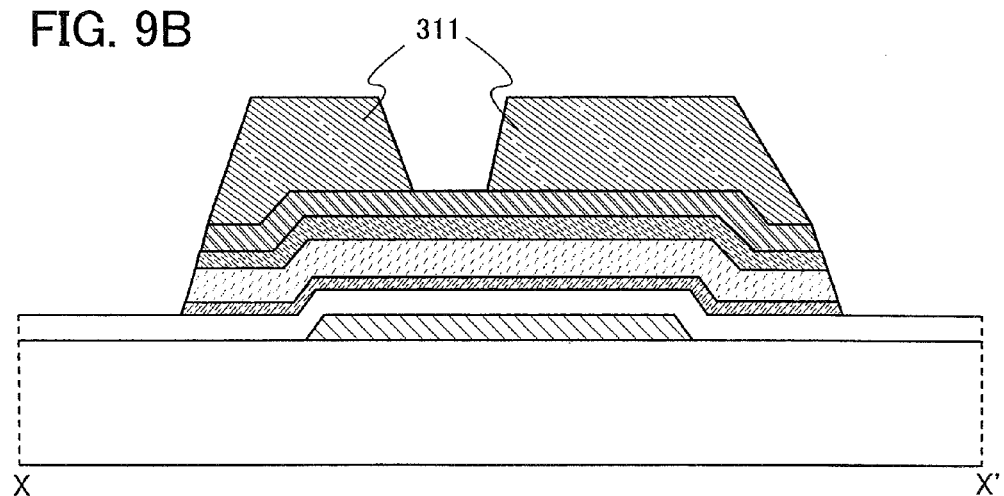
Figure 9C:
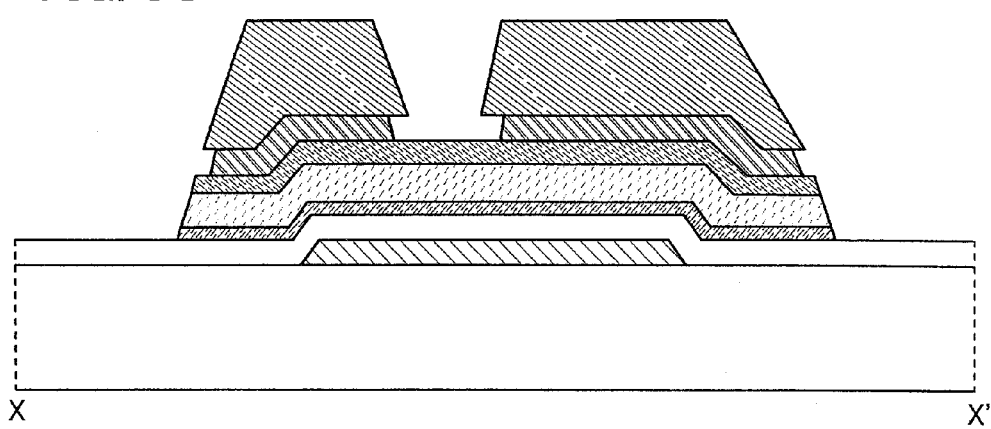
Figure 12A:
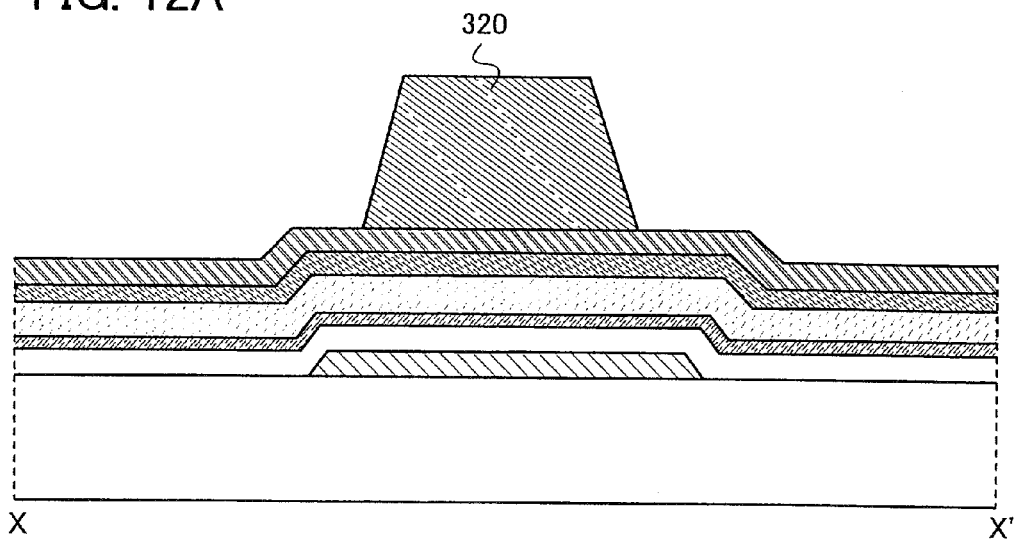
FIGS. 12A to 12C show an example of a method for manufacturing a thin film transistor of an embodiment mode of the present invention.

First, a stacked layer is formed with the gate electrode layer, the gate insulating layer, the crystalline semiconductor layer, the amorphous semiconductor layer, the semiconductor layer including the impurity element, and the conductive layer are stacked, which is similar to the stacked layer in FIG. 9A. Then, a resist mask 320 is formed over the stacked layer (see FIG. 12A).

Figure 12B:
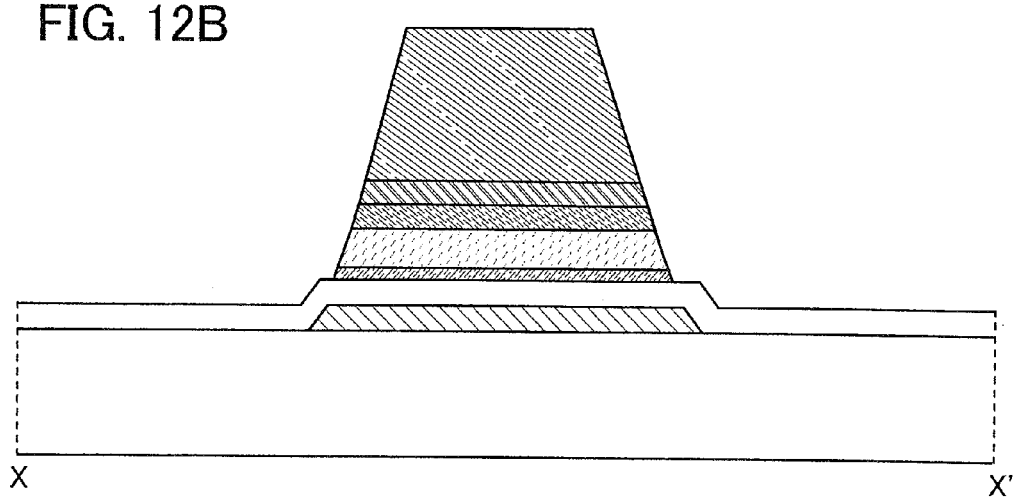

Next, the conductive layer, the crystalline semiconductor layer, the amorphous semiconductor layer, and the semiconductor layer including the impurity element are etched using the resist mask. By this step, the stacked layer is separated into elements. The etching may be performed by dry etching or wet etching (see FIG. 12B).

Figure 12C:
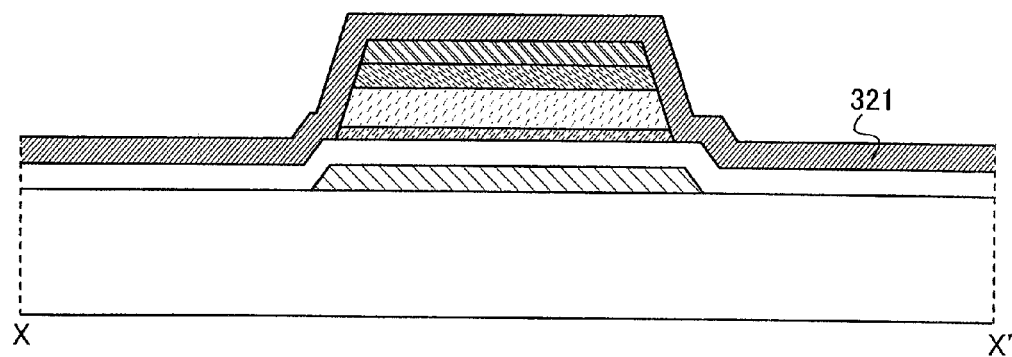
Figure 13A:
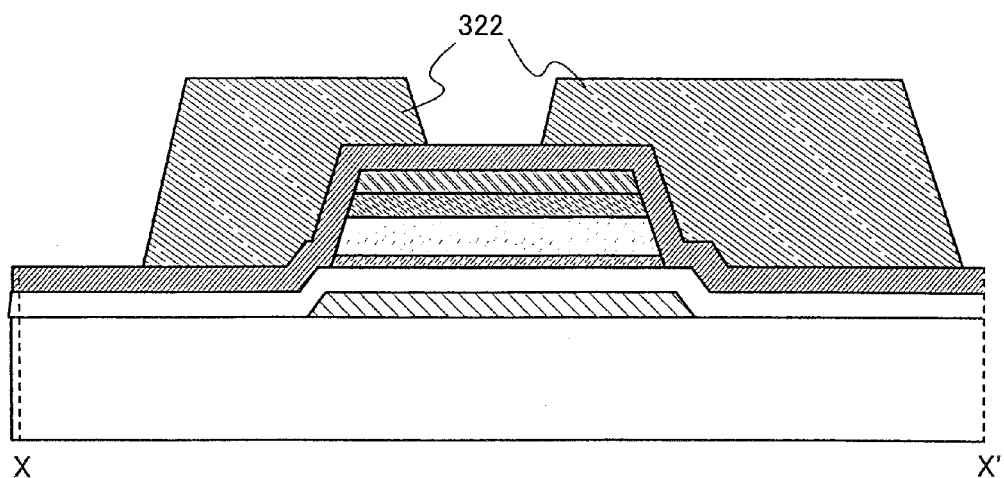
FIGS. 13A to 13C show an example of a method for manufacturing a thin film transistor of an embodiment mode of the present invention.
Figure 13B:
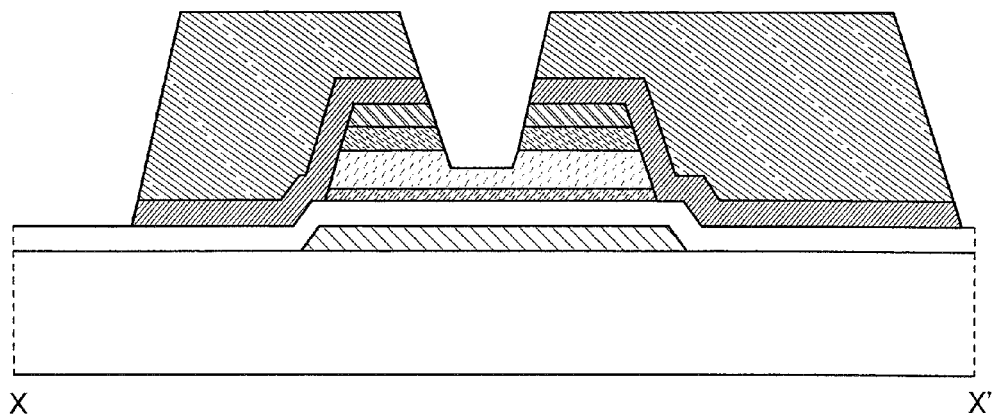
Figure 13C:
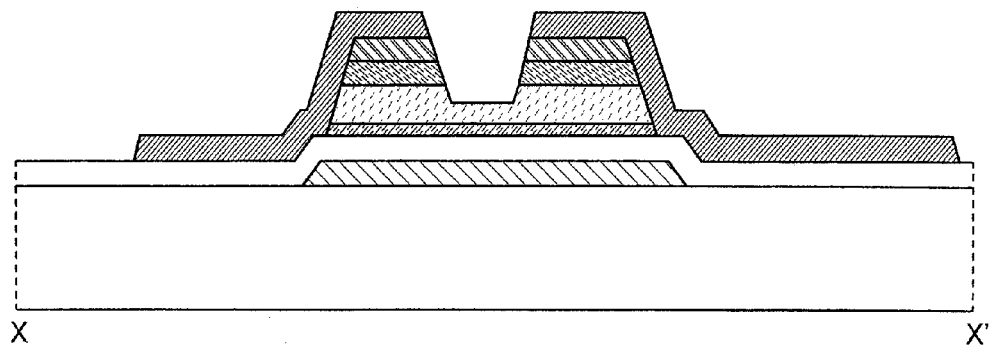

Then, a pixel electrode layer 321 is formed (see FIG. 12C), and a resist mask 322 is formed over the pixel electrode 321 (FIG. 13A). Typically, the pixel electrode 321 is formed using indium tin oxide (ITO). Etching is performed to pattern the pixel electrode using this resist mask, and the semiconductor layer including the impurity element and the amorphous semiconductor layer are partly etched to separate the source region and the drain region (see FIG. 13B). After that, the resist mask 322 is removed.

Also in the above manufacturing method, in a similar manner to the manufacturing method of Embodiment Mode 2, it is preferable to perform dry etching in order to reduce leakage current after removing the resist mask 322.

(Embodiment Mode 4)

The thin film transistor in the present invention can be applied to various modes of liquid crystal display devices. This embodiment mode describes a liquid crystal display device in which a thin film transistor manufactured according to the above embodiment mode is used.

First, a vertical alignment (VA) mode liquid crystal display device is described. In the VA mode, longitudinal axes of liquid crystal molecules are vertical to a panel plane when a voltage is not applied. In this embodiment mode, in particular, a pixel is divided into some regions (subpixels), and molecules are aligned in different directions in their respective regions. This is referred to as multi-domain or multi-domain design. Hereinafter, a liquid crystal display device of multi-domain design is described.

Figure 15:
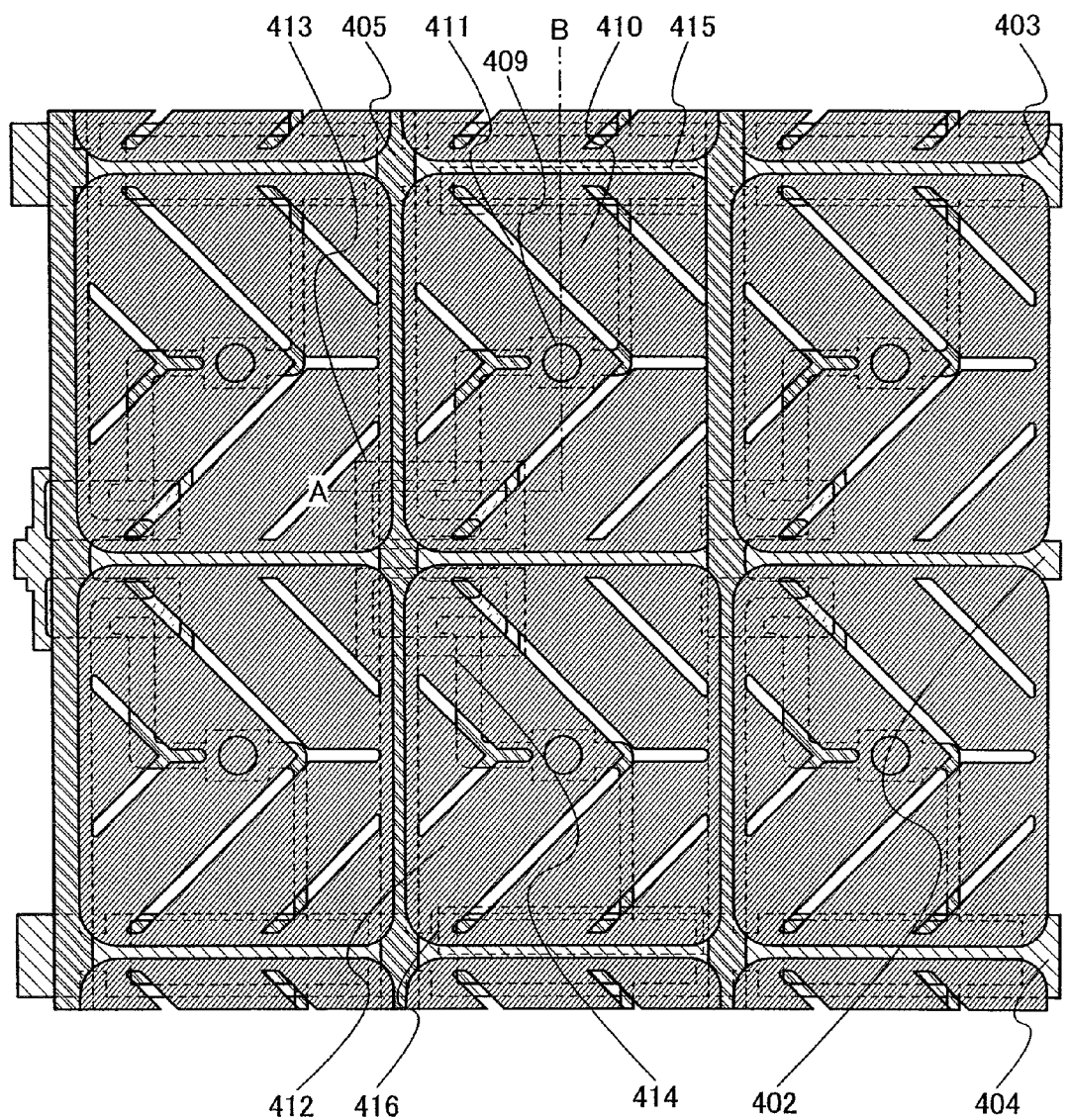
FIG. 15 shows a liquid crystal display device to which the present invention can be applied.
Figure 16:
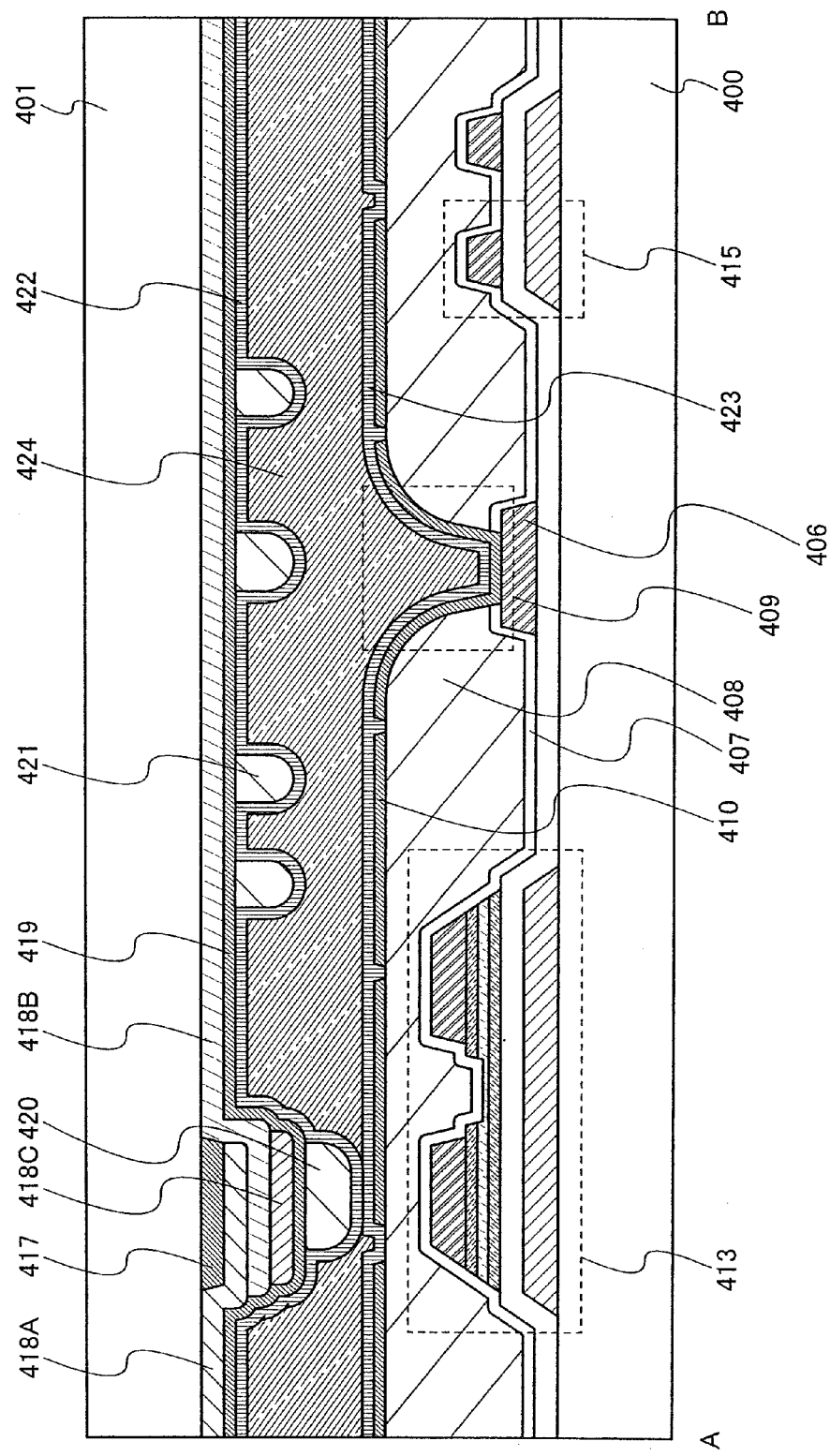
FIG. 16 shows a liquid crystal display device to which the present invention can be applied.
Figure 17:
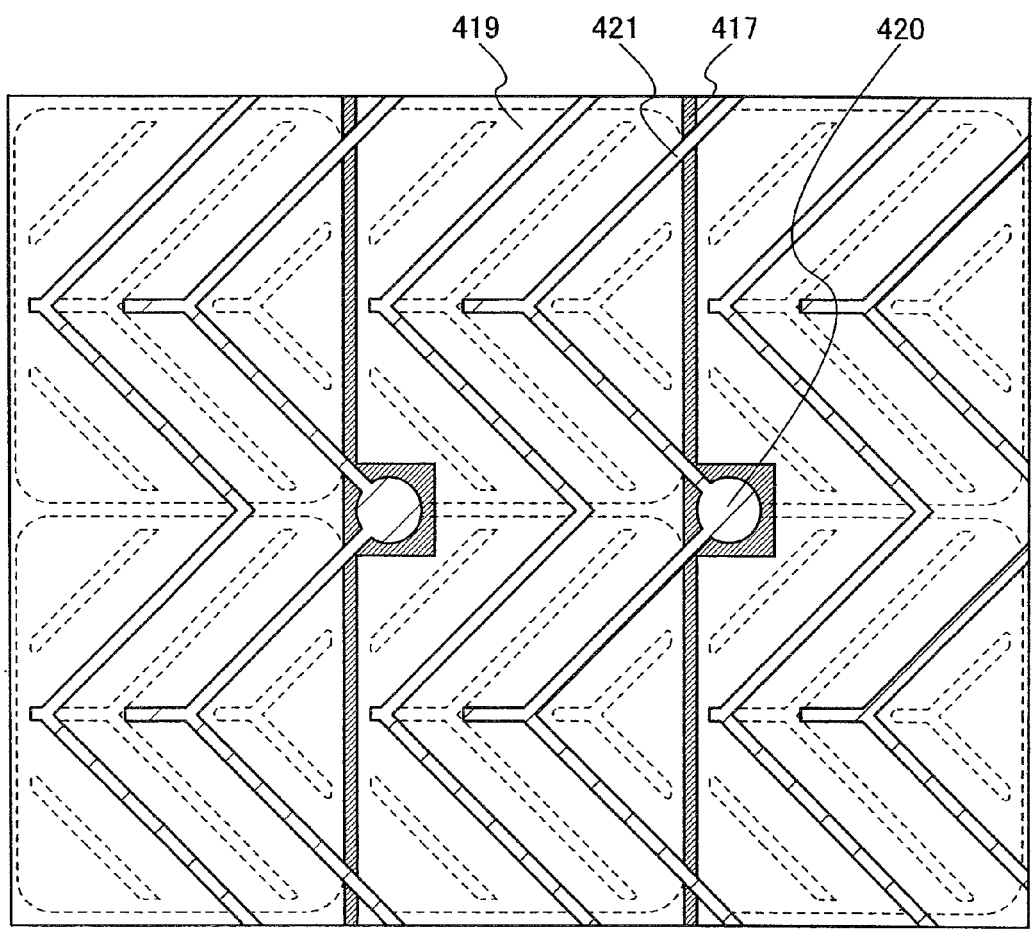
FIG. 17 shows a liquid crystal display device to which the present invention can be applied.

FIG. 15 is a top view of a substrate for which a pixel electrode is provided. FIG. 16 is a cross-sectional view taken along a line A-B in FIG. 15. Further, FIG. 17 is a top view of a substrate for which a counter electrode is provided.

In FIG. 16, a substrate 400 and a substrate 401, which is a counter substrate, are superposed on each other, and liquid crystals are injected therebetween. A thin film transistor 413, a pixel electrode 410 connected to a source electrode or a drain electrode of the thin film transistor 413, and a storage capacitor portion 415 are provided for the substrate 400. A counter electrode 419 is provided for the substrate 401.

A light-blocking layer 417, a first coloring layer 418A, a second coloring layer 418B, a third coloring layer 418C, and the counter electrode 419 are formed in a position where a spacer 420 is formed on the substrate 401. With the structure in which the coloring layers are stacked in the position where the spacer 420 is formed, the height of projections 421 for controlling alignment of liquid crystals is different from that of the spacer 420. An alignment film 423 is formed over the pixel electrode 410, and the counter electrode 419 is provided with an alignment film 422. A liquid crystal layer 424 is formed between the alignment films 422 and 423.

Although a post spacer (a columnar spacer) is used as the spacer 420 in FIG. 16, the present invention is not limited to this and a bead spacer (a spherical spacer) may be used instead. Further, the spacer 420 may be formed over the pixel electrode 410 provided over the substrate 400.

The thin film transistor 413, the pixel electrode 410 connected to the thin film transistor 413, and the storage capacitor portion 415 are formed over the substrate 400. The pixel electrode 410 is connected to a wiring 406 in an opening portion 409 that is formed in insulating layers 407 and 408. The insulating layer 407 is formed to cover the thin film transistor 413, the wiring 406, and the storage capacitor portion 415. The insulating layer 408 is formed to cover the insulating layer 407. The thin film transistor 413 can be manufactured by any of the methods described in the preceding embodiment modes. Further, the storage capacitor portion 415 is formed by sandwiching a gate insulating layer of the thin film transistor 413 between a conductive layer that is formed in the same step as that of a gate electrode of the thin film transistor 413 and a scanning line, and a conductive layer that is formed in the same step as that of the source and drain electrodes of the thin film transistor 413.

A liquid crystal element is formed by overlap of the pixel electrode 410 provided with the alignment film 423, the counter electrode 419 provided with the alignment film 422, and the liquid crystal layer 424 sandwiched therebetween.

FIG. 15 is a top view of the substrate 400 side. The pixel electrode 410 is formed using a similar material to the pixel electrode described in Embodiment Mode 2. The pixel electrode 410 is provided with slits 411. The slits 411 are used for controlling alignment of the liquid crystals.

A thin film transistor 414 shown in FIG. 15 can be formed in a similar manner to the thin film transistor 413. A pixel electrode 412 connected to the thin film transistor 414 can be formed using a similar material and method to the pixel electrode 410. A storage capacitor portion 416 can be formed in a similar manner to the holding capacitor portion 415. The source or drain electrode of the thin film transistor 413 and a source or drain electrode of the thin film transistor 414 are connected to a wiring 405. One pixel of this liquid crystal panel includes the pixel electrode 410 and the pixel electrode 412. The pixel electrodes 410 and 412 constitute subpixels.

FIG. 17 is a top view of the substrate 401. The counter electrode 419 is provided over the light-blocking layer 417. It is preferable to form the counter electrode 419 using a similar material to the pixel electrode 410. The projections 421 for controlling alignment of the liquid crystals are provided over the counter electrode 419. In addition, the spacer 420 is provided in a predetermined position overlapping with the light-blocking layer 417. In FIG. 17, only the light-blocking layer 417, the spacer 420, and the projections 421 are marked with hatching.

Figure 18:
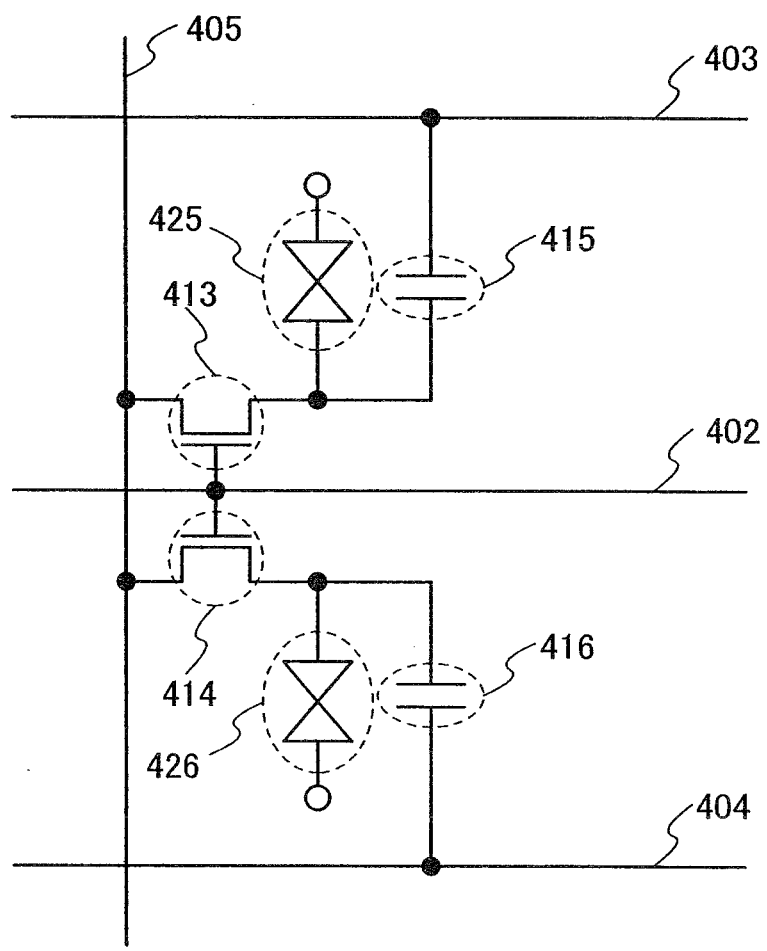
FIG. 18 shows a liquid crystal display device to which the present invention can be applied.

FIG. 18 shows an equivalent circuit of the above-described pixel structure. Gate electrodes of the thin film transistors 413 and 414 are connected to a wiring 402 serving as a scanning line. One of the source electrode and the drain electrode of the thin film transistor 413 and one of the source electrode and the drain electrode of the thin film transistor 414 are connected to the wiring 405, and the others thereof are connected to the wiring 403 and the wiring 404 through the storage capacitor portion 415 and the storage capacitor portion 416, respectively. In FIG. 18, by making the potential of the wiring 403 serving as a capacitor line different from that of the wiring 404 serving as a capacitor line, operation of a liquid crystal element 425 can be different from that of a liquid crystal element 426. That is, the potentials of the wiring 403 and the wiring 404 can be controlled individually, thereby increasing the viewing angle.

When a voltage is applied to the pixel electrode 410 provided with the slits 411 (note that the potential of the pixel electrode 410 is different from that of the counter electrode 419), a distorted electric field is generated near the slits 411 to generate an oblique electric field. The slits 411 and the projections 421 provided for the counter substrate 401 are disposed in an alternate form, thereby effectively generating an oblique electric field to control the alignment of the liquid crystals, and thus the direction in which liquid crystals are aligned can be different depending on the location. That is, the viewing angle of a liquid crystal display panel can be increased by employing multi-domain.

Next, a different VA mode liquid crystal display device from the above is described with reference to FIGS. 19 to 22.

Figure 19:
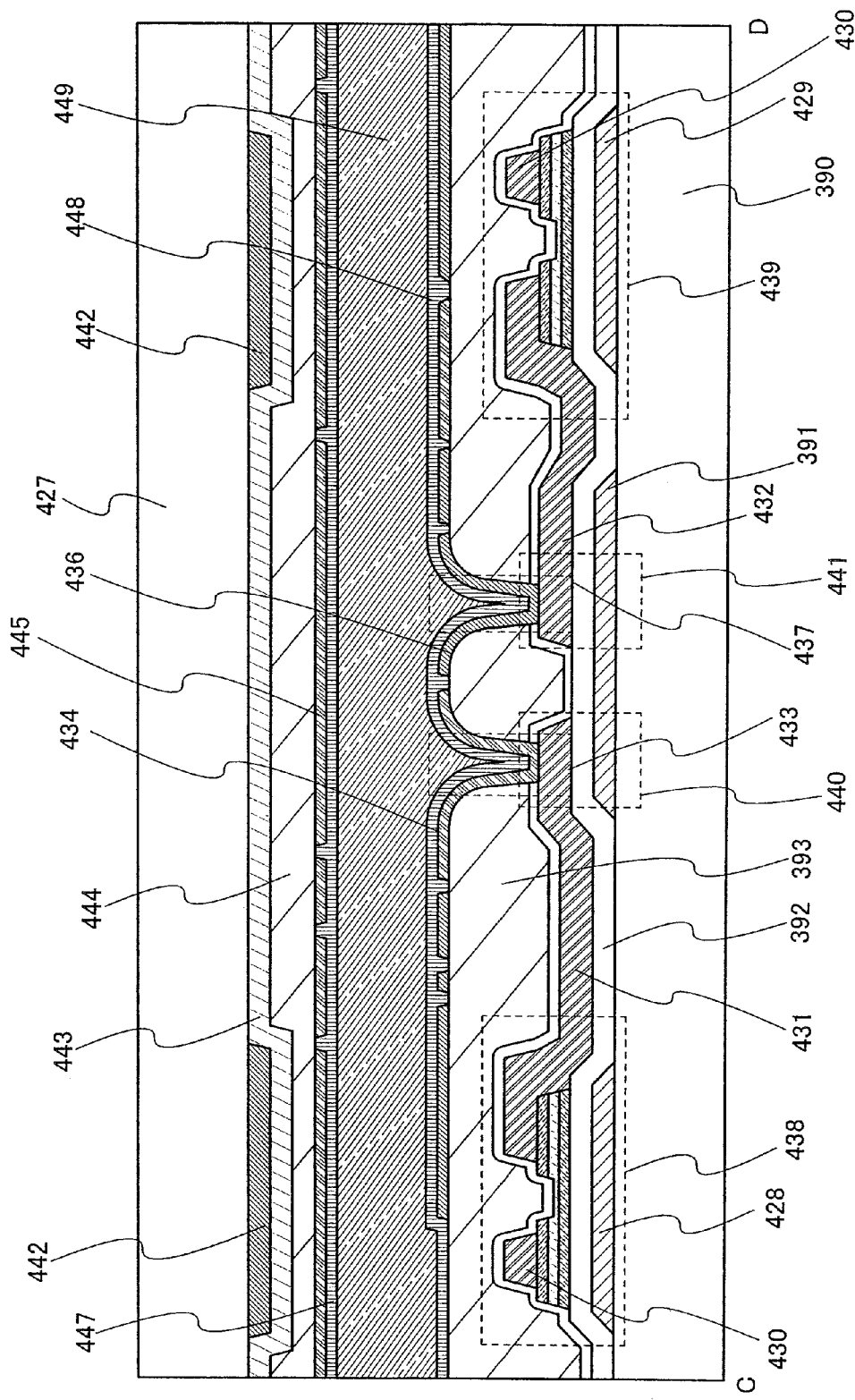
FIG. 19 shows a liquid crystal display device to which the present invention can be applied.
Figure 21:
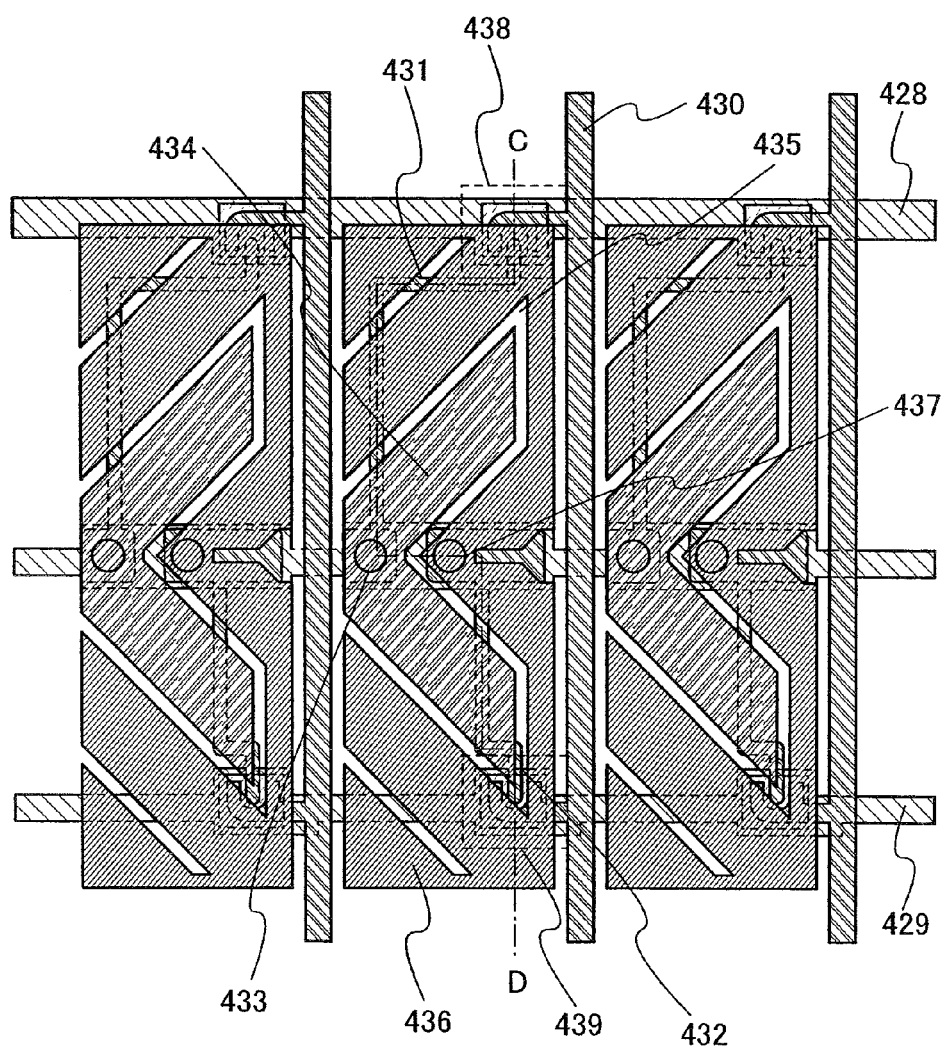
FIG. 21 shows a liquid crystal display device to which the present invention can be applied.
Figure 22:
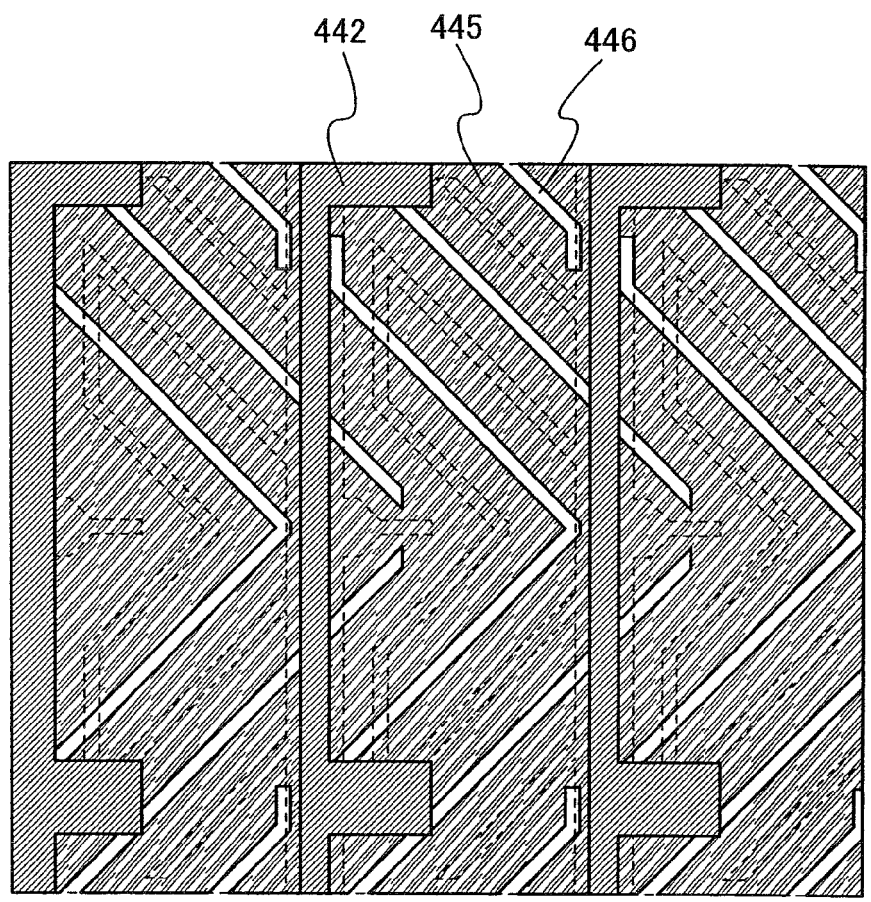
FIG. 22 shows a liquid crystal display device to which the present invention can be applied.

FIG. 21 is a top view of a substrate over which a pixel electrode is formed. FIG. 19 shows a cross-sectional structure taken along a line C-D in FIG. 21. FIG. 22 is a top view of a substrate side for which a counter electrode is provided. Hereinafter, description is made with reference to these drawings.

With regard to a pixel of the liquid crystal display device shown in FIGS. 19 to 22, one pixel has a plurality of pixel electrodes, and a thin film transistor is connected to each pixel electrode. That is, the pixel is a multi-domain pixel. Each thin film transistor is driven with a different gate signal from each other. That is, a signal applied to each pixel electrode can be controlled independently (see FIG. 20).

A pixel electrode 434 is connected to a thin film transistor 438 through a wiring 431 in an opening portion 433. In addition, a pixel electrode 436 is connected to a thin film transistor 439 through a wiring 432 in an opening portion 437. A wiring 428 serving as a scanning line which is connected to a gate electrode of the thin film transistor 438 is separated from a wiring 429 serving as a scanning line which is connected to a gate electrode of the thin film transistor 439 so that different gate signals can be supplied thereto. With regard to a signal line, on the other hand, a wiring 430 is shared by the thin film transistors 438 and 439. The thin film transistors to which the manufacturing methods of the preceding embodiment modes are applied can be used for the thin film transistors 438 and 439.

A storage capacitor portion 440 is connected to the thin film transistor 438. A storage capacitor portion 441 is connected to the thin film transistor 439. The storage capacitor portion 440 includes a wiring 391, the wiring 431, and an insulating layer 392 sandwiched therebetween. The storage capacitor portion 441 includes the wiring 391, the wiring 432, and the insulating layer 392 sandwiched therebetween. The insulating layer 392 serves as a gate insulating layer of the thin film transistors 438 and 439.

The opening portions 433 and 437 are formed to penetrate the insulating layer 392 and an insulating layer 393 that are formed to cover the thin film transistors 438 and 439.

The wiring 391 serves as a capacitor line and is kept at a constant potential (common potential).

Figure 20:
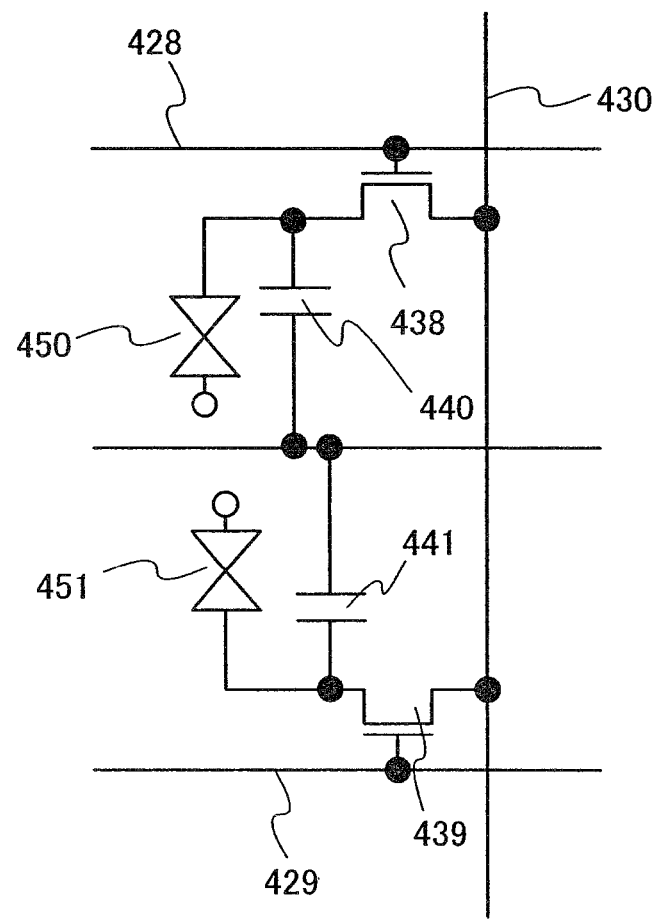
FIG. 20 shows a liquid crystal display device to which the present invention can be applied.

The shape of the pixel electrode 434 is different from that of the pixel electrode 436 (see FIG. 21), and the pixel electrodes are separated by slits 435. Specifically, the pixel electrode 436 surrounds the pixel electrode 434, which has a V-shape. The thin film transistors 438 and 439 make the timing of applying a voltage to the pixel electrodes 434 and 436 different from each other, thereby controlling alignment of liquid crystals. FIG. 20 shows an equivalent circuit of this pixel structure. When different gate signals are supplied to the wirings 428 and 429, operation timing of the thin film transistors 438 and 439 can be different.

A substrate 427 which faces a substrate 390 is provided with a light-blocking layer 442, a coloring layer 443, and a counter electrode 445. In addition, a planarization layer 444 is formed between the coloring layer 443 and the counter electrode 445, and prevents alignment disorder of liquid crystals. FIG. 22 is a top view of the counter substrate. The counter electrode 445 is shared by different pixels, and is provided with slits 446. By providing the slits 446 and the slits 435 on the pixel electrodes 434 and 436 in an alternate form, an oblique electric field is effectively generated, so that alignment of the liquid crystals can be controlled. Thus, the direction of alignment of the liquid crystals in a first liquid crystal element 450 can be different from that in a second liquid crystal element 451, and a wide viewing angle can be obtained.

The pixel electrode 434 provided with an alignment film 448, a liquid crystal layer 449, and the counter electrode 445 provided with an alignment film 447 overlap with one another, thereby forming the first liquid crystal element 450. Further, the pixel electrode 436 provided with the alignment film 448, the liquid crystal layer 449, and the counter electrode 445 provided with the alignment film 447 overlap with one another, thereby forming the second liquid crystal element 451. Thus, in the pixel structure shown in FIGS. 19 to 22, a multi-domain structure is made in which the first liquid crystal element 450 and the second liquid crystal element 451 are provided for one pixel.

The present invention can also be applied to a horizontal electric field mode liquid crystal display device. In a horizontal electric field mode, an electric field is applied in a horizontal direction with respect to liquid crystal molecules in a cell, whereby a liquid crystal element is driven to display gray scales. According to a horizontal electric field mode, the viewing angle can be expanded to approximately 180°. Hereinafter, a horizontal electric field mode liquid crystal display device to which the present invention is applied is described with reference to FIGS. 23 and 24.

Figure 23:
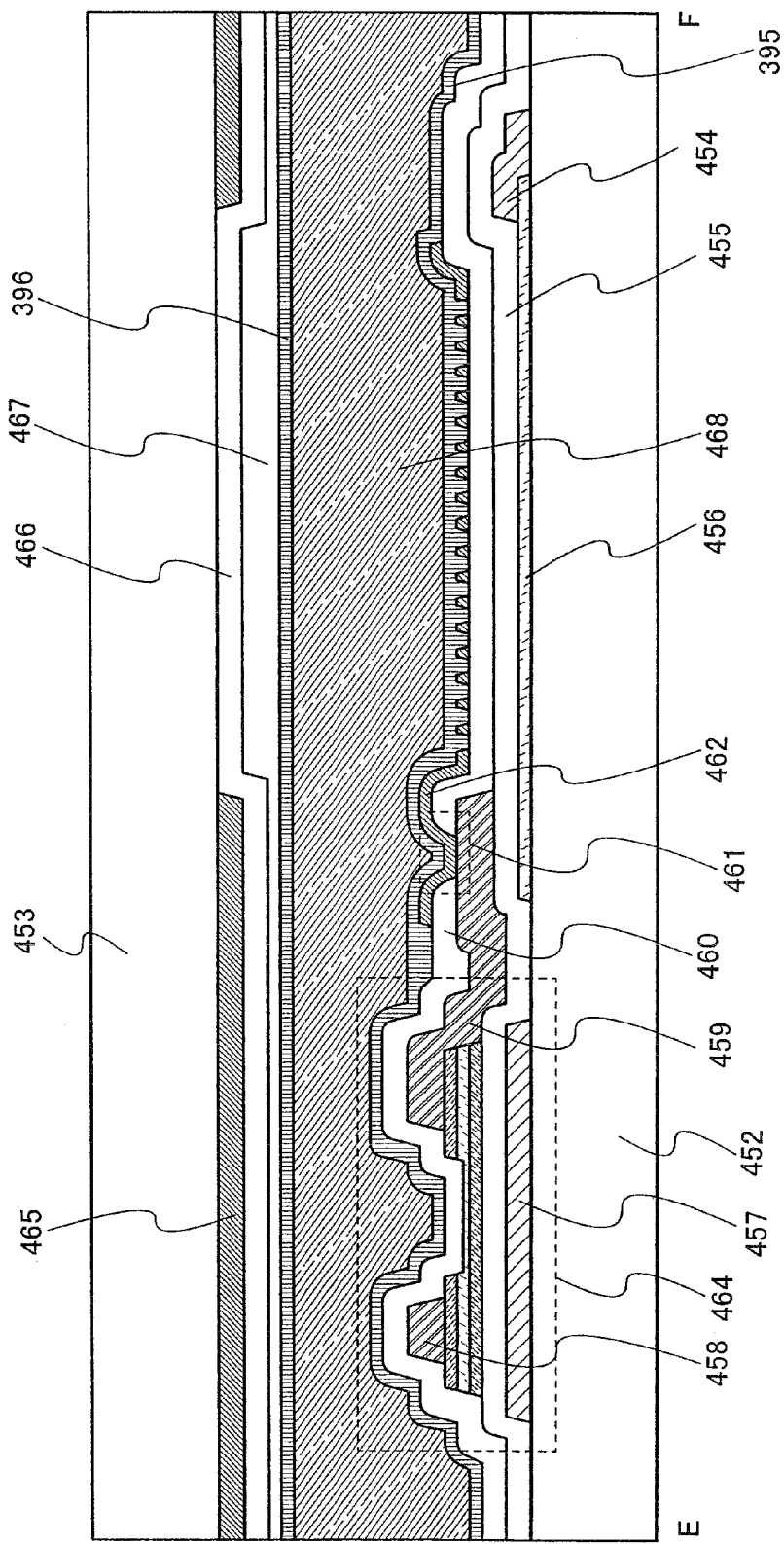
FIG. 23 shows a liquid crystal display device to which the present invention can be applied.

In FIG. 23, a substrate 453, which is a counter substrate, is superposed on a substrate 452, for which a thin film transistor 464 and a pixel electrode 462 connected to the thin film transistor 464 are provided, and liquid crystals are injected therebetween. The substrate 453 is provided with a light-blocking layer 465, a coloring layer 466, and a planarization layer 467. The pixel electrode is provided for the substrate 452, and not for the substrate 453. A liquid crystal layer 468 is formed with liquid crystals injected between the substrate 452 and the substrate 453. The substrate 452 is provided with an alignment film 395, and the substrate 453 is provided with an alignment film 396. The alignment films 395 and 396 are in contact with the liquid crystal layer 468.

The substrate 452 is provided with a common electrode 456, a wiring 454 which serves as a capacitor line connected to the common electrode 456, and the thin film transistor 464. A thin film transistor formed according to any of the above embodiment modes (e.g., Embodiment Mode 2) can be used as the thin film transistor 464. The common electrode 456 can be formed using a similar material to the pixel electrode layer in Embodiment Mode 2. The common electrode 456 is formed to be compartmentalized almost in a pixel form. An insulating layer 455 is formed over the common electrode 456 and the wiring 454. The insulating layer 455 is formed over a wiring 457 serving as a gate electrode of the thin film transistor 464, and serves as a gate insulating layer of the thin film transistor 464.

A source electrode and a drain electrode of the thin film transistor 464 and wirings 458 and 459 connected to the source electrode and the drain electrode of the thin film transistor 464 are formed over the insulating layer 455. The wiring 458 is a signal line to which a video signal is input in the liquid crystal display device. The wiring 458 extends in one direction, is connected to one of a source region and a drain region of the thin film transistor 464, and serves as one of the source electrode and the drain electrode of the thin film transistor 464. The wiring 459 is connected to the other of the source electrode and the drain electrode, and to the pixel electrode 462.

A second insulating layer 460 is formed over the wirings 458 and 459. Further, the pixel electrode 462 connected to the wiring 459 in an opening portion 461 provided in the second insulating layer 460 is formed over the second insulating layer 460. The pixel electrode 462 is formed using a similar material to the pixel electrode layer in Embodiment Mode 2.

As described above, the thin film transistor 464 and the pixel electrode 462 connected to the thin film transistor 464 are formed over the substrate 452. A storage capacitor is formed between the common electrode 456 and the pixel electrode 462.

Figure 24:
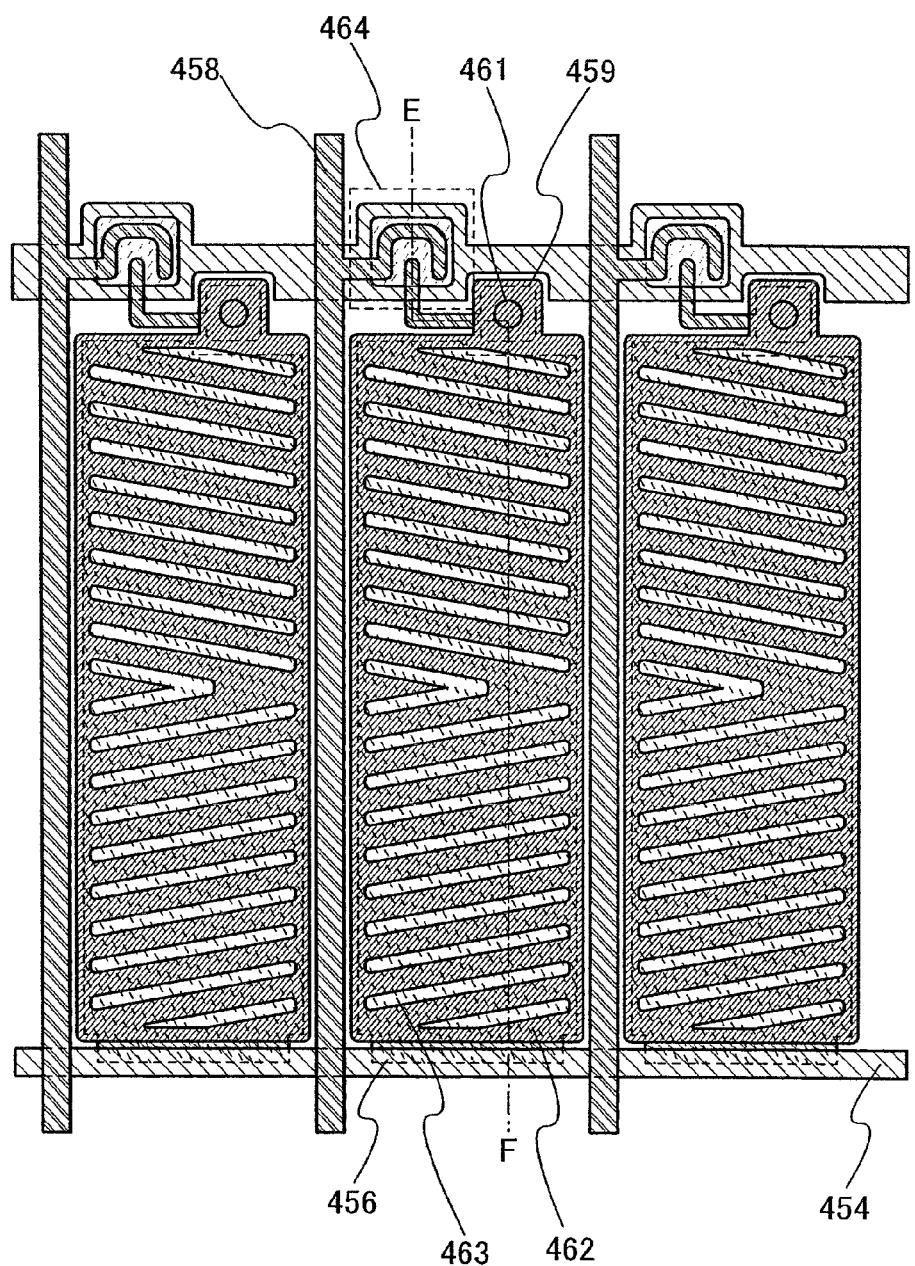
FIG. 24 shows a liquid crystal display device to which the present invention can be applied.

FIG. 24 is a plan view showing a structure of the pixel electrode. The pixel electrode 462 is provided with slits 463. The slits 463 are provided to control alignment of the liquid crystals. In this case, an electric field is generated between the common electrode 456 and the pixel electrode 462. Although the insulating layer 455 is formed between the common electrode 456 and the pixel electrode 462, the insulating layer 455 has a thickness of from 50 nm to 200 nm inclusive, which is thin enough as compared with that of the liquid crystal layer with a thickness of about 2 µm to 10 µm inclusive. Therefore, the electric field is generated in a direction parallel to the substrate 452 (a horizontal direction). The alignment of the liquid crystals can be changed with this electric field. Liquid crystal molecules are horizontally rotated with the use of the electric field in the direction which is parallel or substantially parallel to the substrate. In this case, since the liquid crystal molecules are horizontally aligned in any state, contrast or the like is less influenced by the viewing angle; thus, a wider viewing angle can be obtained. In addition, the aperture ratio of a manufactured panel can be increased since both the common electrode 456 and the pixel electrode 462 are light-transmitting electrodes.

Next, a horizontal electric field mode liquid crystal display device which is different from the above device is described with reference to FIGS. 25 and 26.

Figure 25:
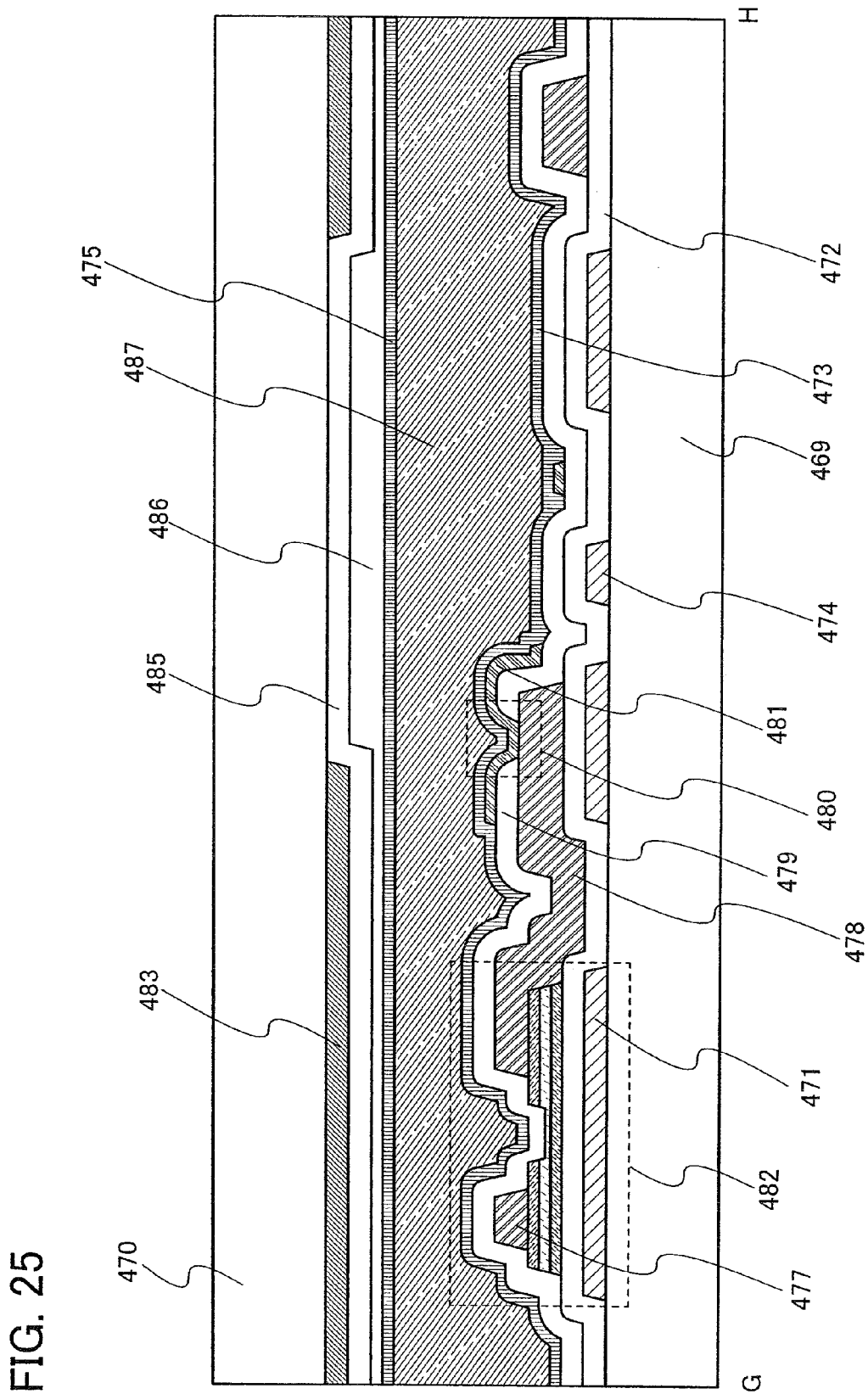
FIG. 25 shows a liquid crystal display device to which the present invention can be applied.
Figure 26:
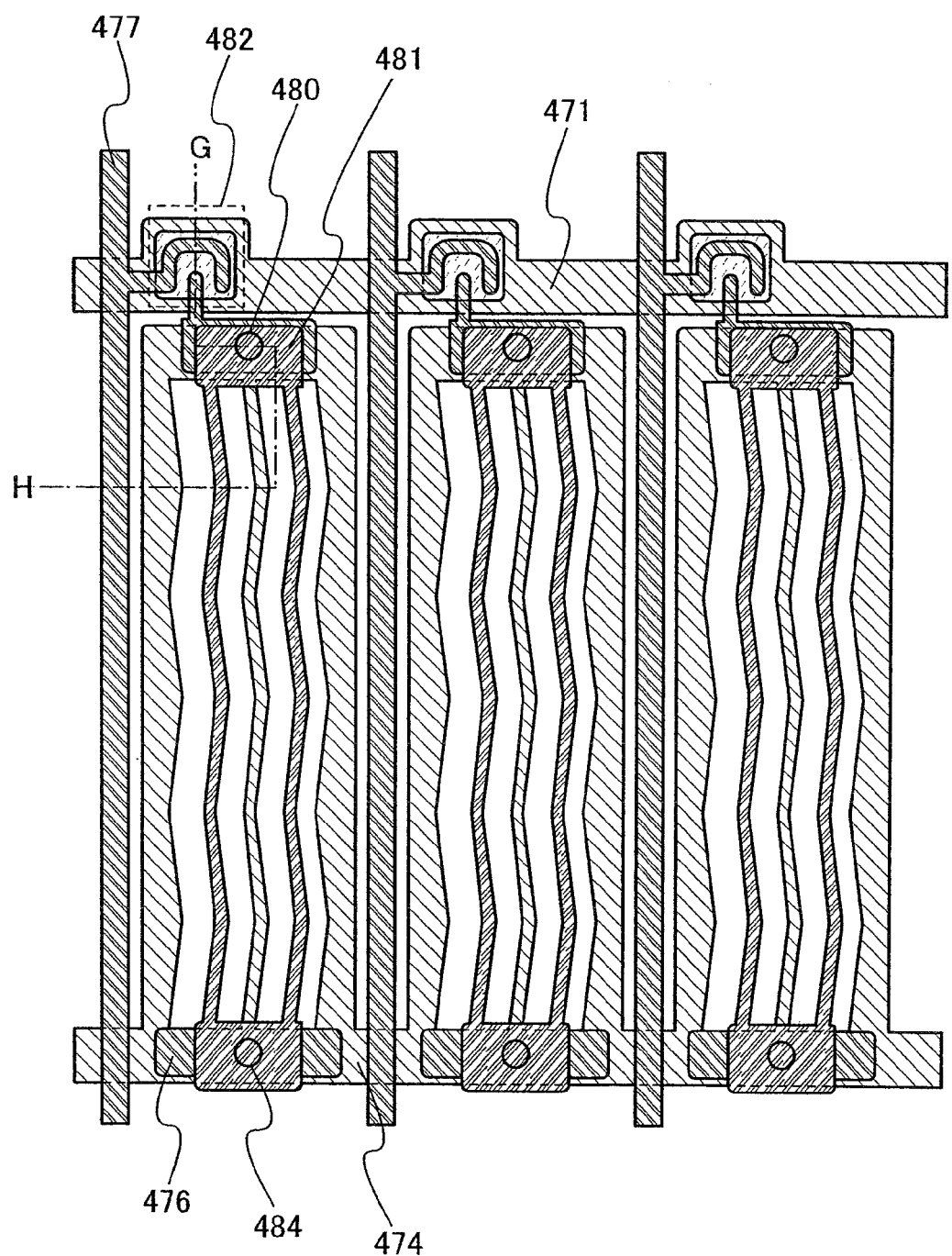
FIG. 26 shows a liquid crystal display device to which the present invention can be applied.

FIGS. 25 and 26 show an example of a pixel structure of a horizontal electric field mode liquid crystal display device.

FIG. 26 is a top view, and FIG. 25 shows a cross-sectional structure taken along a line G-H in FIG. 26.

In FIG. 25, a substrate 470 that faces a substrate 469 provided with a thin film transistor 482 and a pixel electrode 481 connected to the thin film transistor 482 is superposed on the substrate 469, and liquid crystals are injected between the substrate 470 and the substrate 469. The substrate 470 is provided with a light-blocking layer 483, a coloring layer 485, a planarization layer 486, and the like. The pixel electrode is provided for the substrate 469, and not for the substrate 470. A liquid crystal layer 487 is formed of the liquid crystals injected between the substrate 469 and the substrate 470. The substrate 469 is provided with an alignment film 473, and the substrate 470 is provided with an alignment film 475. The alignment films 473 and 475 are in contact with the liquid crystal layer 487.

The substrate 469 is provided with a wiring 474 kept at a common potential and the thin film transistor 482 formed according to any of the methods described in the above embodiment modes (e.g., Embodiment Mode 2). The wiring 474 can be formed at the same time and in the same step as forming a scanning line 471 of the thin film transistor 482. A common electrode formed of the same layer as the wiring 474 is formed with almost the same division shape as a pixel electrode Wirings 477 and 478 connected to a source electrode and a drain electrode of the thin film transistor 482 are formed over an insulating layer 472. The insulating layer 472 serves as a gate insulating layer of the thin film transistor 482. The wiring 477 is a signal line to which a video signal is input in the liquid crystal display device, which extends in one direction, is connected to one of a source region and a drain region of the thin film transistor 482, and serves as one of the source electrode and the drain electrode thereof. The wiring 478 is connected to the other of the source electrode and the drain electrode, and to the pixel electrode 481. Note that a thin film transistor formed according to any of the methods in the above embodiment modes can be used as the thin film transistor 482.

A second insulating layer 479 is formed over the wirings 477 and 478. Further, the pixel electrode 481 connected to the wiring 478 in an opening portion 480 provided in the second insulating layer 479 is formed over the second insulating layer 479. The pixel electrode 481 is formed using a similar material to the pixel electrode layer in Embodiment Mode 2. As shown in FIG. 26, the pixel electrode 481 is formed so that a horizontal electric field can be generated between the pixel electrode 481 and a comb-like electrode formed at the same time as the wiring 474. A comb-like portion of the pixel electrode 481 and the comb-like electrode that is formed at the same time as the wiring 474 and corresponds to the comb-like portion of the pixel electrode 481 are formed so as to be placed in an alternate form.

When there arises a potential difference between the potential of the pixel electrode 481 and that of the wiring 474, an electric field is generated in a direction which is parallel or substantially parallel to the substrate, and the alignment of the liquid crystals can be controlled with this electric field. Liquid crystal molecules are horizontally rotated with the use of the electric field, thereby controlling the alignment of the liquid crystals. At this time, since the longitudinal axes of the liquid crystal molecules are parallel or substantially parallel to the substrate in any state, contrast or the like is less influenced by the viewing angle; thus, a wider viewing angle can be obtained.

In the above manner, the thin film transistor 482 and the pixel electrode 481 connected to the thin film transistor 482 are formed over the substrate 469. A storage capacitor is formed by the insulating layer 472 sandwiched between the wiring 474 and a capacitor electrode 476. The capacitor electrode 476 formed of the same layer as the wiring 477 and the like is connected to the pixel electrode 481 through an opening portion 484.

The present invention can also be applied to a TN mode liquid crystal display device. Next, a mode of a TN mode liquid crystal display device to which the present invention is applied is described below with reference to FIGS. 27 and 28.

Figure 27:
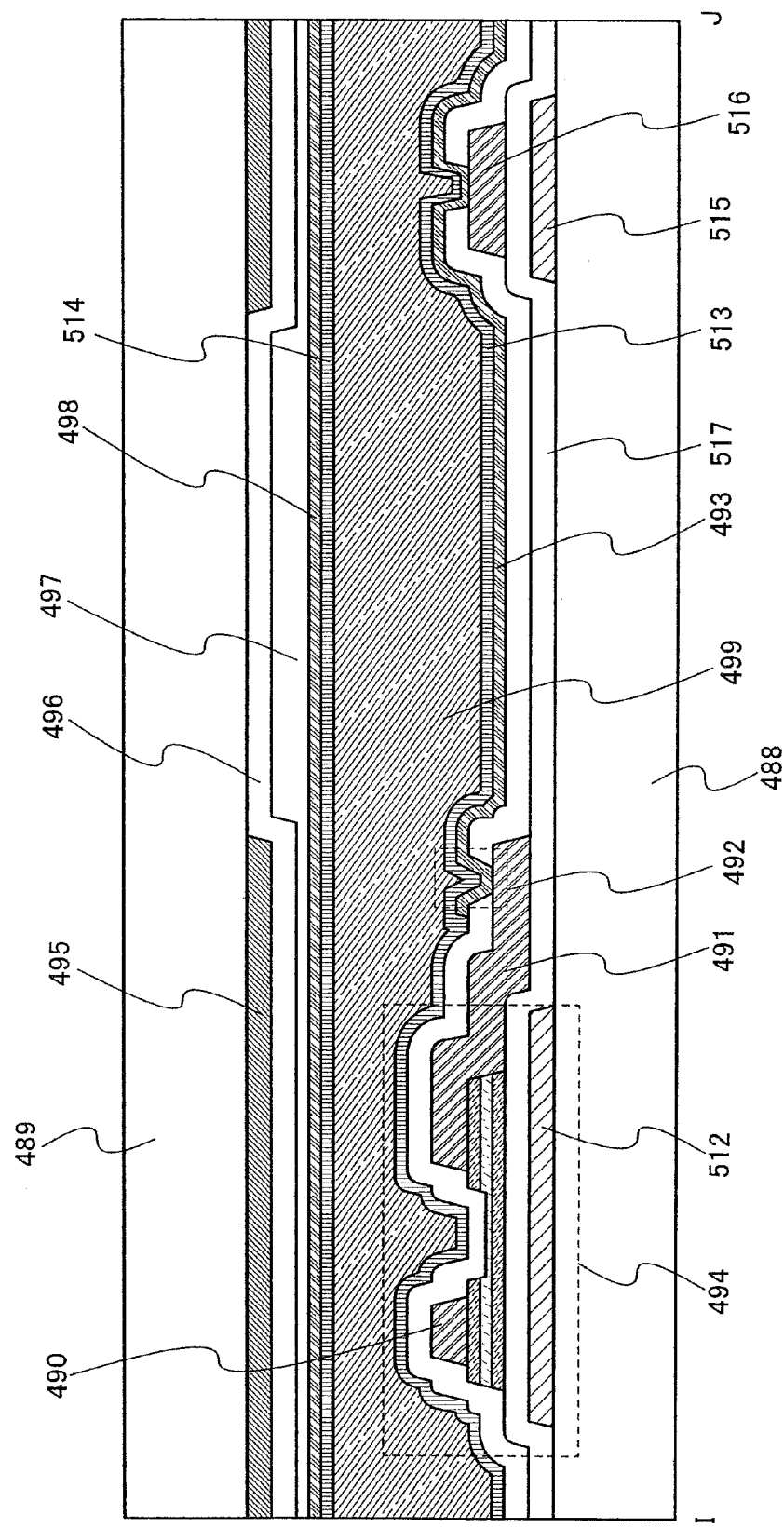
FIG. 27 shows a liquid crystal display device to which the present invention can be applied.
Figure 28:
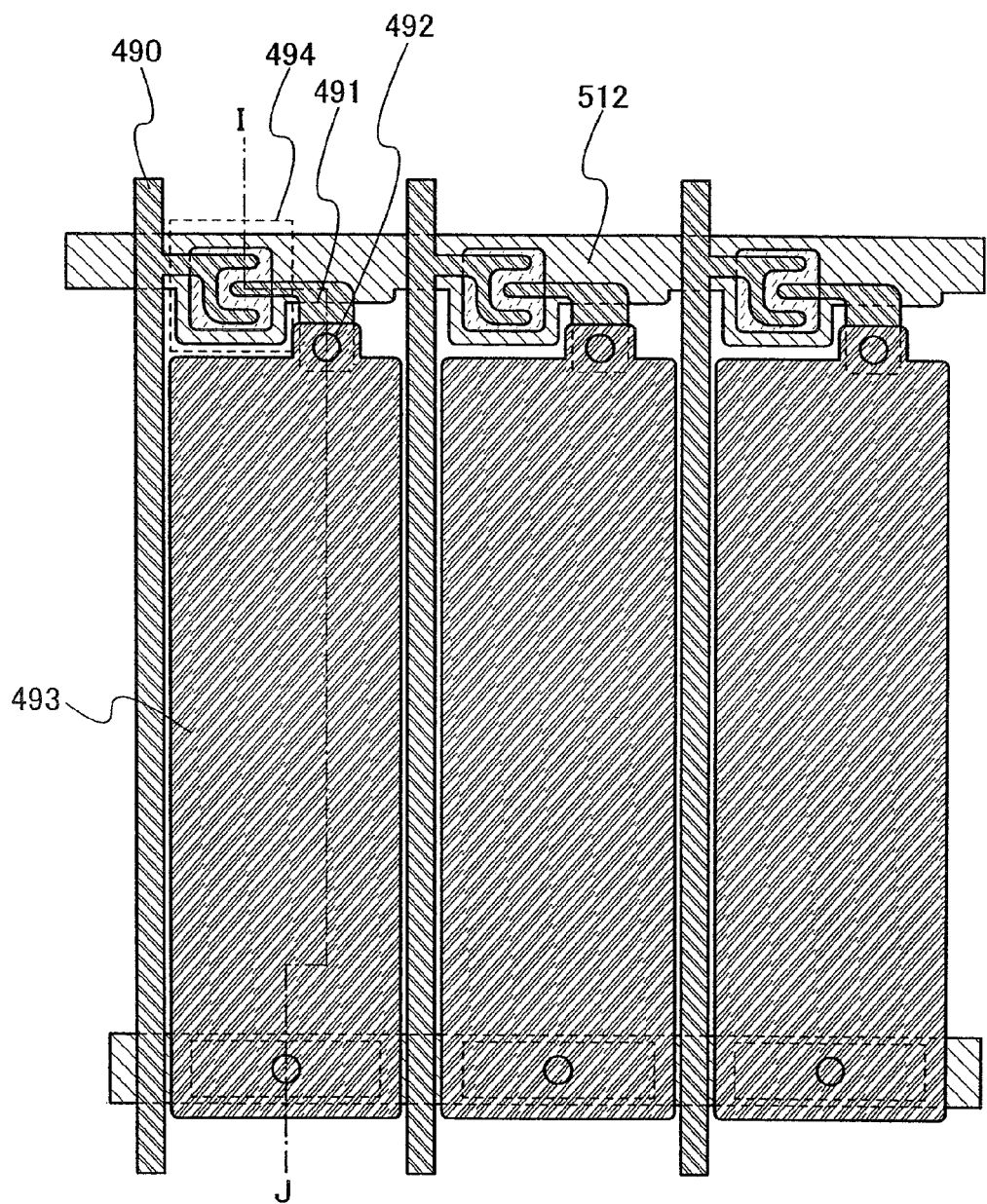
FIG. 28 shows a liquid crystal display device to which the present invention can be applied.

FIGS. 27 and 28 show a pixel structure of a TN mode liquid crystal display device. FIG. 28 is a plan view, and FIG. 27 shows a cross-sectional structure taken along a line I-J in FIG. 28. Hereinafter, description is made with reference to FIGS. 27 and 28.

Over a substrate 488, a pixel electrode 493 is connected to a thin film transistor 494 through a wiring 491 in an opening portion 492. A wiring 490 serving as a signal line is connected to the thin film transistor 494. A wiring 512 serves as a scanning line. A thin film transistor formed according to any of the methods in the above embodiment modes (e.g., Embodiment Mode 2) can be used as the thin film transistor 494.

The pixel electrode 493 is formed using a similar material to the pixel electrode layer in Embodiment Mode 2.

A substrate 489 that faces the substrate 488 is provided with a light-blocking layer 495, a coloring layer 496, and a counter electrode 498. In addition, a planarization layer 497 is formed between the coloring layer 496 and the counter electrode 498, and prevents alignment disorder of liquid crystals. A liquid crystal layer 499 is provided between the pixel electrode 493 and the counter electrode 498. An alignment film 513 is provided between the liquid crystal layer 499 and the pixel electrode 493, and an alignment film 514 is provided between the liquid crystal layer 499 and the counter electrode 498.

The pixel electrode 493, the liquid crystal layer 499, and the counter electrode 498 overlap with one another, so that a liquid crystal element is formed.

In addition, a coloring layer or a light-blocking layer (a black matrix) that serves as a color filter may also be provided for the substrate 488. Further, a polarizing plate is attached to a surface (a rear surface) of the substrate 488 which is opposed to the surface provided with the thin film transistor and the like, and another polarizing plate is attached to a surface (a rear surface) of the substrate 489 which is opposed to the surface provided with the counter electrode 498 and the like.

The counter electrode 498 can be formed using a similar material to the pixel electrode 493.

A storage capacitor includes a wiring 515, a wiring 516, and an insulating layer 517 sandwiched therebetween.

In the drawings referred in the above description, gate electrodes and scanning lines are formed of the same layers, and thus are denoted with the same reference numerals. Similarly, source electrodes or drain electrodes, and signal lines are denoted with the same reference numerals.

Through the above process, the liquid crystal display device can be manufactured. The thin film transistor included in the liquid crystal display device of this embodiment mode is manufactured according to any of the methods described in the preceding embodiment modes. Therefore, the thin film transistor can be formed having the same excellent characteristics as the thin film transistor described in the preceding embodiment mode. Further, the liquid crystal display device can operate at high speed.

(Embodiment Mode 5)

The present invention can be applied not only to a liquid crystal display device but also to a light-emitting device. This embodiment mode describes a process of manufacturing a light-emitting device to which the present invention is applied with reference to FIGS. 29A and 29B and FIGS. 30A to 30C. A light-emitting element utilizing electroluminescence is used for a light-emitting device. Light-emitting elements utilizing electroluminescence are classified into two types according to whether the light-emitting material is an organic compound or an inorganic compound: in general, the former is referred to as an organic EL element and the latter is referred to as an inorganic EL element.

In an organic EL element, a voltage is applied to the light-emitting element, so that carriers (electrons and holes) are injected from a pair of electrodes into a layer including a light-emitting organic compound and there flows electric current. These carriers (electrons and holes) are recombined, so that the light-emitting organic compound is excited. The light-emitting organic compound emits light by energy transition from an excited state to a ground state. Because of such mechanism, such a light-emitting element is called a light-emitting element of a current excitation type.

Inorganic EL elements are classified into dispersive inorganic EL elements and thin film inorganic EL elements. A dispersive inorganic EL element includes a light-emitting layer in which particles of a light-emitting material are dispersed in a binder, and light emission thereof is due to donor-acceptor recombination, in which a donor level and an acceptor level are utilized. In a thin film inorganic EL element, a light-emitting layer is sandwiched between dielectric layers, and the dielectric layers are sandwiched between electrodes. Light emission of the thin film inorganic EL element is due to localized light emission, in which electron transition in inner-shell atomic orbital of a metal atom is utilized.

Here, an organic EL element as a light-emitting element is described. Further, the thin film transistor manufactured according to any of the methods described in Embodiment Modes 2 and 3 as a thin film transistor which controls driving of a light-emitting element is used.

As shown in FIG. 29A, thin film transistors 501 and 502 are formed over a substrate 500. In FIG. 29A, an insulating layer 503 serves as a protective layer is formed over the thin film transistors 501 and 502, and an insulating layer 504 is formed over the insulating layer 503. The insulating layer 504 is formed to planarize a top surface on which a conductive layer is formed. It is preferable to form the insulating layer 504 using an organic resin such as acrylic, polyimide, or polyamide, or siloxane.

A conductive layer 505 is formed over the insulating layer 504. The conductive layer 505 serves as a pixel electrode. When the thin film transistor for driving a pixel is an n-channel thin film transistor, it is preferable to form a cathode as the pixel electrode. When the thin film transistor for driving a pixel is a p-channel thin film transistor, it is preferable to form an anode as the pixel electrode. When a cathode is formed as the pixel electrode, a material with a low work function, such as Ca, Al, CaF, MgAg, or AlLi, is preferably used.

Next, as shown in FIG. 29B, a partition 506 is formed over the insulating layer 504 and a side face (an end portion) of the conductive layer 505. The partition 506 has an opening portion, and the conductive layer 505 is exposed in the opening portion. The partition 506 is formed using an organic resin layer, an inorganic insulating layer, or an organic polysiloxane layer. More preferably, the partition 506 is formed using a photosensitive material, and the partition 506 over the conductive layer 505 is exposed to light to form the opening portion, whereby a side wall of the opening portion forms an inclined face with a continuous curvature.

Subsequently, a light-emitting layer 507 is formed so as to be in contact with the conductive layer 505 in the opening portion of the partition 506. The light-emitting layer 507 may be formed using a single layer or by stacking a plurality of layers.

Then, a conductive layer 508 is formed so as to cover the light-emitting layer 507. The conductive layer 508 is referred to as a common electrode. When the conductive layer 505 is formed using a material for a cathode, the conductive layer 508 is formed using a material for an anode. The conductive layer 508 can be formed using a light-transmitting conductive layer formed of any of the light-transmitting conductive materials described in Embodiment Mode 2 for the pixel electrode layer. As the conductive layer 508, a titanium nitride layer or a titanium layer may be used. In FIG. 29B, indium tin oxide (ITO) is used for the conductive layer 508. In the opening portion of the partition 506, the conductive layer 505, the light-emitting layer 507, and the conductive layer 508 overlap with one another, thereby forming a light-emitting element 509. After that, it is preferable to form a protective layer 510 over the partition 506 and the conductive layer 508 so that oxygen, hydrogen, moisture, carbon dioxide, and the like do not enter the light-emitting element 509. The protective layer 510 can be formed using silicon nitride, silicon nitride oxide, DLC, or the like.

More preferably, after the step of FIG. 29B is finished, packaging (sealing) is further performed using a protective film (a laminate film, an ultraviolet curable resin film, or the like) or a cover material that has high airtightness and causes less degasification so as to prevent exposure to air.

Next, structures of a light-emitting element are described with reference to FIGS. 30A to 30C. Here, cross-sectional structures of a pixel are described by taking an n-channel driving thin film transistor as an example.

In order to extract light emission from the light-emitting element, at least one of an anode and a cathode may be transparent. When a thin film transistor and a light-emitting element are formed over a substrate, the light-emitting element can have a top emission structure, in which light is emitted from a face of the substrate over which the thin film transistor and the light-emitting element are formed; a bottom emission structure, in which light is emitted from a face of the substrate over which the thin film transistor and the light-emitting element are not formed; or a dual emission structure, in which light is emitted from both the faces of the substrate. The present invention can be applied to any of these emission structures.

Figure 30A:
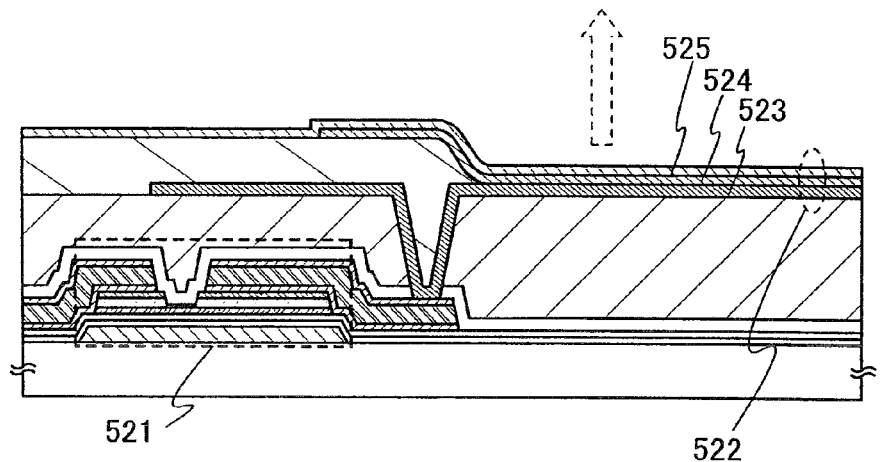
FIGS. 30A to 30C show light-emitting devices to which the present invention can be applied.

FIG. 30A shows a light-emitting element having a top emission structure. FIG. 30A is a cross-sectional view of a pixel in a case where a driving thin film transistor 521 is an n-channel thin film transistor, and light generated in a light-emitting element 522 is emitted to pass through an anode 525. In FIG. 30A, a cathode 523 of the light-emitting element 522 and the driving thin film transistor 521 are electrically connected to each other, and a light-emitting layer 524 and the anode 525 are stacked in order over the cathode 523. The cathode 523 may be formed using a conductive material (e.g., Ca, Al, CaF, MgAg, or AlLi) that has a low work function and reflects light. The light-emitting layer 524 may be formed using a single layer or by stacking a plurality of layers. If the light-emitting layer 524 is formed using a plurality of layers, the light-emitting layer 524 is formed by stacking an electron-injecting layer, an electron-transporting layer, a light-emitting layer, a hole-transporting layer, and a hole-injecting layer in this order over the cathode 523. It is not necessary to form all of these layers. The anode 525 is formed using a light-transmitting conductive material such as indium oxide including tungsten oxide, indium zinc oxide including tungsten oxide, indium oxide including titanium oxide, indium tin oxide including titanium oxide, indium tin oxide (ITO), indium zinc oxide, or indium tin oxide to which silicon oxide is added.

The light-emitting element 522 corresponds to a region where the cathode 523 and the anode 525 sandwich the light-emitting layer 524. In the pixel shown in FIG. 30A, light generated in the light-emitting element 522 is emitted to pass through the anode 525 as shown with an outline arrow.

Figure 30B:
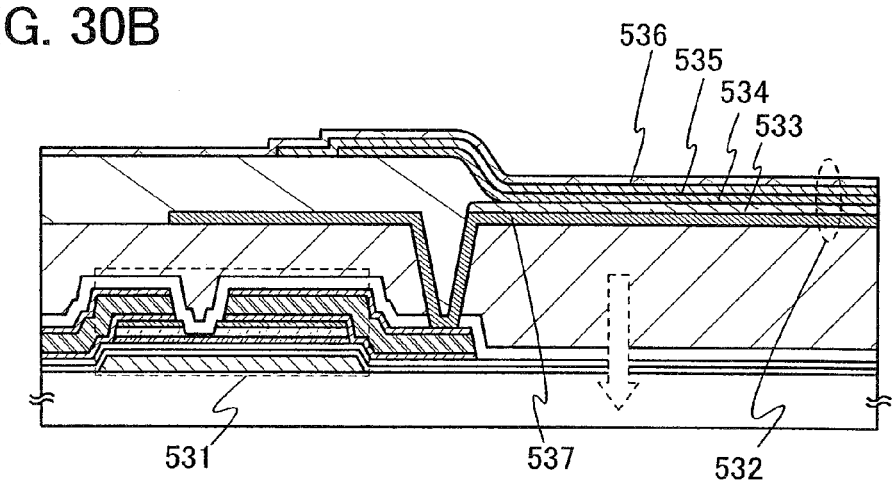

FIG. 30B shows a light-emitting element having a bottom emission structure. FIG. 30B is a cross-sectional view of a pixel in a case where a driving thin film transistor 531 is an n-channel thin film transistor, and light generated in a light-emitting element 532 is emitted to pass through a cathode 533. In FIG. 30B, the cathode 533 of the light-emitting element 532 is formed over a light-transmitting conductive layer 537 that is electrically connected to the driving thin film transistor 531, and a light-emitting layer 534 and an anode 535 are stacked in order over the cathode 533. When the anode 535 has a light-transmitting property, it is preferable to form a light-blocking layer 536 for reflecting or blocking light so as to cover the anode 535. As is similar to the case of FIG. 30A, the cathode 533 may be formed using a conductive layer of a material having a low work function, and a known material can be used; note that the cathode 533 has a thickness that allows light to pass (preferably, approximately 5 nm to 30 nm inclusive). For example, an aluminum layer having a thickness of 20 nm can be used for the cathode 533. The light-emitting layer 534 may be formed using a single layer or by stacking a plurality of layers as in the case of FIG. 30A. The anode 535 is not required to transmit light, but can be formed using a light-transmitting conductive material as in the case of FIG. 30A. For the light-blocking layer 536, a metal film or the like that reflects light can be used; however, it is not limited to a metal film. For example, a resin to which black pigments are added or the like can be used.

The light-emitting element 532 corresponds to a region where the cathode 533 and the anode 535 sandwich the light-emitting layer 534. In the pixel shown in FIG. 30B, light generated in the light-emitting element 532 is emitted to pass through the cathode 533 as shown with an outline arrow.

Figure 30C:
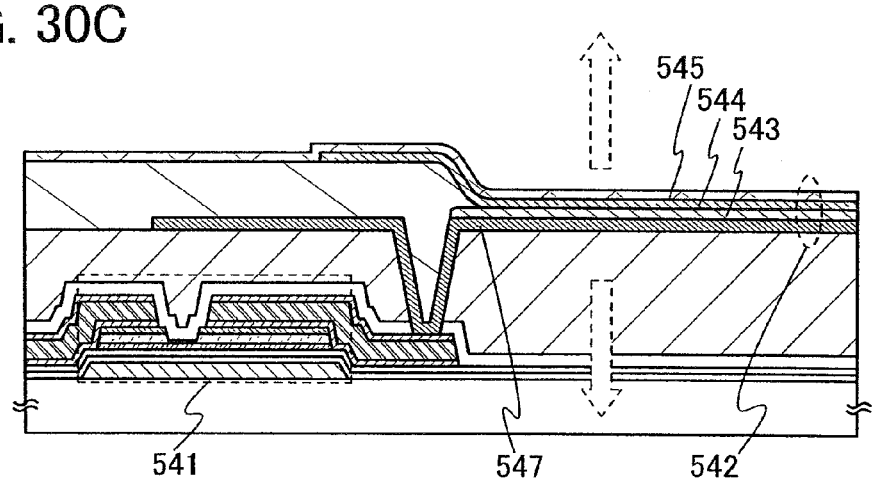

FIG. 30C shows a light-emitting element having a dual emission structure. In FIG. 30C, a cathode 543 of a light-emitting element 542 is formed over a light-transmitting conductive layer 547 that is electrically connected to a driving thin film transistor 541, and a light-emitting layer 544 and an anode 545 are stacked in order over the cathode 543. As is similar to the case of FIG. 30A, the cathode 543 can be a conductive layer having a low work function, and a known material can be used; note that the cathode 543 has a thickness that allows light to pass. For example, an aluminum layer having a thickness of approximately 20 nm can be used for the cathode 543. The light-emitting layer 544 may be formed using a single layer or by stacking a plurality of layers as in the case of FIG. 30A. The anode 545 can be formed using a light-transmitting conductive material as in the case of FIG. 30A.

The light-emitting element 542 corresponds to a region where the cathode 543 and the anode 545 sandwich the light-emitting layer 544. In the pixel shown in FIG. 30C, light generated in the light-emitting element 542 is emitted to pass through both the anode 545 and the cathode 543 as shown with outline arrows.

Although an organic EL element is described as a light-emitting element, it is also possible to provide an inorganic EL element as a light-emitting element.

This embodiment mode describes an example in which a thin film transistor for controlling light emitting of a light-emitting element (a driving thin film transistor) is electrically connected to the light-emitting element. However, a thin film transistor for controlling current flowing into the light-emitting element may be formed between the driving thin film transistor and the light-emitting element to be connected to them.

The light-emitting devices described in this embodiment mode are not limited to the structures shown in FIGS. 30A to 30C, and can be modified in various ways based on the technical idea of the present invention.

Through the above process, a light-emitting device can be manufactured. The thin film transistor included in the light-emitting device of this embodiment mode is manufactured according to any of the methods described in the preceding embodiment modes. Therefore, the thin film transistor can be formed having the same excellent characteristics of the thin film transistor described in the preceding embodiment mode are produced. Further, the light-emitting device can operate at high speed.

(Embodiment Mode 6)

Next, a mode of a display panel which is incorporated in the display device described in Embodiment Mode 4 and a mode of a light-emitting panel which is incorporated in the light-emitting device described in Embodiment Mode 5 are described with reference to the drawings.

In a liquid crystal display device or a light-emitting device in the present invention, it is preferable that a signal line driver circuit and a scanning line driver circuit to be connected to a pixel portion be formed over different substrates (e.g., a semiconductor substrate or an SOI substrate) and afterward, connected to the pixel portion. However, instead of forming the signal line driver circuit and the scanning line driver circuit over different substrates, the signal line driver circuit and the scanning line driver circuit may be formed over the same substrate as that of a pixel circuit.

Note that there is no particular limitation on a connection method of substrates formed separately, and a known method such as a COG method, a wire bonding method, or a TAB method can be used. Further, a connection position is not limited as long as electrical connection is possible. Further, a controller, a CPU, a memory, or the like may be formed separately and connected to the pixel circuit.

Figure 31:
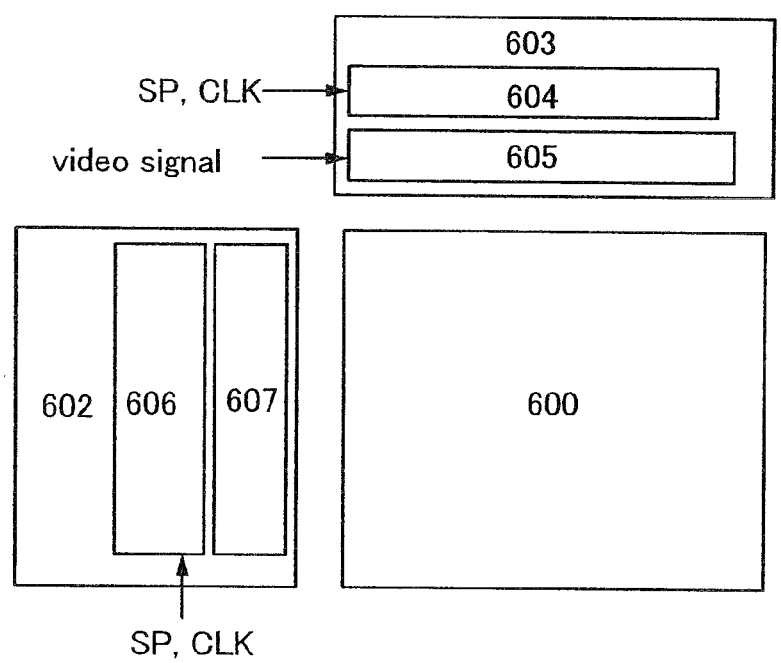
FIG. 31 is a block diagram showing a structure of a display device to which the present invention can be applied.

FIG. 31 is a block diagram of a display device of the present invention. The display device shown in FIG. 31 includes a pixel portion 600 including a plurality of pixels provided with display elements, a scanning line driver circuit 602 that selects each pixel, and a signal line driver circuit 603 that controls a video signal input to a selected pixel.

The display device of the present invention is not limited to the mode shown in FIG. 31. That is, the signal line driver circuit used in the present invention is not limited to the mode having only a shift register and an analog switch. In addition to the shift register and the analog switch, another circuit such as a buffer, a level shifter, or a source follower may be included. Further, the shift register and the analog switch are not always required to be provided, and for example, a different circuit such as a decoder circuit by which selection of signal lines is possible may be used instead of the shift register, or a latch or the like may be used instead of the analog switch.

The signal line driver circuit 603 shown in FIG. 31 includes a shift register 604 and an analog switch 605. A clock signal (CLK) and a start pulse signal (SP) are input to the shift register 604. When the clock signal (CLK) and the start pulse signal (SP) are input, a timing signal is generated in the shift register 604, and is input to the analog switch 605.

Further, a video signal is input to the analog switch 605. The analog switch 605 samples the video signal according to the input timing signal, and supplies the video signal to signal lines of latter stages.

The scanning line driver circuit 602 shown in FIG. 31 includes a shift register 606 and a buffer 607. Further, a level shifter may be included. In the scanning line driver circuit 602, a selection signal is generated by inputting a clock signal (CLK) and a start pulse signal (SP) to the shift register 606. The generated selection signal is buffer-amplified in the buffer 607, and then supplied to a corresponding scanning line. Gate electrodes of all the transistors provided for pixels of one line are connected to one scanning line. Further, since the transistors of the pixels arranged in one line in a panel have to be turned on at the same time, a buffer into which a large current can flow is used for the buffer 607.

In a full color display device, when video signals corresponding to R (red), G (green), and B (blue) are sampled in sequence and are each supplied to a corresponding signal line, the number of terminals for connecting the shift register 604 and the analog switch 605 corresponds to about ⅓ of that of terminals for connecting the analog switch 605 to the signal lines of the pixel portion 600. Consequently, by forming the analog switch 605 and the pixel portion 600 over the same substrate, the number of terminals which have to be used to connect substrates which are formed separately can be reduced compared to a case of forming the analog switch 605 and the pixel portion 600 over different substrates, and occurrence probability of poor connection can be suppressed, and the yield can be enhanced.

Although the scanning line driver circuit 602 in FIG. 31 includes the shift register 606 and the buffer 607, the present invention is not limited to this; the scanning line driver circuit 602 may be constituted of only the shift register 606.

Note that the configuration shown in FIG. 31 is merely a mode of a display device of the present invention, and the configuration of a signal line driver circuit and a scanning line driver circuit is not limited thereto.

Figure 32A:
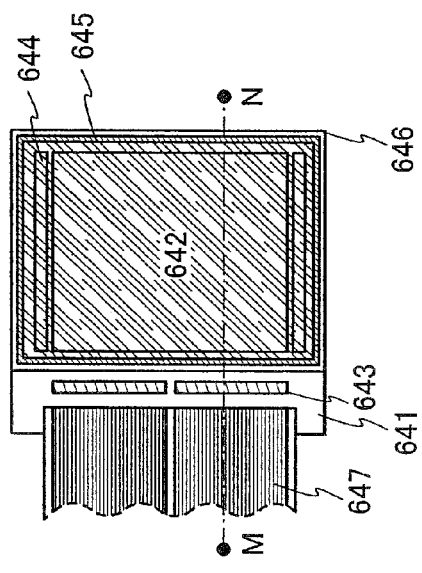
FIGS. 32A and 32B are a top view and a cross-sectional view, respectively, showing a liquid crystal display panel of an embodiment mode of the present invention.
Figure 32B:
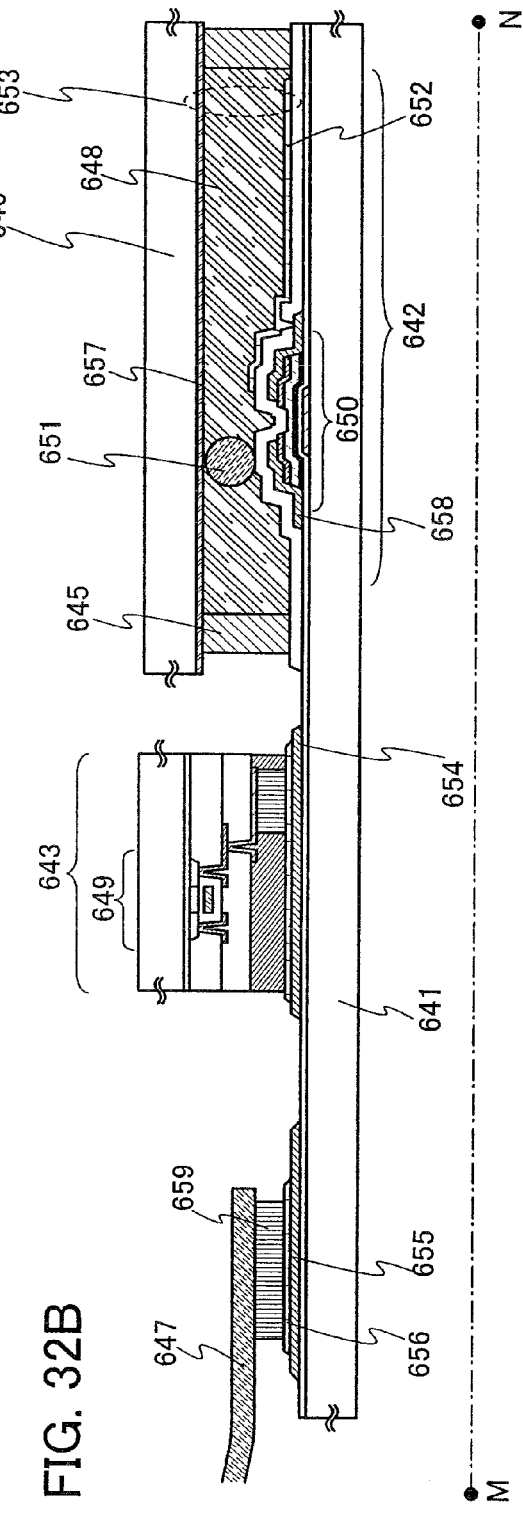
Figure 33A:
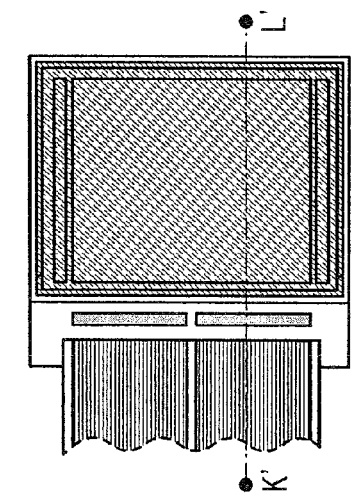
FIGS. 33A and 33B are a top view and a cross-sectional view, respectively, showing a light-emitting display panel of an embodiment mode of the present invention.
Figure 33B:
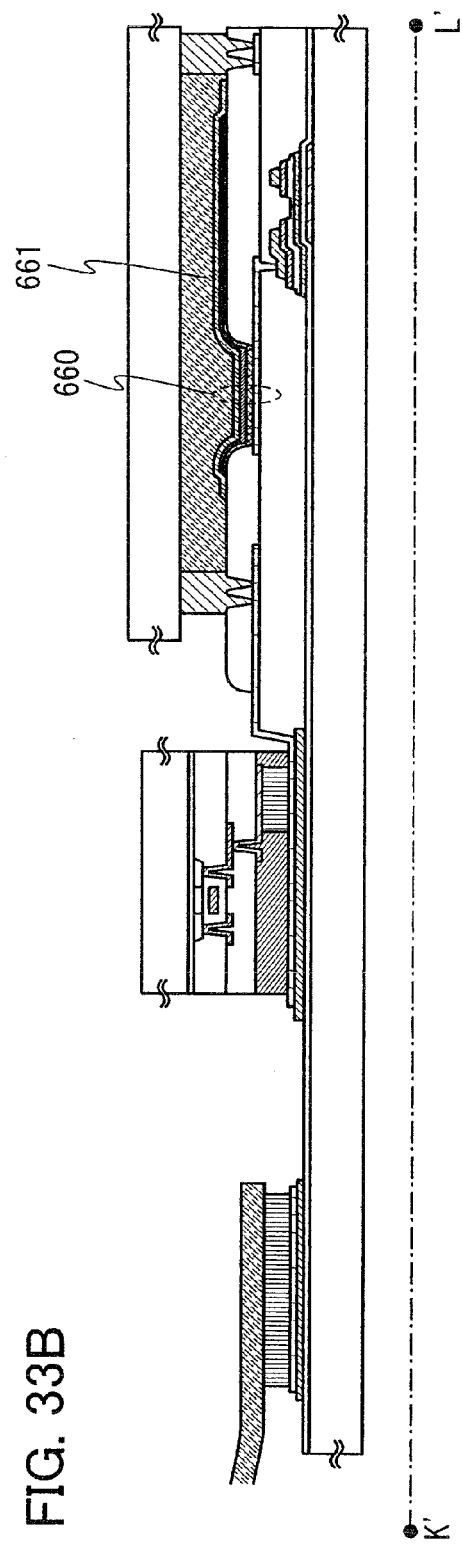

Next, an external view and a cross-sectional view of a liquid crystal display panel and a light-emitting display panel, which are modes of the present invention, are described with reference to FIGS. 32A and 32B and FIGS. 33A and 33B. FIG. 32A is a top view of a panel in which a transistor 650 including a crystalline semiconductor layer and a liquid crystal element 653 that are formed over a first substrate 641 is sealed with a sealant 645 between the first substrate 641 and a second substrate 646. FIG. 32B is a cross-sectional view taken along a line M-N in FIG. 32A. FIGS. 33A and 33B show a light-emitting device. In FIGS. 33A and 33B, only portions which are different from FIGS. 32A and 32B are denoted with reference numerals.

The sealant 645 is provided so as to surround a pixel portion 642 and a scanning line driver circuit 644 that are provided over the first substrate 641. The second substrate 646 is provided over the pixel portion 642 and the scanning line driver circuit 644. Thus, the pixel portion 642 and the scanning line driver circuit 644, together with a liquid crystal layer 648 or a filler 661, are sealed with the sealant 645 between the first substrate 641 and the second substrate 646. A signal line driver circuit 643 is mounted in a region that is different from the region surrounded by the sealant 645 over the first substrate 641. The signal line driver circuit 643 is formed using a transistor including a polycrystalline semiconductor layer over a substrate which is formed separately. This embodiment mode describes an example in which the signal line driver circuit 643 including the transistor formed with the polycrystalline semiconductor layer is attached to the first substrate 641. Alternatively, a signal line driver circuit may be formed using a transistor including a single crystal semiconductor and attached to the first substrate 641. FIG. 32B shows a transistor 649 that is formed using a polycrystalline semiconductor layer and included in the signal line driver circuit 643 as an example.

The pixel portion 642 formed over the first substrate 641 includes a plurality of transistors, and the transistor 650 included in the pixel portion 642 is shown as an example in FIG. 32B. Further, the scanning line driver circuit 644 also includes a plurality of transistors, and the transistor 649 included in the scanning line driver circuit 644 is shown as an example in FIG. 32B. In the light-emitting device in this embodiment mode, the transistor 650 is illustrated as a driving transistor but may also be a current control transistor or an erasing transistor. The transistor 650 corresponds to a transistor including a crystalline semiconductor layer.

In addition, a pixel electrode 652 of the liquid crystal element 653 is electrically connected to the transistor 650 through a wiring 658. A counter electrode 657 of the liquid crystal element 653 is formed on the second substrate 646. The liquid crystal element 653 corresponds to a region where the pixel electrode 652 and the counter electrode 657 sandwich the liquid crystal layer 648.

A pixel electrode of a light-emitting element 660 is electrically connected to the transistor through a wiring. Further in this embodiment mode, a common electrode and a light-transmitting conductive layer of the light-emitting element 660 are connected to each other. The structure of the light-emitting element 660 is not limited to that described in this embodiment mode. The structure of the light-emitting element 660 can be changed in accordance with a direction of light extracted from the light-emitting element 660, polarity of the transistor 650, or the like.

The first substrate 641 and the second substrate 646 can be formed using glass, metal (a typical example is stainless steel), ceramics, plastics, or the like. As plastics, a fiberglass-reinforced plastics (FRP) plate, a polyvinyl fluoride (PVF) film, a polyester film, an acrylic resin film, or the like can be used. Further, a sheet in which aluminum foil is sandwiched by PVF films or polyester films may also be used.

A spherical spacer 651 is a bead spacer, and is provided to control a distance (a cell gap) between the pixel electrode 652 and the counter electrode 657. Further, a spacer (a post spacer) which is obtained by selectively etching an insulating layer may also be used.

A variety of signals (potential) are supplied to the signal line driver circuit 643 that is formed separately, the scanning line driver circuit 644, and the pixel portion 642 through leading wirings 654 and 655 from a flexible printed circuit (FPC) 647.

In this embodiment mode, a connecting terminal 656 is formed of the same conductive layer as that of the pixel electrode 652 of the liquid crystal element 653. In addition, the leading wirings 654 and 655 are formed of the same conductive layer as that of the wiring 658.

The connecting terminal 656 is electrically connected to a terminal of the FPC 647 through an anisotropic conductive layer 659.

Although not shown in the drawings, the liquid crystal display device shown in this embodiment mode includes an alignment film, a polarizing plate, and further, may include a color filter, a light-blocking layer, and the like.

In this embodiment mode, the connecting terminal 656 is formed of the same conductive layer as that of the pixel electrode of the light-emitting element 660. In addition, the leading wiring 655 is formed of the same conductive layer as that of the wiring 658. However, the present invention is not limited to this.

The second substrate that is located in a direction of extracting light from the light-emitting element 660 needs to be transparent. In that case, a substrate formed of a light-transmitting material such as a glass plate, a plastic plate, a polyester film, or an acrylic film is used.

As the filler 661, an inert gas such as nitrogen or argon, an ultraviolet curable resin, a thermosetting resin, or the like can be used. For example, polyvinyl chloride (PVC), acrylic, polyimide, an epoxy resin, a silicone resin, polyvinyl butyral (PVB), or ethylene vinyl acetate (EVA) can be used. In this embodiment mode, nitrogen is preferably used.

In addition, an optical film such as a polarizing plate, a circularly polarizing plate (including an elliptically polarizing plate), a retardation plate (a quarter-wave plate or a half-wave plate), or a color filter may be provided as appropriate for a light-emitting face of the light-emitting element. Further, a polarizing plate or a circularly polarizing plate may be provided with an anti-reflection layer.

This embodiment mode can be carried out in combination with a structure of another embodiment mode.

(Embodiment Mode 7)

As described in the preceding embodiment modes, an active matrix display module can be manufactured according to the present invention. A display panel including components up to an FPC is referred to as a display module. This embodiment mode describes electronic devices in which a display module manufactured by any of the methods described in the preceding embodiment modes is incorporated in a display portion. As such electronic devices, for example, cameras such as video cameras and digital cameras, displays that can be mounted on a person's head (goggle-type displays), car navigation systems, projectors, car stereos, personal computers, and portable information terminals (e.g., mobile computers, mobile phones, and electronic books) can be given. Examples of these devices are shown in FIGS. 35A and 35B.

Figure 35A:
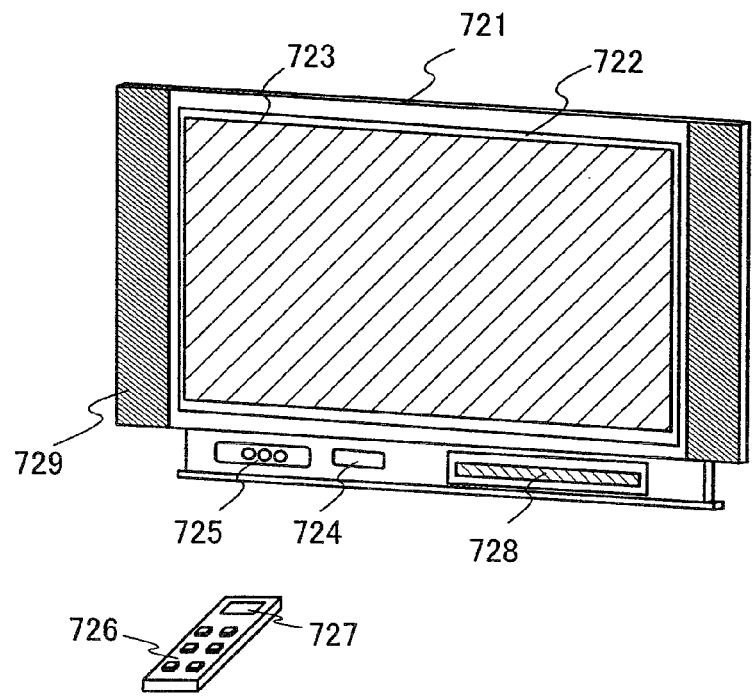
FIGS. 35A and 35B show electronic devices having display devices of an embodiment mode of the present invention.
Figure 35B:
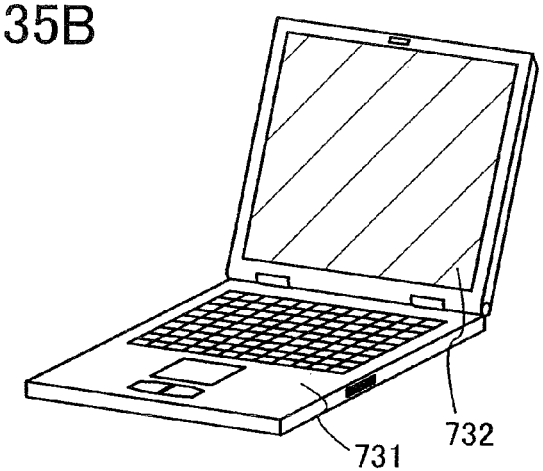

FIG. 35A shows a television device. The television device shown in FIG. 35A can be completed by incorporating a display module manufactured according to the present invention into a chassis. A main screen 723 is formed using a display panel manufactured according to any of the methods described in Embodiment Modes 2 and 3. In addition, a speaker portion 729, operation switches, and the like are provided as accessory equipment.

As shown in FIG. 35A, a display panel 722 is incorporated in a chassis 721. With the use of a receiver 725, in addition to reception of general TV broadcast, simplex and duplex information-communication can also be performed by connection to a wired or wireless communication network through a modem 724. The television device can be operated with the switches incorporated in the chassis or with a remote controller 726. A display portion 727 for displaying information to be output may also be provided in this remote controller 726.

Further, in the television device, a subscreen 728 may be formed using a second display panel and may be used to display a channel number, volume, and the like, in addition to the main screen 723. In this structure, the main screen 723 may be formed using a liquid crystal display panel having an excellent viewing angle, and the subscreen 728 may be formed using a light-emitting display panel with low power consumption. Further, when the subscreen is formed using a liquid crystal display panel, power consumption for display can be reduced by turning on and off the liquid crystal display panel.

Figure 36:
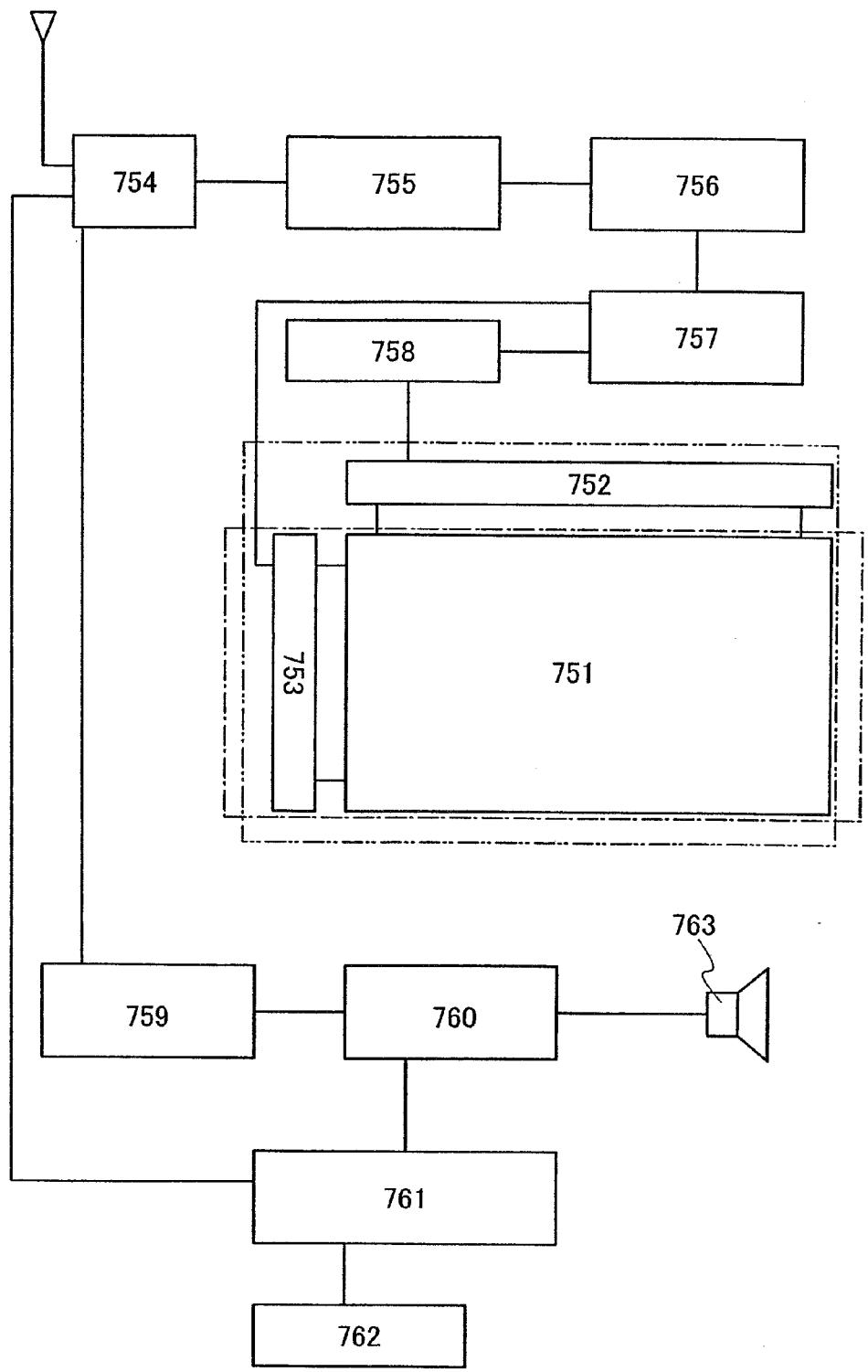
FIG. 36 shows an electronic device having a display device of an embodiment mode of the present invention.

FIG. 36 is a block diagram showing a structure of a television device applicable to the television device shown in FIG. 35A. A pixel portion 751 is formed in a display panel 750. A signal line driver circuit 752 and a scanning line driver circuit 753 may be connected to the display panel 750 in such a manner as another embodiment mode describes.

As other external circuits, a video signal amplifier circuit 755 that amplifies a video signal among signals received by a tuner 754, a video signal processing circuit 756 that converts the signals output from the video signal amplifier circuit 755 into color signals corresponding to their respective colors of red, green, and blue, a control circuit 757 that converts the video signal so that the video signal can match input specification of a driver IC, and the like are provided on an input portion of the video signal. The control circuit 757 outputs signals to both a scanning line and a signal line In a case of digital driving, a signal divide circuit 758 may be connected to the signal line and an input digital signal may be divided into m signals (m is an optional integer) and supplied.

An audio signal among signals received by the tuner 754 is sent to an audio signal amplifier circuit 759 and is output from a speaker 763 through an audio signal processing circuit 760. A controlling circuit 761 receives control information of a receiving station (reception frequency) or sound volume from an input portion 762, and transmits signals to the tuner 754 and the audio signal processing circuit 760.

The present invention is applied to the television device described above, whereby the television device can have a higher contrast ratio, less unevenness in display, and lower power consumption.

Needless to say, the present invention is not limited to a use for television devices, and can be applied to a variety of applications such as monitors of personal computers, or display media that have a large area, such as information display boards in railway stations, airports, and the like, and streetside advertisement display boards. By applying the present invention to such display media, display characteristics, productivity, and the like of these display media can be improved.

The main screen 723 and the subscreen 728 are formed using the display panel or the display device that is manufactured according to any of the methods for manufacturing a thin film transistor in Embodiment Modes 2 and 3, whereby display characteristics and productivity of the television device can be improved.

A portable computer shown in FIG. 35B includes a main body 731, a display portion 732, and the like. The display panel or the display device that is manufactured according to any of the methods for manufacturing a thin film transistor in Embodiment Modes 2 and 3 is applied to the display portion 732, whereby productivity of the computer can be enhanced.

Figure 34A:
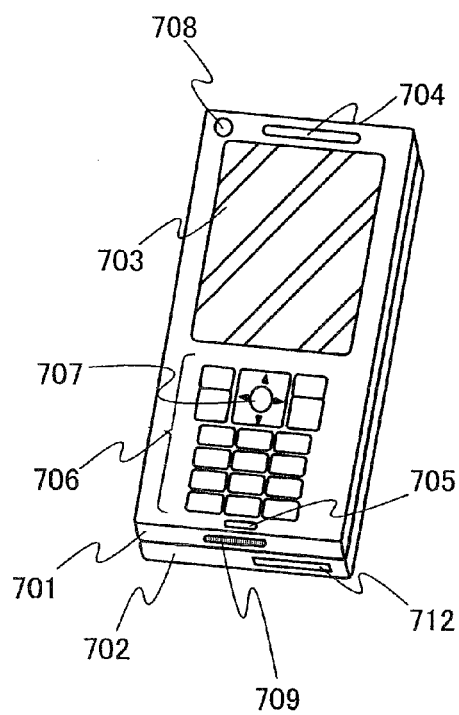
FIGS. 34A to 34C show an electronic device having a display device of an embodiment mode of the present invention.
Figure 34B:
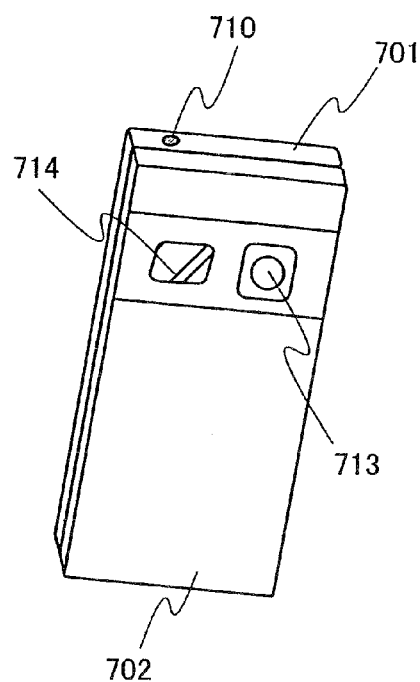
Figure 34C:
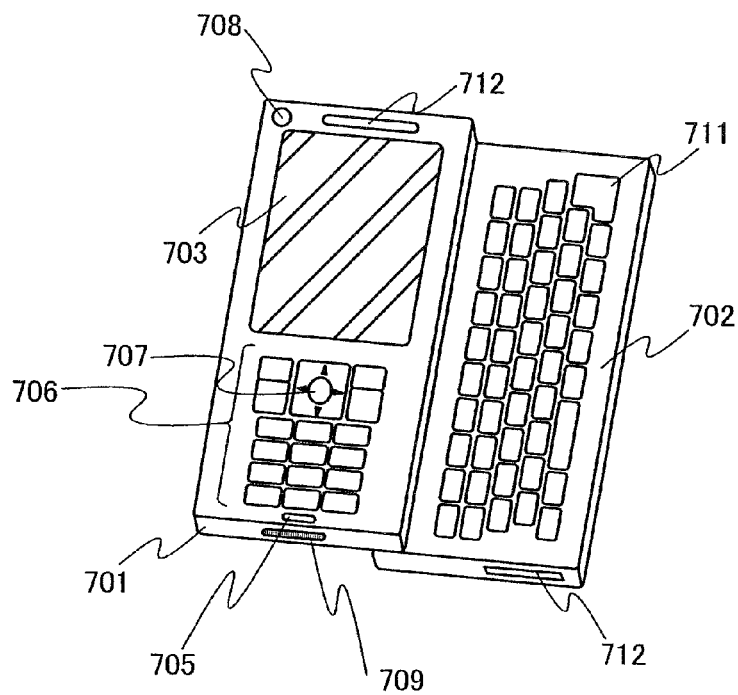

FIGS. 34A to 34C show an example of a mobile phone to which the present invention is applied. FIG. 34A is a front view, and FIG. 34B is a rear view, and FIG. 34C is a front view in which two chassis are slid. A mobile phone in FIGS. 34A to 34C has two chassis 701 and 702. The mobile phone in FIGS. 34A to 34C has both functions of a mobile phone and a portable information terminal, and incorporates a computer. The mobile phone in FIGS. 34A to 34C is a "smartphone," with which a variety of data processing is possible in addition to telephone conversation.

The mobile phone in FIGS. 34A to 34C has the chassis 701 and 702. The chassis 701 includes a display portion 703, a speaker 704, a microphone 705, operation keys 706, a pointing device 707, a front camera lens 708, a connection jack 709 for an external connection terminal, an earphone terminal 710, and the like. The chassis 702 includes a keyboard 711, an external memory slot 712, a rear camera 713, a light 714, and the like. In addition, an antenna is incorporated in the chassis 701.

Further, in addition to the above structure, the mobile phone in FIGS. 34A to 34C may incorporate a non-contact IC chip, a small memory device, or the like.

The chassis 701 and 702 which overlap with each other (see FIG. 34A) can be slid, and are spread as shown in FIG. 34C. The display panel or the display device that is manufactured according to any of the methods for manufacturing a thin film transistor in Embodiment Modes 2 and 3 can be incorporated in the display portion 703. Since the front camera lens 708 is provided in the same plane as the display portion 703, the mobile phone in FIGS. 34A to 34C can be used as a videophone. Further, a still image and a moving image can be taken with the rear camera 713 and the light 714, using the display portion 703 as a viewfinder.

With the use of the speaker 704 and the microphone 705, the mobile phone in FIGS. 34A to 34C can be used as an audio recording device (recording device) or an audio playing device. With the use of the operation keys 706, further, operations of incoming and outgoing of calls, simple information input such as electronic mail, scrolling of a screen, cursor movement, e.g., for selecting information to be displayed in the display portion, and the like are possible.

If much information needs to be treated in documentation, a use as a portable information terminal, and the like, it is convenient to use the keyboard 711. By sliding the chassis 701 and 702 which overlap with each other (see FIG. 34A), the chassis 701 and 702 can be spread as shown in FIG. 34C. In using the mobile phone in FIGS. 34A to 34C as a portable information terminal, a cursor can be moved smoothly with the use of the keyboard 711 and the pointing device 707. The connection jack 709 for an external connection terminal can be connected to an AC adapter or a variety of cables such as a USB cable, and charging and data communication with a personal computer or the like is possible. Further, by inserting a recording medium in the external memory slot 712, a larger amount of data can be stored and transferred.

The rear face of the chassis 702 (see FIG. 34) is provided with the rear camera 713 and the light 714, and a still image and a moving image can be taken using the display portion 703 as a viewfinder.

Further, the mobile phone may have an infrared communication function, a USB port, a function of receiving one segment television broadcast, a non-contact IC chip, an earphone jack, or the like, in addition to the above functions and structures.

The variety of electronic devices described in this embodiment mode can be manufactured by any of the methods for manufacturing a thin film transistor in Embodiment Modes 2 and 3; therefore, application of the present invention can improve display characteristics and productivity of these electronic devices.

This application is based on Japanese Patent Application serial No. 2007-312872 filed with Japan Patent Office on Dec. 3, 2007, the entire contents of which are hereby incorporated by reference.

What is claimed is:

1. A method for forming a crystalline semiconductor film, comprising the steps of:
   forming a semiconductor film including hydrogen by supplying a source gas to a chamber;
   stopping supply of the source gas;

supplying hydrogen and a rare gas to the chamber after the step of stopping supply of the source gas;

performing surface wave plasma treatment on the semiconductor film including hydrogen during the step of supplying hydrogen and the rare gas to generate a crystal nucleus in the semiconductor film including hydrogen; and growing the crystal nucleus.

2. The method for forming a crystalline semiconductor film according to claim 1, wherein the surface wave plasma treatment is performed in an ultrahigh vacuum.

3. The method for forming a crystalline semiconductor film according to claim 1, wherein the crystal nucleus is grown by a plasma CVD method.

4. The method for forming a crystalline semiconductor film according to claim 1, wherein the crystalline semiconductor film does not include a transition layer.

5. The method for forming a crystalline semiconductor film according to claim 1, wherein the crystalline semiconductor film has a thickness of from 2 nm to 60 nm.

6. The method for forming a crystalline semiconductor film according to claim 1, wherein the surface wave plasma treatment uses plasma with charge density of greater than or equal to $1 \times 10^{10}$ cm$^{-3}$.

7. A method for manufacturing a thin film transistor, comprising the steps of:

forming a gate electrode;

forming an insulating film over the gate electrode;

forming a semiconductor film including hydrogen over the insulating film by supplying a source gas to a chamber;

stopping supply of the source gas;

supplying hydrogen and a rare gas to the chamber after the step of stopping supply of the source gas;

performing surface wave plasma treatment on the semiconductor film including hydrogen during the step of supplying hydrogen and the rare gas to generate a crystal nucleus in the semiconductor film including hydrogen;

growing the crystal nucleus to form a crystalline semiconductor film;

forming a semiconductor film including an impurity element over the crystalline semiconductor film; and forming a source electrode and a drain electrode over the semiconductor film including the impurity element.

8. The method for manufacturing a thin film transistor according to claim 7, wherein the surface wave plasma treatment is performed in an ultrahigh vacuum.

9. The method for manufacturing a thin film transistor according to claim 7, wherein the crystal nucleus is grown by a plasma CVD method.

10. The method for manufacturing a thin film transistor, comprising the step of connecting a pixel electrode to the source electrode or the drain electrode of the thin film transistor which is manufactured by the method described in claim 7.

11. The method for manufacturing a thin film transistor according to claim 7, wherein the crystalline semiconductor film does not include a transition layer.

12. The method for manufacturing a thin film transistor according to claim 7, wherein the crystalline semiconductor film has a thickness of from 2 nm to 60 nm.

13. The method for manufacturing a thin film transistor according to claim 7, wherein the surface wave plasma treatment uses plasma with charge density of greater than or equal to $1 \times 10^{10}$ cm$^{-3}$.

14. The method for manufacturing a thin film transistor according to claim 7, wherein the semiconductor film including an impurity element is formed with silicon hydride gas including $PH_3$ or silicon hydride gas including $B_2H_6$.

15. The method for forming a crystalline semiconductor film according to claim 1, wherein the semiconductor film is an amorphous semiconductor film.

16. The method for manufacturing a thin film transistor according to claim 7, wherein the semiconductor film is an amorphous semiconductor film.

17. The method for forming a crystalline semiconductor film according to claim 1, wherein a flow ratio of the rare gas to hydrogen is 50:1 to 100:1.

18. The method for manufacturing a thin film transistor according to claim 7, wherein a flow ratio of the rare gas to hydrogen is 50:1 to 100:1.

* * * * *